US007179579B2

(12) United States Patent
Uenishi

(10) Patent No.: US 7,179,579 B2
(45) Date of Patent: Feb. 20, 2007

(54) RADIATION-SENSITIVE COMPOSITION

(75) Inventor: Kazuya Uenishi, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/444,965

(22) Filed: May 27, 2003

(65) Prior Publication Data

US 2004/0033437 A1 Feb. 19, 2004

(30) Foreign Application Priority Data

May 27, 2002 (JP) .......................... P.2002-152582

(51) Int. Cl.
*G03F 7/004* (2006.01)

(52) U.S. Cl. .................. 430/270.1; 430/913; 430/914; 430/966

(58) Field of Classification Search ............ 430/270.1, 430/913, 914, 966
See application file for complete search history.

(56) References Cited

U.S. PATENT DOCUMENTS

| | | | | |
|---|---|---|---|---|
| 2001/0026901 | A1* | 10/2001 | Maeda et al. | 430/270.1 |
| 2001/0033993 | A1* | 10/2001 | Kanna et al. | 430/285.1 |
| 2001/0055104 | A1 | 12/2001 | Irie | |
| 2002/0051932 | A1 | 5/2002 | Brainard et al. | |

FOREIGN PATENT DOCUMENTS

| | | | |
|---|---|---|---|
| EP | 1085377 | A1 * | 3/2001 |
| EP | 1143299 | A1 * | 10/2001 |
| EP | 1179750 | A1 * | 2/2002 |
| JP | 5-121312 | | 5/1993 |
| JP | 5-136026 | | 6/1993 |
| JP | 7-263322 | | 10/1995 |
| JP | 2000-347411 | | 12/2000 |
| JP | 2001-328964 | | 11/2001 |
| JP | 2002-15970 | | 1/2002 |
| JP | 2002-55457 | | 2/2002 |
| JP | 2003076022 | A * | 3/2003 |

OTHER PUBLICATIONS

English language machine translation of JP 2003-076022.*

* cited by examiner

*Primary Examiner*—Amanda Walke
(74) *Attorney, Agent, or Firm*—Sughrue Mion, PLLC

(57) ABSTRACT

A radiation-sensitive composition comprising:
(A) a compound capable of generating an acid upon irradiation with one of actinic rays and radiation, and
(B) a resin containing a repeating unit having a specific group, which increases the solubility in an alkali developing solution by the action of an acid.

11 Claims, No Drawings

RADIATION-SENSITIVE COMPOSITION

FIELD OF THE INVENTION

The present invention relates to a positive photosensitive composition used in a process of producing semiconductors such as ICs, for production of circuit boards of liquid-crystal displays and thermal heads, and in other photofabrication processes. More specifically, the invention is concerned with a radiation-sensitive composition suitable for the cases where soft X-rays having wavelengths of 50 nm or shorter are used as exposure source.

BACKGROUND OF THE INVENTION

The ever-increasing packing density of chips requires formation of finer resist patterns with greater precision in lithographic processes. In order to respond to this requirement, development of exposure technologies for attaining higher resolution is being pursued along the lines of using light sources with shorter wavelengths, extending from excimer laser beams such as KrF (248 nm), ArF (193 nm) and $F_2$ (157 nm) up through soft X-rays with wavelengths of 50 nm or shorter (e.g., EUV-ray with a wavelength of 13.5 nm) as the ultimate light source, in place of hitherto used near ultraviolet rays such as g-ray and i-ray.

When soft X-rays (e.g., EUV-ray) are used as light source, lens materials suitable for dioptric light systems hitherto utilized are not obtainable. So it is a foregone conclusion to adopt a catoptric light system and apply thereto a soft X-ray reflection-type reduced projection exposure method using a plurality of multilayer film mirrors and a reflection mask. In this case, there is a defect that the amount of rays finally reaching the wafer surface is considerably decreased by reflection from a plurality of multilayer film mirrors because each mirror has naturally its reflectivity limits. Accordingly, it is required for application of the soft X-ray reflection-type reduced projection exposure method to impart the highest possible sensitivity to a resist used. However, there is a problem that no resist having sensitivity high enough for practical use is found yet.

In addition, materials used for resist have strong absorption in the soft X-ray region. Therefore, there is a problem that the rays cannot reach the bottom of resist and patterns with rectangular profiles cannot be formed. Although it is supposed that reduction in thickness of resist film is a solution to that problem, this solution induces another problem of causing a shortage of dry etching resistance.

Further, with the future trend toward a growing need for finer and more precise resist patterns, a problem of how to control line-edge roughness (abbreviated as "LER") of resist patterns becomes important.

With the intention of dealing with the problems facing the soft X-ray reduced projection exposure method, various reports have been made, wherein are included the patterning method to which a triple-layer resist method is applied (JP-A-5-121312), the method of using a high concentration of photo-acid generator (JP-A-2002-55457), the patterning method of providing a layer made up of a material generating electrons with efficiency (JP-A-5-136026), the materials using polycyclic unsaturated hydrocarbon derivatives (JP-A-2001-328964), the patterning method of controlling disturbances in pattern profiles by inhibiting the production of low molecular-weight compounds from resist films (JP-A-2000-347411) and the improvements from the apparatus side (JP-A-7-263322 and JP-A-2002-15970).

However, those methods are insufficient to solve the current problems, and new solutions are strongly wanted.

SUMMARY OF THE INVENTION

The object of the present invention is to provide a radiation-sensitive composition which can overcome problems facing traditional arts when soft X-rays (e.g., EUV-ray with a wavelength of 13.5 nm) are used as exposure source. More specifically, the object of the invention is to provide a radiation-sensitive composition meant for soft X-rays which has high sensitivity, high resolution, patterns having rectangular profiles and excellent LER characteristic and high dry etching resistance.

As a result of our intensive studies on constituent materials of a radiation-sensitive composition meant for soft X-rays, it has been found that the aforesaid object was attained with an acid-decomposable resin having a particular structure, thereby achieving the invention.

More specifically, the foregoing object is attained by the following compositions.

(1) A radiation-sensitive composition comprising:

(A) a compound capable of generating an acid upon irradiation with one of actinic rays and radiation, and (B) a resin containing a repeating unit having a group represented by at least any one of the following formulae (I-1) to (I-4) and a repeating unit having a group represented by the following formula (XA), which increases the solubility in an alkali developing solution by the action of an acid:

(I-1)

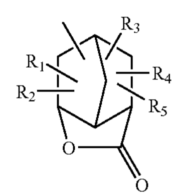

(I-2)

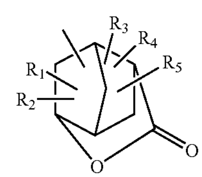

(I-3)

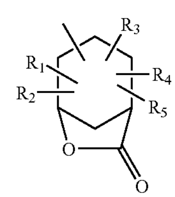

(I-4)

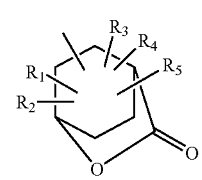

wherein $R_1$ to $R_5$ each independently represents a hydrogen atom, an unsubstituted or substituted alkyl group, an unsubstituted or substituted cycloalkyl group or an unsubstituted or substituted alkenyl group, two of $R_1$ to $R_5$ may be bonded each other to form a ring:

(XA)

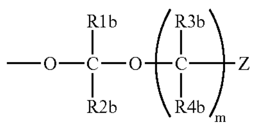

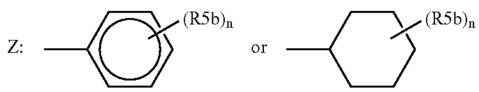

wherein $R_{1b}$ and $R_{2b}$, which may be the same or different, each represents a hydrogen atom or an alkyl group containing 1 to 4 carbon atoms, $R_{3b}$ and $R_{4b}$, which may be the same or different, each represents a hydrogen atom, or an unsubstituted or substituted, straight-chain, branched or cyclic alkyl group, $R_{5b}$ represents an unsubstituted or substituted, straight-chain, branched or cyclic alkyl group, an unsubstituted or substituted aryl group, or an unsubstituted or substituted aralkyl group, m represents an integer of 1 to 20, and n represents an integer of 0 to 5.

(2) The composition according to the above (1), wherein the resin (B) further contains a repeating unit having an alkali-soluble group protected by at least one group which are selected from the alicyclic hydrocarbon structure-containing group represented by the following formulae (pI) to (pVI):

(pI)

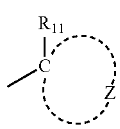

(pII)

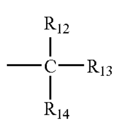

(pIII)

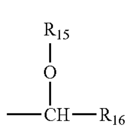

(pIV)

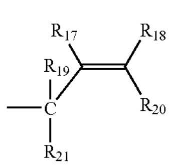

-continued (pV)

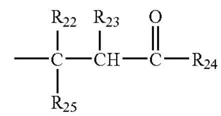

(pVI)

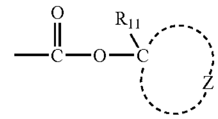

wherein $R_{11}$ represents a methyl group, an ethyl group, an n-propyl group, an isopropyl group, an n-butyl group, an isobutyl group or a sec-butyl group, Z represents an atom group forming an alicyclic hydrocarbon group together with the carbon atom, $R_{12}$ to $R_{16}$ independently represents a straight-chain or branched alkyl group containing 1 to 4 carbon atoms, or an alicyclic hydrocarbon group, provided that at least one of $R_{12}$ to $R_{14}$ or either $R_{15}$ or $R_{16}$ represents an alicyclic hydrocarbon group, $R_{17}$ to $R_{21}$ each independently represents a hydrogen atom, a straight-chain or branched alkyl group containing 1 to 4 carbon atoms, or an alicyclic hydrocarbon group, provided that at least one of $R_{17}$ to $R_{21}$ represents an alicyclic hydrocarbon group and either $R_{19}$ or $R_{21}$ represents a straight-chain or branched alkyl group containing 1 to 4 carbon atoms or an alicyclic hydrocarbon group, $R_{22}$ to $R_{25}$ each independently represents a straight-chain or branched alkyl group containing 1 to 4 carbon atoms, or an alicyclic hydrocarbon group, provided that at least one of $R_{22}$ to $R_{25}$ represents an alicyclic hydrocarbon group.

(3) The composition according to the above (1), wherein the resin (B) further contains a repeating unit having an alkali-soluble group protected by an alicyclic hydrocarbon structure-containing group represented by the following formula (II):

(II)

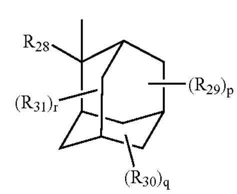

wherein $R_{28}$ represents an unsubstituted or substituted alkyl group, $R_{29}$ to $R_{31}$, which may be the same or different, each represents a hydroxyl group, a halogen atom, a carboxyl group, or an unsubstituted or substituted alkyl, an unsubstituted or substituted cycloalkyl group, an unsubstituted or substituted alkenyl group, an unsubstituted or substituted alkoxy group, an unsubstituted or substituted alkoxycarbonyl group or an unsubstituted or substituted acyl group, p, q and r independently represent an integer of 0 to 3.

(4) The composition according to the above (1), wherein the resin (B) further contains a repeating unit represented by the following formula (a):

(a)

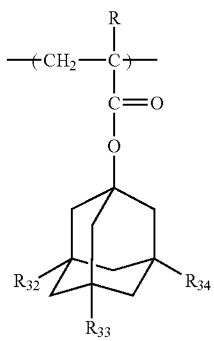

wherein R represents a hydrogen atom, a halogen atom, or a substituted or unsubstituted, straight-chain or branched alkyl group containing 1 to 4 carbon atoms, $R_{32}$ to $R_{34}$, which may be the same or different, each independently represents a hydrogen atom or a hydroxyl group, provided that at least one of $R_{32}$ to $R_{34}$ is a hydroxyl group.

(5) The composition according to the above (1), wherein the repeating unit having a group represented by formula (XA) include repeating units of formulae (IA), (IIA) and (IIIA):

(IA)

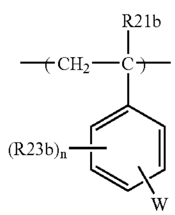

(IIA)

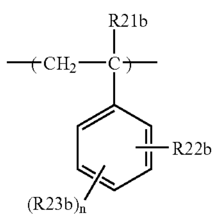

(IIIA)

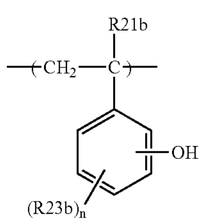

wherein R21b represents a hydrogen atom or a methyl group, R22b represents a group incapable of decomposing under the action of an acid, R23b represents a hydrogen atom, a halogen atom, an alkyl group, an aryl group, an alkoxy group, an acyl group or an acyloxy group, n is an integer of 1 to 3, and W is a group represented by formula (XA).

(6) The composition according to the above (1), wherein the compound (A) is a compound represented by the following formula (IV):

(IV)

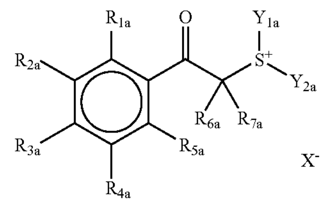

wherein $R_{1a}$ to $R_{5a}$, which may be the same or different, each independently represents a hydrogen atom, a nitro group, a halogen atom, or an unsubstituted or substituted alkyl group, an unsubstituted or substituted alkoxy group, an unsubstituted or substituted alkyloxycarbonyl group, an unsubstituted or substituted aryl group or an unsubstituted or substituted acylamino group, two of $R_{1a}$ to $R_{5a}$ may be bonded to each other to form a ring structure, $R_{6a}$ and $R_{7a}$, which may be the same or different, each represents a hydrogen atom, a cyano group, or an unsubstituted or substituted alkyl or an unsubstituted or substituted aryl group, $Y_{1a}$ and $Y_{2a}$, which may be the same or different, each represents an alkyl group which may contain a substituent, an ether linkage or a sulfide linkage, or an unsubstituted or substituted alkenyl group, provided that, when both $Y_{1a}$ and $Y_{2a}$ are alkyl groups, at least either $Y_{1a}$ or $Y_{2a}$is an alkyl group containing a hydroxyl group, an ether linkage or a sulfide linkage or both $Y_{1a}$ and $Y_{2a}$ are alkyl groups which each contains at least 2 carbon atoms, wherein at least one of $R_{1a}$ to $R_{5a}$ combines with at least either $Y_{1a}$ or $Y_{2a}$ to form a ring, at least one of $R_{1a}$ to $R_{5a}$ combines with at least either $R_{6a}$ or $R_{7a}$ to form a ring, $R_{1a}$ to $R_{7a}$, $Y_{1a}$ or $Y_{2a}$ is bonded at any one position through a linking group, so that the component (A) may have 2 or more of the structures of formula (IV), $X^-$ represents a non-nucleophilic anion.

(7) The composition according to the above (1), which further comprises (C) a basic compound and (D) a fluorine-containing surfactant, a silicon-containing surfactant or a mixture thereof.

(8) The composition according to the above (7), wherein the basic compound includes at least one compound having a structure selected from the group consisting of an imidazole structure, a diazabicyclo structure, an onium hydroxide structure, an onium carboxylate structure, a trialkylamine structure and an aniline structure.

(9) The composition according to the above (1), which further comprises (F) a compound having a molecular weight of not more than 3000 which is capable of decomposing by the action of acid to increase solubility in an alkali developing solution.

(10) The composition according to the above (1), which is used for exposure to soft X-rays with wavelengths of 50 nm or shorter.

(11) The composition according to the above (1), which is used for exposure to EUV-ray with wavelength of 13.5 nm.

DETAILED DESCRIPTION OF THE INVENTION

Compounds used in the invention are described below in detail.

<<(A) Compound Capable of Generating Acid by Irradiation with Actinic Ray or Radiation (Photo-Acid Generator)>>

The photo-acid generator of Component (A) used in the invention is a compound capable of generating an acid when irradiated with actinic rays or radiation.

The photo-acid generator usable as Component (A) in the invention can be selected appropriately from photo-initiators for cationic photopolymerization, photo-initiators for radical photopolymerization, photodecoloring agents for dyes, photodiscoloring agents, known compounds capable of generating acids when irradiated with light (400–200 nm ultraviolet rays, far ultraviolet rays, especially g-ray, h-ray, i-ray and KrF excimer laser light), ArF excimer laser light, electron beams, soft X-rays, X-rays, molecular beams or ion beams, or mixtures of two or more thereof.

Examples of other photo-acid generators usable in the invention include onium salts, such as diazonium salts, ammonium salts, phosphonium salts, iodonium salts, sulfonium salts, selenonium salts and arsonium salts; organic halogen compounds; organometallic/halogenated organic compounds; photo-acid generators having protective groups of o-nitrobenzyl type; compounds generating sulfonic acid by photolysis as represented by iminosulfonate; disulfone compounds, diazoketosulfone and diazodisulfone compounds.

In addition, polymers having main or side chains into which those groups or compounds capable of generating acids under the action of light are introduced can also be employed.

Further, the compounds generating acids under the action of light as described in V. N. R. Pillai, *Synthesis,* (1), 1(1980), A. Abad et al., *Tetrahedron Lett.,* (47) 4555 (1971), D. H. R. Barton et al., *J. Chem. Soc.,* (C), 329 (1970), U.S. Pat. No. 3,779,773 and European Patent No. 126,712 can be used, too.

Of the compounds generating acids through decomposition by irradiation with actinic rays or radiation, the compounds especially effective as photo-acid generators are illustrated below.

The acid generators used to particular advantage in the invention are compounds represented by formula (IV), which can generate acids when irradiated with actinic rays or radiation.

In formula (IV), $R_{1a}$ to $R_{5a}$, which may be the same or different, each represents a hydrogen atom, a nitro group, a halogen atom, or an alkyl group, an alkoxy group, an alkyloxycarbonyl group, an aryl group or an acylamino group, which may have a substituent. And at least two of $R_{1a}$ to $R_{5a}$ may be bonded to each other to form a cyclic structure.

$R_{6a}$ and $R_{7a}$, which may be the same or different, each represents a hydrogen atom, a cyano group, or an alkyl or aryl group, which may have a substituent.

$Y_{1a}$ and $Y_{2a}$, which may be the same or different, each represents an alkyl group which may contain a substituent, an ether linkage group or a sulfide linkage group, or an alkenyl group which may have a substituent. In the case where both $Y_{1a}$ and $Y_{2a}$ are alkyl groups, however, it is required that at least either $Y_{1a}$ or $Y_{2a}$ be an alkyl group containing a hydroxyl group, an ether linkage group or a sulfide linkage group, or both $Y_{1a}$ and $Y_{2a}$ be alkyl groups which each contains at least 2 carbon atoms.

At least one of $R_{1a}$ to $R_{5a}$ and at least either $Y_{1a}$ or $Y_{2a}$ may combine to form a ring.

At least one of $R_{1a}$ to $R_{5a}$ and at least either $R_{6a}$ or $R_{7a}$ may combine to form a ring.

Further, at least two structures represented by formula (IV) may be present in a compound of formula (IV) by being combined via a linkage group at any sites selected from $R_{1a}$ to $R_{7a}$, or at the site of $Y_{1a}$ or $Y_{2a}$.

$X^-$ represents a non-nucleophilic anion.

The alkyl group or the alkyl moiety in the acylamino group $R_{1a}$ to $R_{7a}$ each can represent is preferably a $C_1$–$C_{10}$ alkyl group including straight-chain, branched and cyclic alkyl groups, such as a methyl group, an ethyl group, a propyl group, an n-butyl group, a sec-butyl group, a t-butyl group, a cyclobutyl group, a pentyl group, a neopentyl group, a cyclopentyl group, a hexyl group, a cyclohexyl group, a heptyl group, an octyl group, a nonyl group, a decyl group.

The alkoxy group or the alkoxy moiety in the alkyloxycarbonyl group $R_{1a}$ to $R_{7a}$ each can represent is preferably a $C_1$–$C_{10}$ alkoxy group, such as a methoxy group, an ethoxy group, a propoxy group, a butoxy group, a pentyloxy group, a hexyloxy group, a cyclohexyloxy group, a heptyloxy group, an octyloxy group, a nonyloxy group or a decyloxy group.

The aryl group $R_{1a}$ to $R_{7a}$ each can represent is preferably a $C_6$–$C_{14}$ aryl group including a phenyl group, a tolyl group and a naphthyl group.

The halogen atom $R_{1a}$ to $R_{5a}$ each can represent includes a fluorine atom, a chlorine atom, a bromine atom and an iodine atom.

The alkyl group $Y_{1a}$ and $Y_{2a}$ each can represent is preferably a $C_1$–$C_{20}$ alkyl group including straight-chain, branched and cyclic ones, such as a methyl group, an ethyl group, a propyl group, an isopropyl group, an n-butyl group, an iso-butyl group, a t-butyl group, an n-hexyl group, a cyclohexyl group, an octyl group and a dodecyl group. Among these groups, $C_3$–$C_{20}$ alkyl groups have an advantage over the others, with examples including straight-chain, branched and cyclic alkyl groups such as a propyl group, an isopropyl group, an n-butyl group, an iso-butyl group, a t-butyl group, an n-hexyl group, a cyclohexyl group, an octyl group and a dodecyl group. And especially preferred ones among those groups are $C_4$–$C_{12}$ alkyl groups including straight-chain, branched and cyclic ones, such as an n-butyl group, an iso-butyl group, a t-butyl group, an n-hexyl group, a cyclohexyl group, an octyl group and a dodecyl group.

The alkenyl group $Y_{1a}$ and $Y_{2a}$ each represents is preferably a 2–6C alkenyl group, such as a vinyl group, a propenyl group, a butenyl group or a hexenyl group.

At least two of $R_{1a}$ to $R_{5a}$ may be bonded to each other to form a ring structure.

The group formed by combination between at least two of $R_{1a}$ to $R_{5a}$ is preferably a $C_4$–$C_{10}$alkylene group, such as a butylene group, a pentylene group or a hexylene group.

Each of the above-recited alkyl, alkoxy, alkoxycarbonyl, aryl, aralkyl and alkenyl groups maybe substituted with, e.g., a nitro group, a halogen atom, a carboxyl group, a hydroxyl group, an amino group, an alkoxy group (preferably containing 1 to 5 carbon atoms) or an alkyltho group (preferably containing 1 to 5 carbon atoms). As to the aryl group and the aralkyl group, each may further be substituted with an alkyl group (preferably containing 1 to 5 carbon atoms).

As a substituent the alkyl group may have, a halogen atom is preferred.

When both $Y_{1a}$ and $Y_{2a}$ are alkyl groups, the alkyl group represented by at least either $Y_{1a}$ or $Y_{2a}$ contains a hydroxyl group, an ether linkage group or a sulfide linkage group, or each of the alkyl groups represented by both $Y_{1a}$ and $Y_{2a}$ contains at least two carbon atoms.

When both $Y_{1a}$ and $Y_{2a}$ are alkyl groups having no substituent or no linkage group, it is appropriate that they each contain at least 3 carbon atoms, preferably at least 4 carbon atoms.

Formation of a ring structure by a combination of $Y_{1a}$ and $Y_{2a}$ is undesirable because it becomes a cause of topple patterns.

The suitable total number of carbon atoms contained in $R_{1a}$ to $R_{5a}$ is not greater than 1. And the case where all of $R_{1a}$ to $R_{5a}$ are hydrogen atoms is preferred in particular.

Examples of a non-nucleophilic anion represented by $X^-$include a sulfonic acid anion, a carboxylic acid anion, a bis (alkylsulfonyl) imide anion and a tris (alkylsulfonyl) methyl anion.

The term "non-nucleophilic anion" as used herein refers to the anion significantly poor in capability to cause nucleophilic reaction. Such an anion can retard decomposition occurring with a lapse of time through intramolecular nucelophilic reaction, and thereby can increase the resist stability upon storage.

Examples of a sulfonic acid anion represented by $X^-$ include alkylsulfonic acid anions, arylsulfonic acid anions and camphor sulfonic acid anions.

Examples of a carboxylic acid anion represented by $X^-$ include alkylcarboxylic acid anions, arylcarboxylic acid anions and aralkylcarboxylic acid anions.

Examples of an alkyl moiety suitable for the alkylsulfonic acid anions include $C_1$–$C_{30}$ alkyl groups, such as a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, hexadecyl group, a heptadecyl group, an octadecyl group, a nonadecyl group, an eicosyl group, a cyclopropyl group, a cyclopentyl group, a cyclohexyl group, an adamantyl group, a norbornyl group and bornyl group.

Examples of an aryl moiety suitable for the arylsulfonic acid anions include $C_6$–$C_{14}$ aryl groups, such as a phenyl group, a tolyl group and a naphthyl group.

The alkyl moieties in those alkylsulfonic acid anions and the aryl moieties in those arylsulfonic acid anions may further have substituents.

Examples of such substitutents include halogen atoms, alkyl groups, alkoxy groups and alkylthio groups.

Examples of such halogen atoms include chlorine, bromine, fluorine and iodine atoms.

Examples of such alkyl groups include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, hexadecyl group, a heptadecyl group, an octadecyl group, a nonadecyl group and an eicosyl group. Of these groups, those containing 1 to 15 carbon atoms are preferred over the others.

Examples of such alkoxy groups include $C_1$–$C_5$ alkoxy groups, such as a methoxy group, an ethoxy group, a propoxy group and a butoxy group.

Examples of such alkylthio groups include a methylthio group, an ethylthio group, a propylthio group, an isopropylthio group, an n-butylthio group, an isobutylthio group, a sec-butylthio group, a pentylthio group, a neopentylthio group, a hexylthio group, a heptylthio group, an octylthio group, a nonylthio group, a decylthio group, an undecylthio group, a dodecylthio group, a tridecylthio group, a tetradecylthio group, a pentadecylthio group, a hexadecylthio group, a heptadecylthio group, an octadecylthio group, a nonadecylthio group and an eicosylthio group. Of these groups, those containing 1 to 15 carbon atoms are preferred over the others.

Additionally, each of the alkyl, alkoxy and alkylthio groups as recited above may further substituted with halogen atoms (preferably fluorine atoms).

The alkyl moieties in the alkylcarboxylic acid anions include the same alkyl moieties as those in the alkylsulfonic acid anions include.

The aryl moieties in the arylcarboxylic acid anions include the same aryl moieties as those in the arylsulfonic acid anions include.

Examples of an aralkyl moiety suitable for the aralkylcarboxylic acid anions include $C_6$–$C_{12}$ aralkyl groups, such as a benzyl group, a phenetyl group, a naphthylmethyl group and a naphthylethyl group.

The alkyl, aryl and aralkyl moieties in the alkylcarboxylic, arylcarboxylic and aralkylcarboxylic acid anions may further have substituents. Examples of such substituents include the same halogen atoms, alkyl groups, alkoxy groups and alkylthio groups as the aryl moieties of the arylsulfonic acid anions can have.

The alkyl moieties in the bis (alkylsulfonyl) imide anion and the tris alkylsulfonyl)methyl anion are preferably those containing 1 to 5 carbon atoms, such as a methyl group, an ethyl group, a propyl group, an isopropyl group, an n-butyl group, an isobutyl group, a sec-butyl group, a pentyl group and a neopentyl group. These alkyl groups may further have substituents. Examples of such substituents include halogen atoms, alkoxy groups and alkyltho groups.

Examples of other non-nucleophilic acid anions include phosphorus fluoride, boron fluoride and antimony fluoride.

Examples of a non-nucleophilic acid anion preferred as $X^-$ include sulfonic acid anions fluorinated at their respective 1-positions, preferably perfluoroalkanesulfonic acid anions.

Other examples of a non-nucleophilic acid anion preferred as $X^-$ include fluoride ion and benzensulfonic acid anions substituted with fluorine-containing groups.

In formula (IV), at least one of $R_{1a}$ to $R_{5a}$ and at least either $Y_{1a}$ or $Y_{2a}$ may combine to form a ring, or at least one of $R_{1a}$ to $R_{5a}$ and at least either $R_{6a}$ or $R_{7a}$ may combine to form a ring.

Suitable examples of a group formed by combining at least one of $R_{1a}$ to $R_{5a}$ with at least either $Y_{1a}$ or $Y_{2a}$ and a group formed by combining at least one of $R_{1a}$ to $R_{5a}$ with at least either $R_{6a}$ or $R_{7a}$ include $C_2$–$C_{10}$ alkylene groups, such as an ethylene group, a propylene group, a butylene group, a pentylene group and a hexylene group.

The ring formation as mention above can fix the conformation of a compound represented by formula (IV) to result in enhancement of light resolving power.

Moreover, at least two structures of formula (IV) may be present in the compound of Component (A) by being combined via a linkage group at any sites selected from $R_{1a}$ to $R_{7a}$, $Y_{1a}$ or $Y_{2a}$.

Suitable examples of the present compound represented by formula (IV) are illustrated below, but these examples should not be construed as limiting the scope of the invention.

(IV-1)

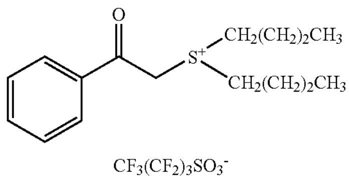

(IV-2)

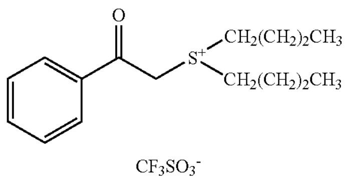

(IV-3)

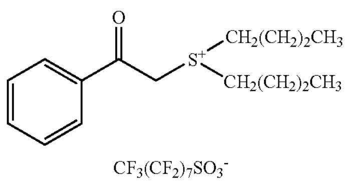

(IV-4)

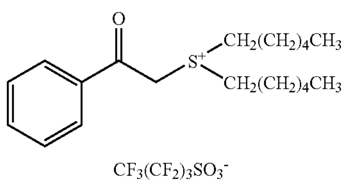

(IV-5)

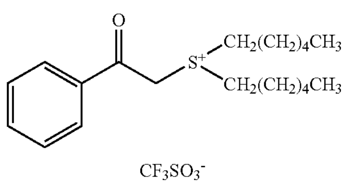

(IV-6)

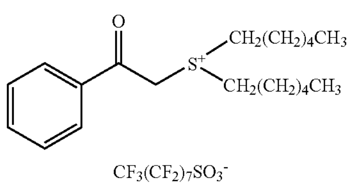

(IV-7)

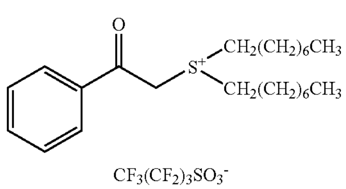

-continued (IV-8)

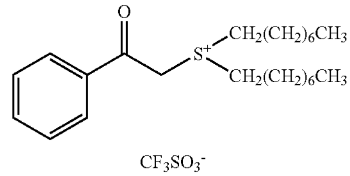

(IV-9)

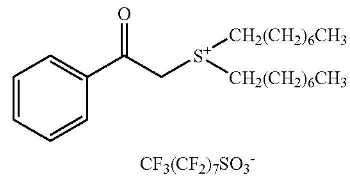

(IV-10)

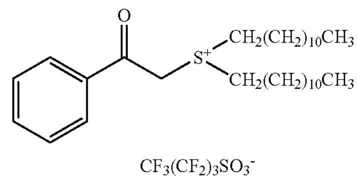

(IV-11)

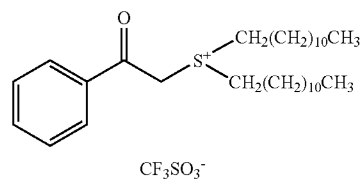

(IV-12)

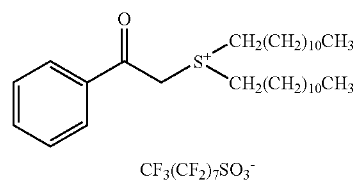

(IV-13)

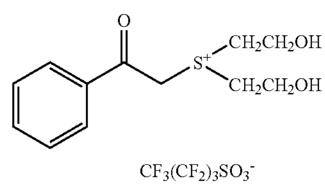

(IV-14)

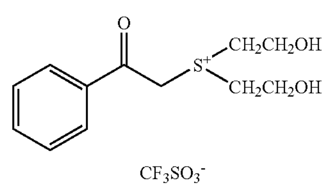

(IV-15)

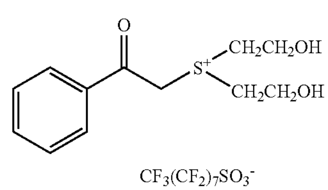

-continued
(IV-16)
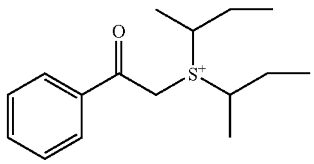
$CF_3(CF_2)_3SO_3^-$
(IV-17)
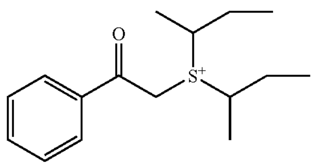
$CF_3SO_3^-$
(IV-18)
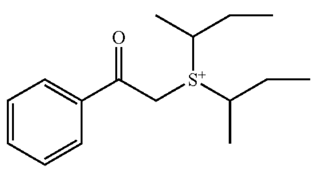
$CF_3(CF_2)_7SO_3^-$
(IV-19)
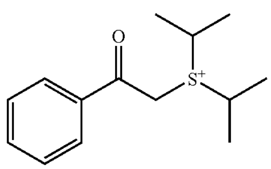
$CF_3(CF_2)_3SO_3^-$
(IV-20)
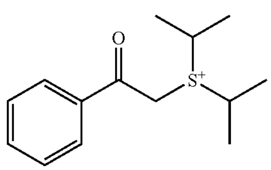
$CF_3SO_3^-$
(IV-21)
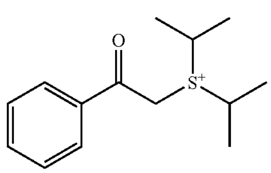
$CF_3(CF_2)_7SO_3^-$
(IV-22)
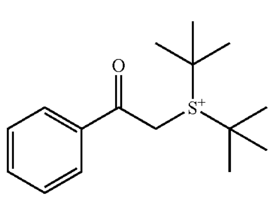
$CF_3(CF_2)_3SO_3^-$
-continued
(IV-23)
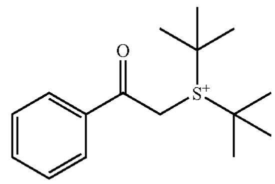
$CF_3SO_3^-$
(IV-24)
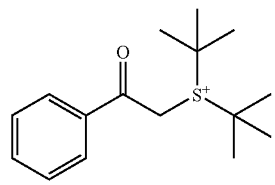
$CF_3(CF_2)_7SO_3^-$
(IV-25)
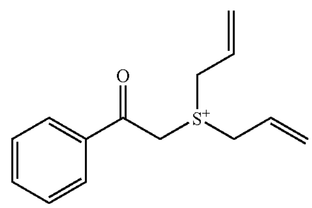
$CF_3(CF_2)_3SO_3^-$
(IV-26)
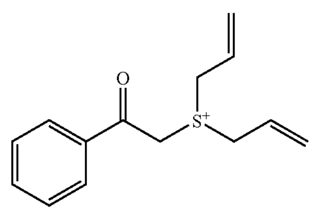
$CF_3SO_3^-$
(IV-27)
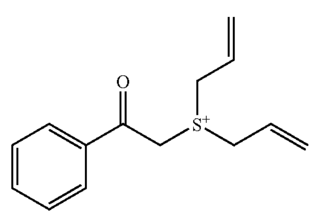
$CF_3(CF_2)_7SO_3^-$
(IV-28)
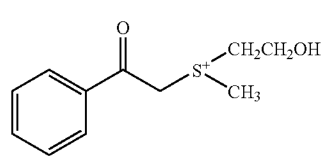
$CF_3(CF_2)_3SO_3^-$
(IV-29)
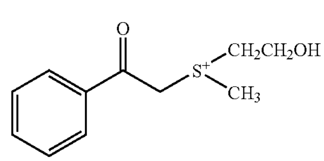
$CF_3SO_3^-$ -continued
(IV-30)
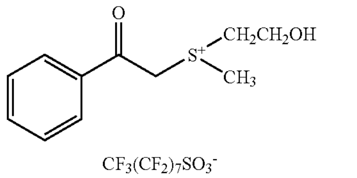
(IV-31)
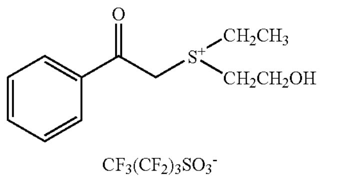
(IV-32)
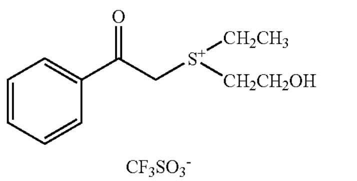
(IV-33)
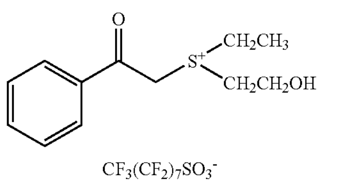
(IV-34)
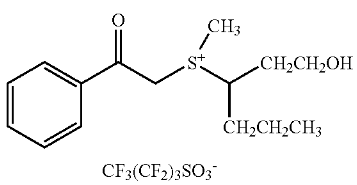
(IV-35)
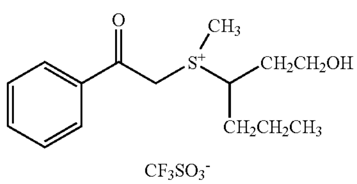
(IV-36)
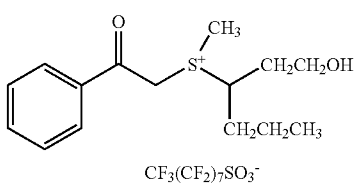
(IV-37)
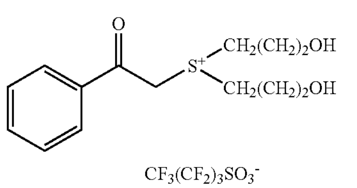
-continued
(IV-38)
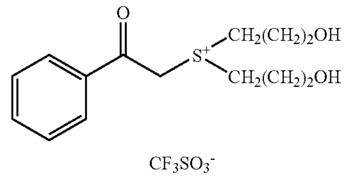
(IV-39)
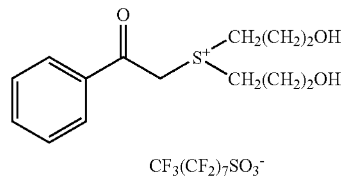
(IV-40)
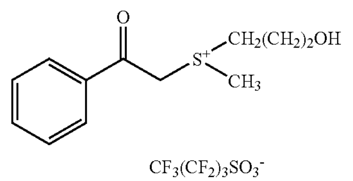
(IV-41)
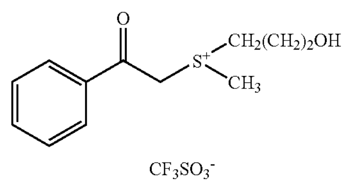
(IV-42)
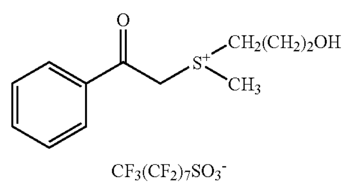
(IV-43)
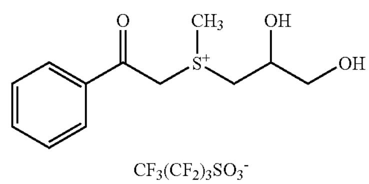
(IV-44)
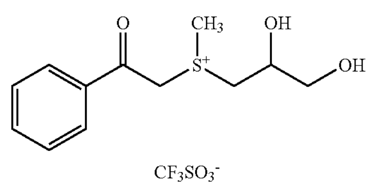
(IV-45)
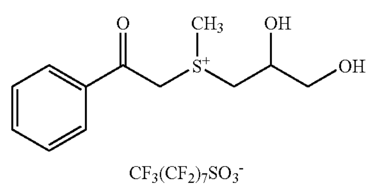

-continued
(IV-46)
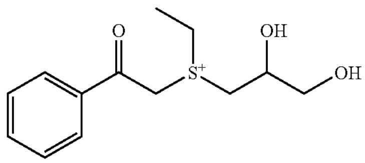
$CF_3(CF_2)_3SO_3^-$
(IV-47)
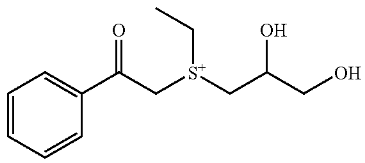
$CF_3SO_3^-$
(IV-48)
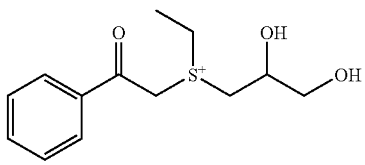
$CF_3(CF_2)_7SO_3^-$
(IV-49)
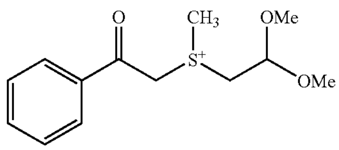
$CF_3(CF_2)_3SO_3^-$
(IV-50)
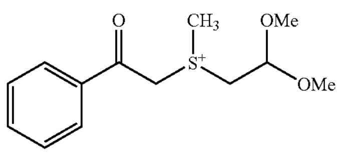
$CF_3SO_3^-$
(IV-51)
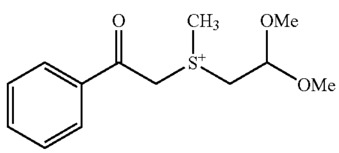
$CF_3(CF_2)_7SO_3^-$
(IV-52)
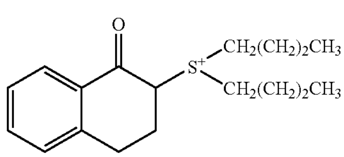
$CF_3(CF_2)_3SO_3^-$
(IV-53)
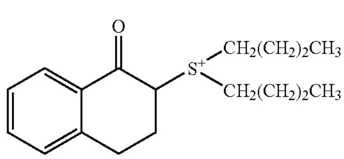
$CF_3SO_3^-$
-continued
(IV-54)
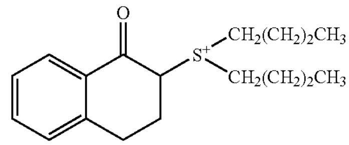
$CF_3(CF_2)_7SO_3^-$
(IV-55)
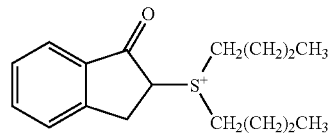
$CF_3(CF_2)_3SO_3^-$
(IV-56)
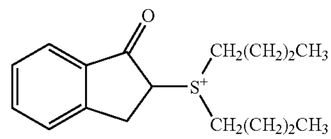
$CF_3SO_3^-$
(IV-57)
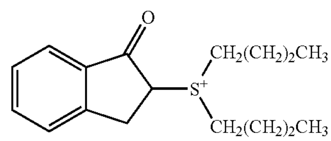
$CF_3(CF_2)_7SO_3^-$
(IV-58)
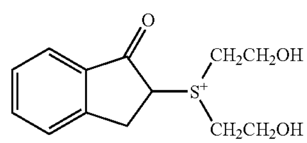
$CF_3(CF_2)_3SO_3^-$
(IV-59)
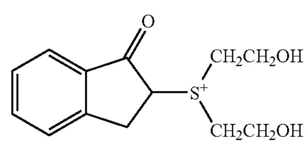
$CF_3SO_3^-$
(IV-60)
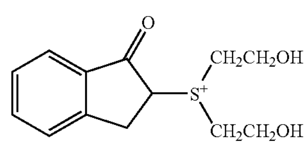
$CF_3(CF_2)_7SO_3^-$
(IV-61)
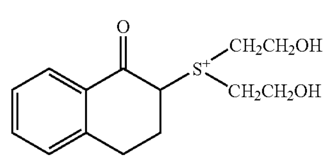
$CF_3(CF_2)_3SO_3^-$ -continued (IV-62)

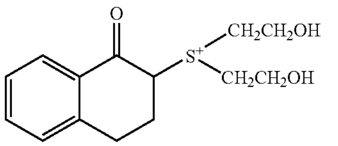

$CF_3SO_3^-$ (IV-63)

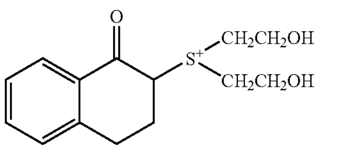

$CF_3(CF_2)_7SO_3^-$ (IV-64)

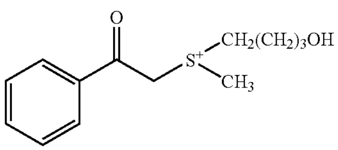

$CF_3(CF_2)_3SO_3^-$ (IV-65)

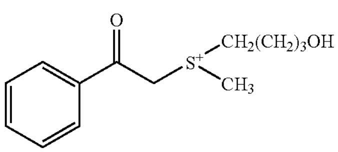

$CF_3SO_3^-$ (IV-66)

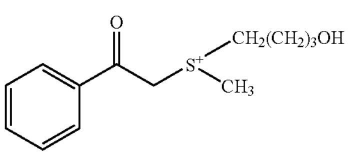

$CF_3(CF_2)_7SO_3^-$ (IV-67)

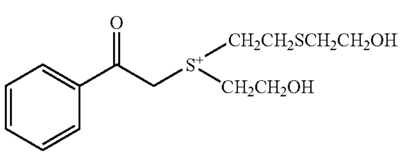

$CF_3(CF_2)_3SO_3^-$ (IV-68)

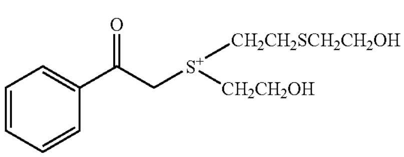

$CF_3SO_3^-$ (IV-69)

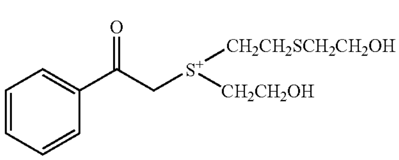

$CF_3(CF_2)_7SO_3^-$

-continued (IV-70)

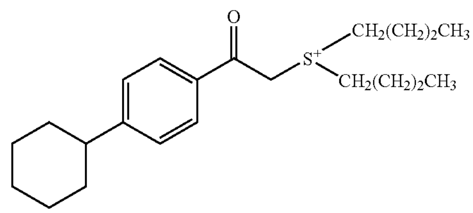

$CF_3(CF_2)_3SO_3^-$ (IV-71)

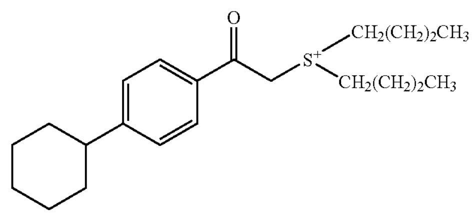

$CF_3SO_3^-$ (IV-72)

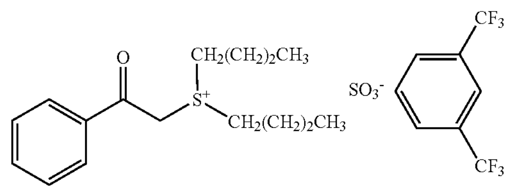

(IV-73)

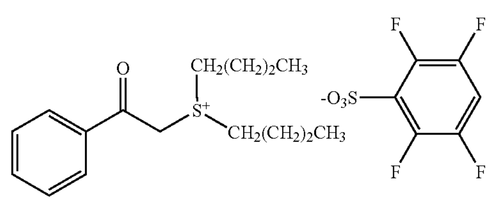

(IV-74)

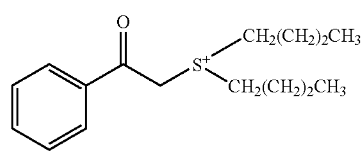

$CF_3CF_2OCF_2CF_2SO_3^-$ (IV-75)

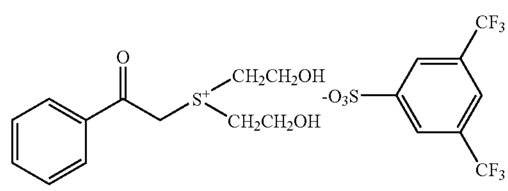

The compounds of formula (IV) as illustrated above can be used alone or as combinations of two or more thereof.

It is possible to produce the compounds of formula (IV) by allowing phenacyl halogenides, such as phenacyl bromide, to react with sulfide in an appropriate solvent in the absence of catalyst or in the presence of silver catalyst to form phenacyldialkylsulfonium salts, and then carrying out salt exchange between these salts and anions corresponding thereto.

The suitable content of the compound of component (A) in the present positive-working photosensitive composition is from 0.1 to 20% by weight, preferably from 0.5 to 10% by weight, far preferably from 1 to 7% by weight based on the solid content of the composition.

In the invention, acid generating compounds other than the photo-acid generating compounds represented by formula (IV) can be used, and the acid generating compounds represented by formula (IV) can also be used in combination with acid generating compounds other than the compounds represented by formula (IV).

The ratio of the present acid-generating compound represented by formula (IV) to photo-acid generators usable in combination therewith (Compound of formula (IV)/other acid generators ratio) is generally from 100/0 to 20/80, preferably from 100/0 to 40/60, far preferably from 100/0 to 50/50, by mole.

As acid generating compounds other than the compounds of formula (IV) and photo-acid generators usable in combination with the compounds of formula (IV), it is possible to use compounds selected appropriately from photo-initiators for cationic photopolymerization, photo-initiators for radical photopolymerization, photodecoloring agents for dyes, photodiscoloring agents, compounds used in microresist and known to generate acids by irradiation with actinic rays or radiation, and mixtures of two or more thereof.

Examples of such compounds include diazonium salts, phosphonium salts, sulfonium salts, iodonium salts, imide sulfonates, oxime sulfonates, diazodisulfone, disulfone and o-nitrobenzylsulfonate.

In addition, polymeric compounds prepared by introducing groups or compounds capable of generating acids upon irradiation with actinic rays or radiation into the main or the side chains of polymers can also be used. Examples of such polymeric compounds include the compounds as disclosed in U.S. Pat. No. 3,849,137, German Patent No. 3914407, JP-A-63-26653, JP-A-55-164824, JP-A-62-69263, JP-A-63-146038, JP-A-63-163452, JP-A-62-153853 and JP-A-63-146029.

Further, the compounds capable of generating acids by the action of light as disclosed in U.S. Pat. No. 3,779,778 and European Patent No. 136,712 can be used.

Of the compounds of the type which decompose upon irradiation with actinic rays or radiation to generate acids and may be used in combination with the compounds of formula (IV), the compounds preferred in particular are illustrated below.

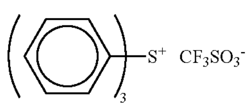

(z1)

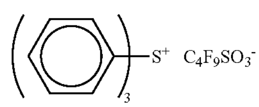

(z2)

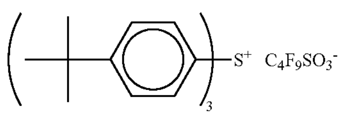

(z3)

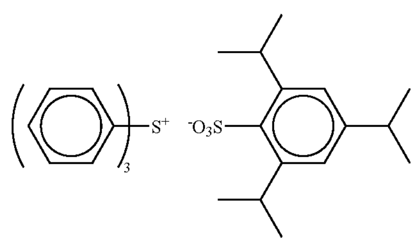

(z4)

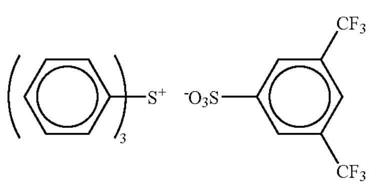

(z5)

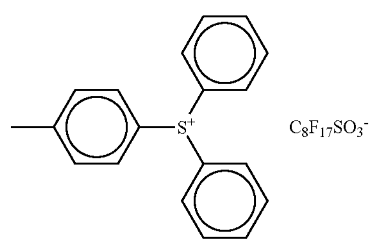

(z6)

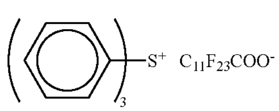

(z7)

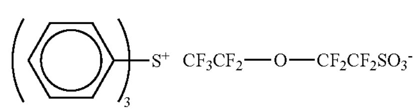

(z8)

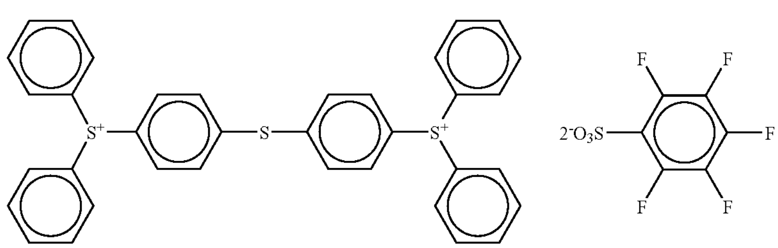

(z9)

-continued
(z10)
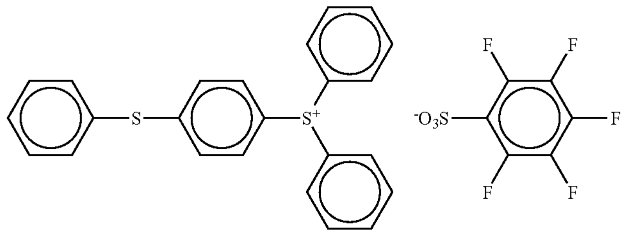
(z11)
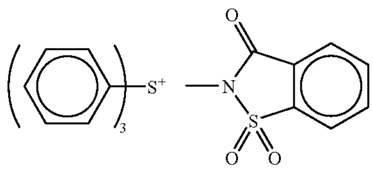
(z12)
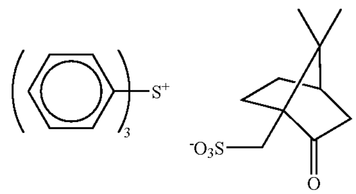
(z13)
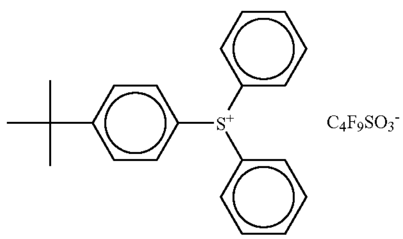
(z14)
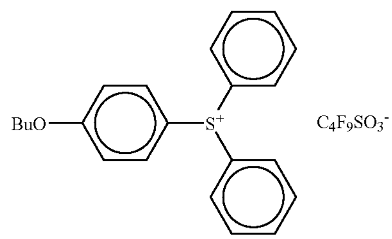
(z15)
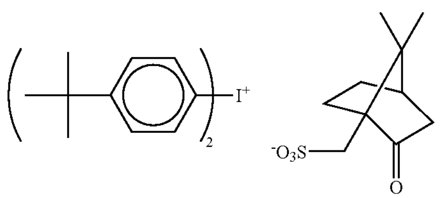
(z16)
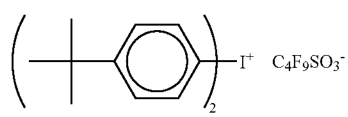
(z17)
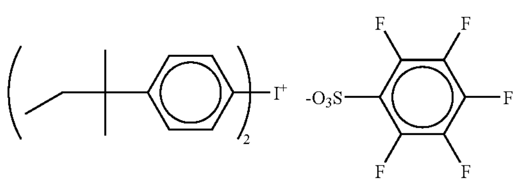
(z18)
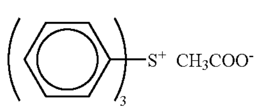
(z19)
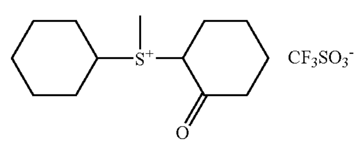
(z20)
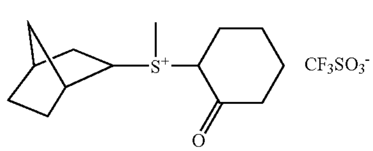
(z21)
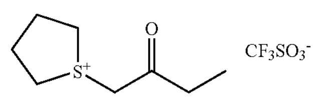
(z22)
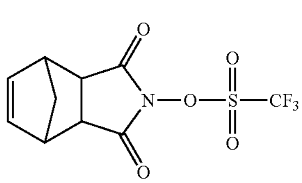
(z23)
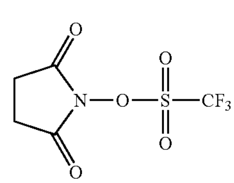

-continued
(z24)
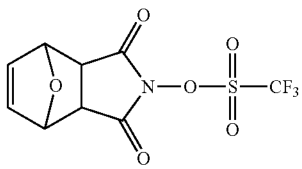
(z25)
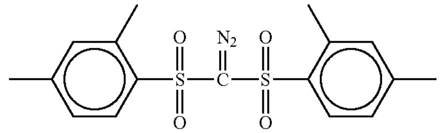
(z26)
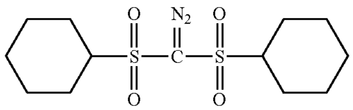
(z27)
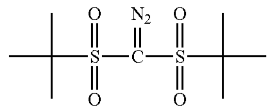
(z28)
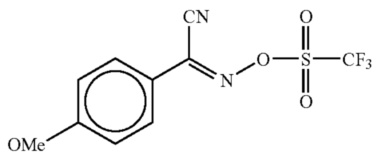
(z29)
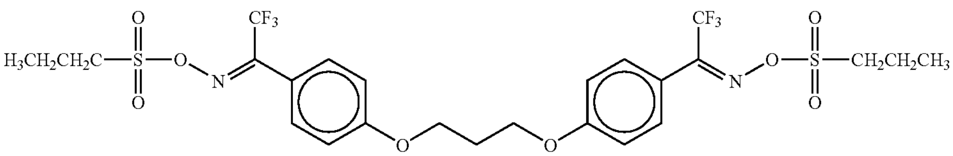
(z30)
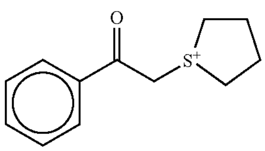
$CF_3SO_3$-
(z31)
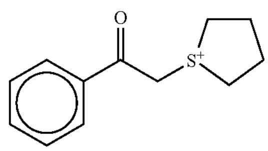
$CF_3(CF_2)_3SO_3$-
(z32)
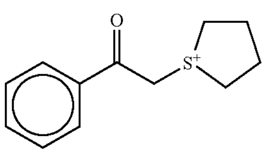
$CF_3(CF_2)_7SO_3$-
(z33)
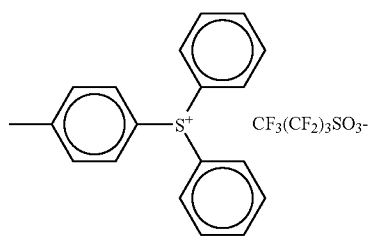
$CF_3(CF_2)_3SO_3$-
(z34)
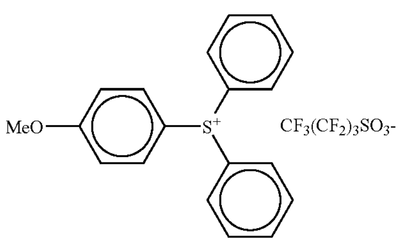
$CF_3(CF_2)_3SO_3$-
(z35)
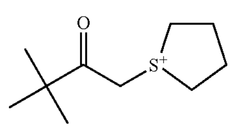
$CF_3SO_3^-$
(z36)
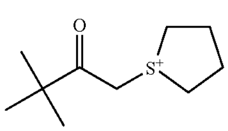
$CF_3(CF_2)_3SO_3^-$
(z37)
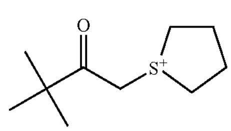
$CF_3(CF_2)_7SO_3^-$
(z38)
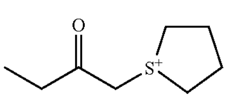
$CF_3(CF_2)_3SO_3^-$
(z39)
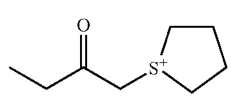
$CF_3(CF_2)_7SO_3^-$ <<(B) Resin Capable of Decomposing by the Action of Acid and Increasing Solubility in Alkali>>

The resin of Component (B) used in the present composition, which can decompose by the action of the acids as recited above and increase solubility in alkalis, contains repeating units having groups represented by at least one of the foregoing formulae (I-1) to (I-4).

In formulae (I-1) to (I-4), the alkyl group represented by $R_1$ to $R_5$ each is a straight-chain or branched alkyl group which may have a substituent. Suitable examples of such straight-chain and branched alkyl groups include $C_1$–$C_{1-2}$ straight-chain and branched alkyl groups, preferably $C_1$–$C_{10}$ straight-chain and branched alkyl group, far preferably a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group and a decyl group.

The cycloalkyl group represented by $R_1$ to $R_5$ each preferably a $C_3$–$C_8$ cycloalkyl group, such as a cyclopropyl group, a cyclopentyl group, a cyclohexyl group, a cycloheptyl group or a cyclooctyl group.

The alkenyl group represented by $R_1$ t $R_5$ each is preferably a $C_2$–$C_6$ alkenyl group, such as a vinyl group, a propenyl group, a butenyl group or a hexenyl group.

Examples of a ring formed by combining any two of $R_1$ to $R_5$ into one group include 3- to 8-membered ring, such as a cyclopropane ring, a cyclobutane ring, a cyclopentane ring, a cyclohexane ring and a cyclooctane ring.

In formulae (I-1) and (I-2) each, $R_1$ to $R_5$ maybe attached to any of 7 carbon atoms constituting the cyclic skeleton.

Examples of substituents the above-recited alkyl, cycloalkyl and alkenyl groups may further have include 1–4C alkoxy groups, halogen atoms (namely fluorine, chlorine, bromine and iodine atoms), acyl groups, acyloxy groups, a cyano group, a hydroxyl group, a carboxyl group, alkoxycarbonyl groups and a nitro group.

Suitable examples of repeating units having groups represented by formulae (I-1) to (I-4) respectively include repeating units represented by the following formula (AI).

(AI)

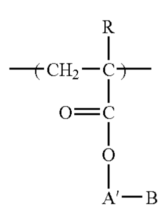

In formula (AI), R has the same meaning as R in formula (a) illustrated hereinbefore, and specifically represents a hydrogen atom, a halogen atom or a $C_1$–$C_4$ substituted or unsubstituted, straight-chain or branched alkyl group. A' represents a single bond, an ether group, an ester group, a carbonyl group, an alkylene group or a divalent group formed by combining any two or more of these groups; and B represents a group represented by any of formulae (I-1) to (I-4). Examples of a combined divalent group represented by A' are illustrated below.

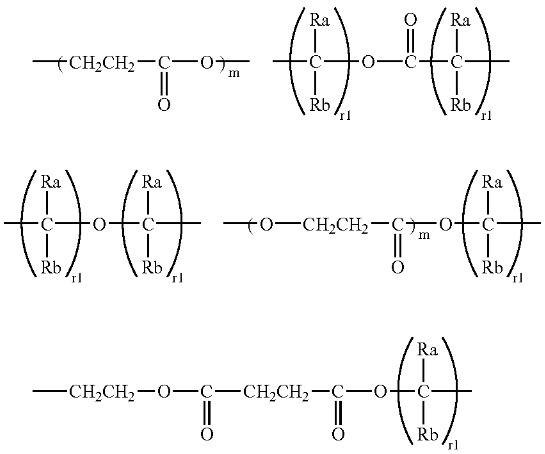

In the above formulae, Ra and Rb, which may be the same or different, each represents a hydrogen atom, an alkyl group, a substituted alkyl group, a halogen atom, a hydroxyl group or an alkoxy group. Suitable examples of such an alkyl group include lower alkyl groups, such as a methyl group, an ethyl group, a propyl group and a butyl group, preferably selected from a methyl group, an ethyl group, a propyl group or an isopropyl group. Examples of a substituent the substituted alkyl group has include a hydroxyl group, a halogen atom and an alkoxy group. Examples of the alkoxy group include $C_1$–$C_4$ alkoxy groups, such as a methoxy group, an ethoxy group, a propoxy group and a butoxy group. Examples of the halogen atom include a chlorine atom, a bromine atom, a fluorine atom and an iodine atom. r1 represents an integer of 1 to 10. m represents an integer of 1 to 3.

Examples of repeating units represented by formula (AI) are illustrated below, but these examples should not be construed as limiting the scope of the invention.

(I-1)

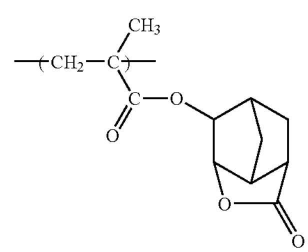

(I-2)

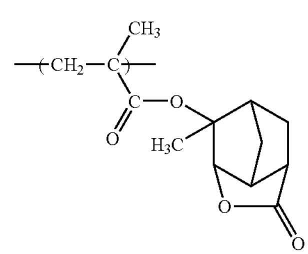

-continued
(I-3)
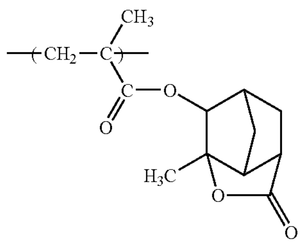
(I-4)
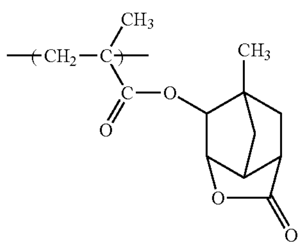
(I-5)
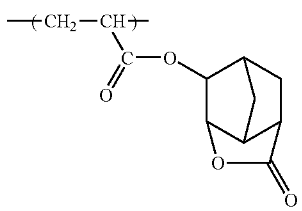
(I-6)
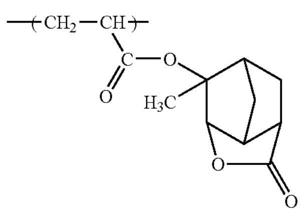
(I-7)
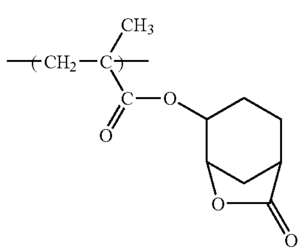
(I-8)
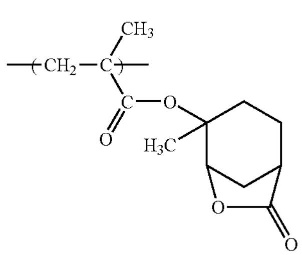
-continued
(I-9)
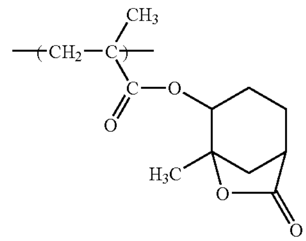
(I-10)
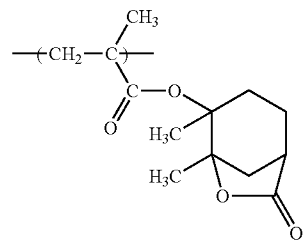
(I-11)
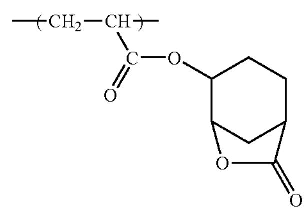
(I-12)
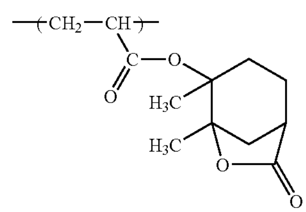
(I-13)
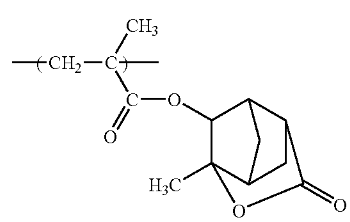
(I-14)
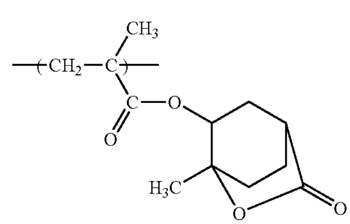

-continued
(I-15)
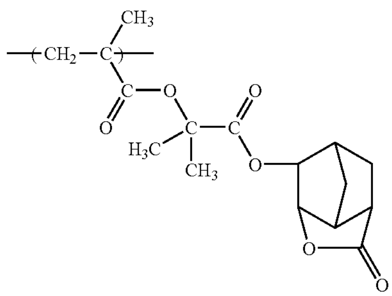
(I-16)
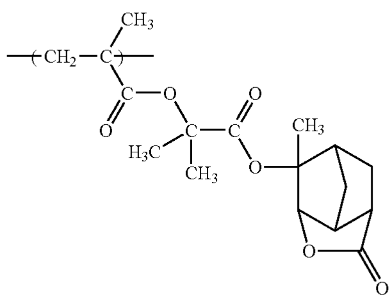
(I-17)
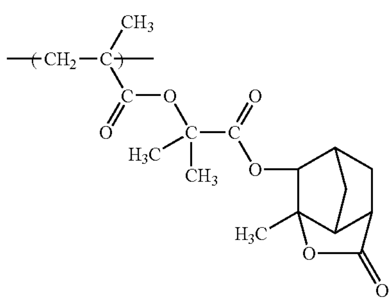
(I-18)
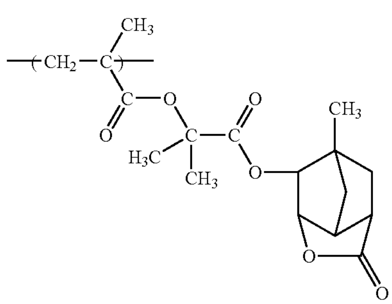
(I-19)
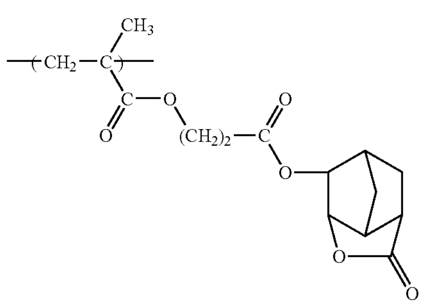
-continued
(I-20)
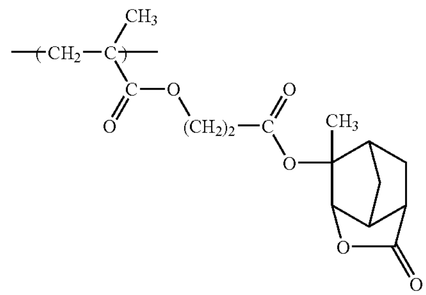
(I-21)
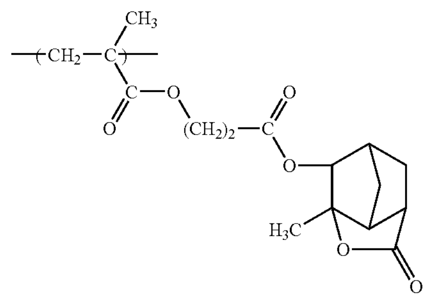
(I-22)
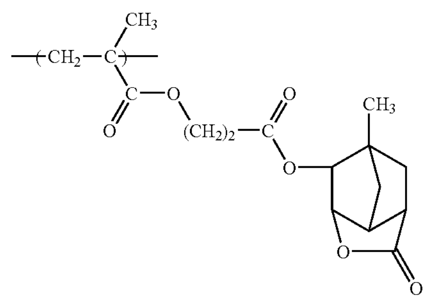
(I-23)
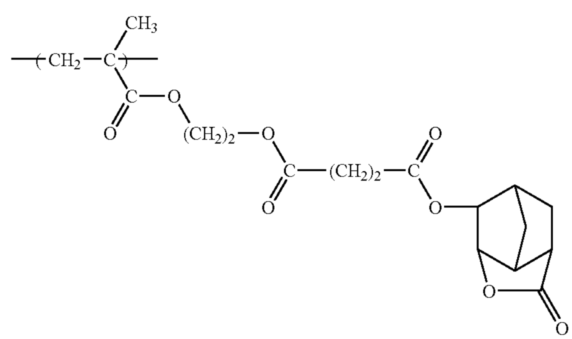
(I-24)
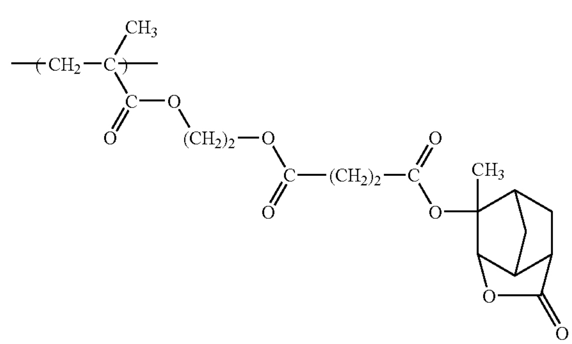

-continued
(I-25)
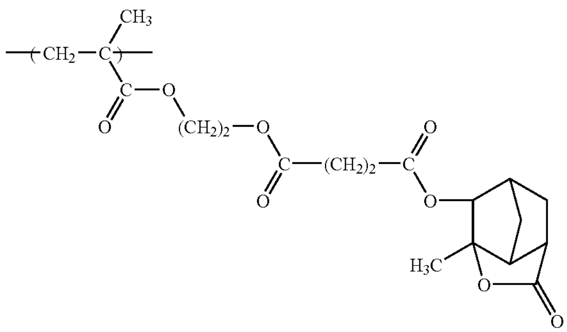
(I-26)
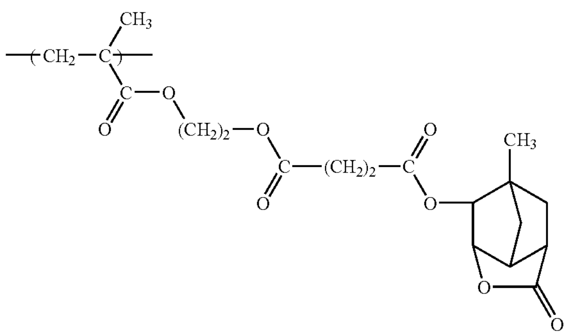
(I-27)
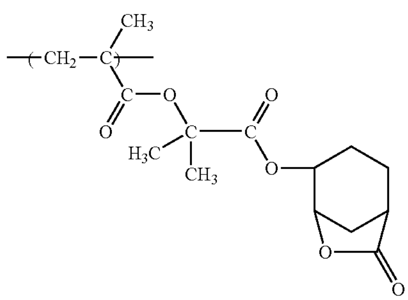
(I-28)
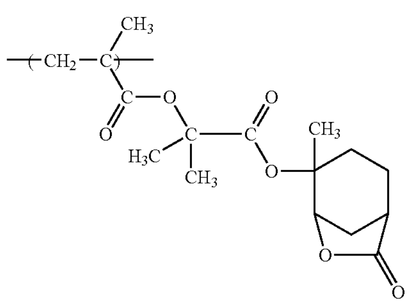
(I-29)
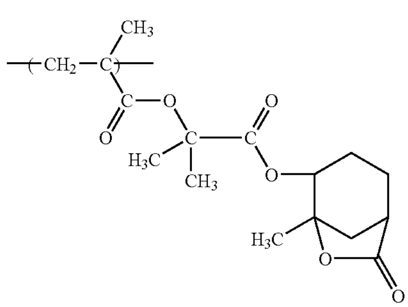
-continued
(I-30)
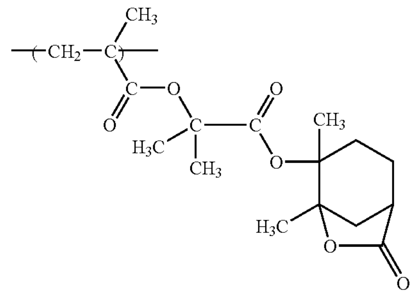
(I-31)
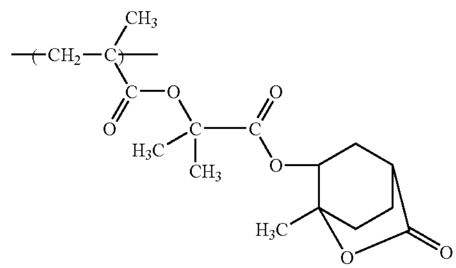
(I-32)
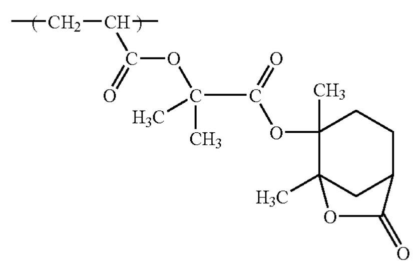
(I-33)
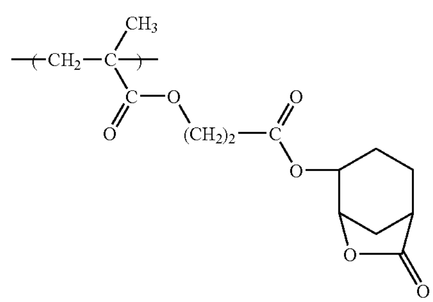
(I-34)
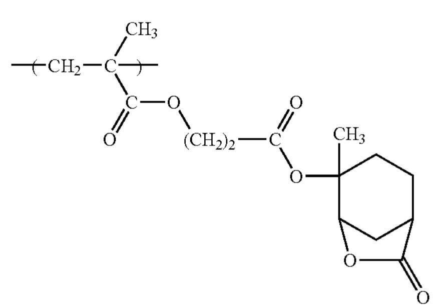

-continued
(I-35)
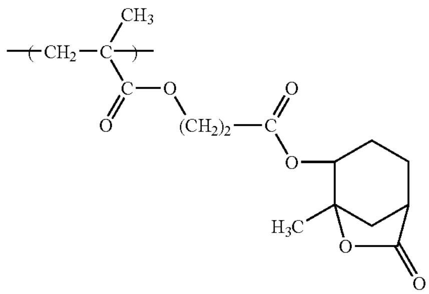
(I-36)
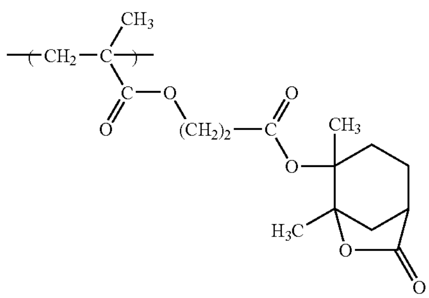
(I-37)
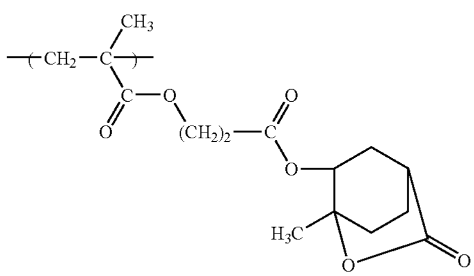
(I-38)
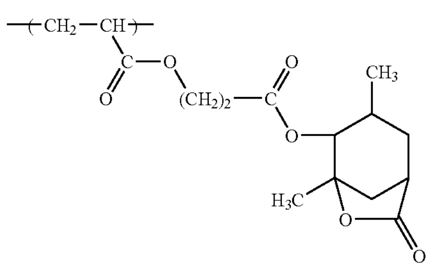
(I-39)
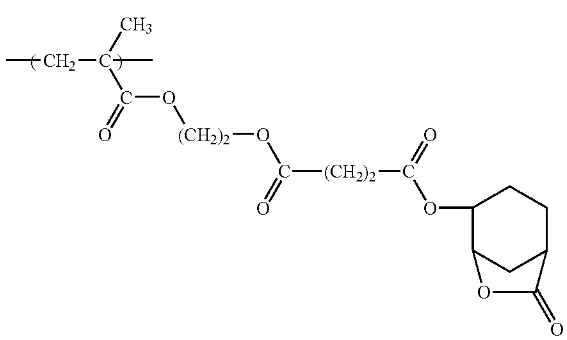
-continued
(I-40)
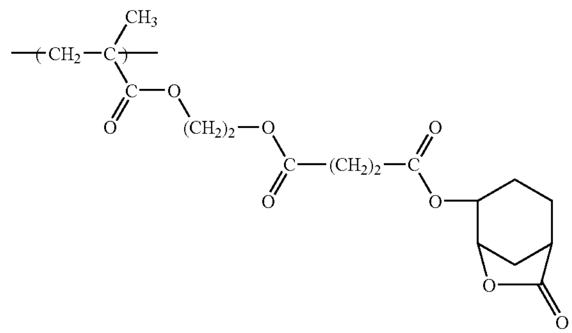
(I-41)
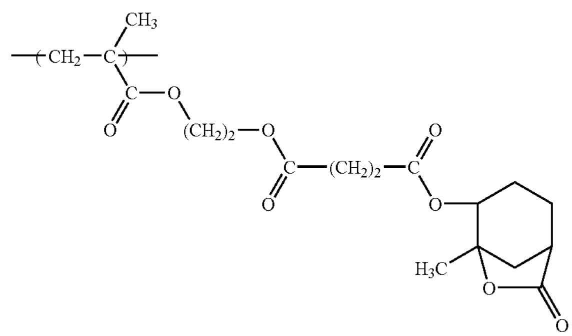
(I-42)
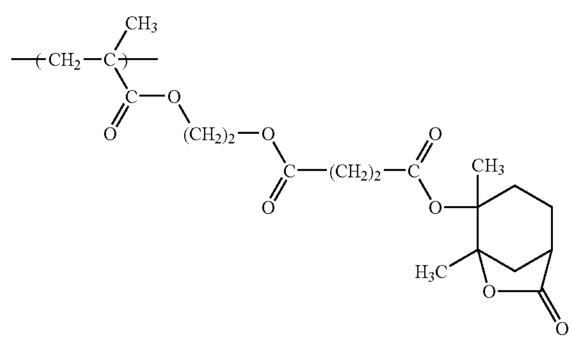
(I-43)
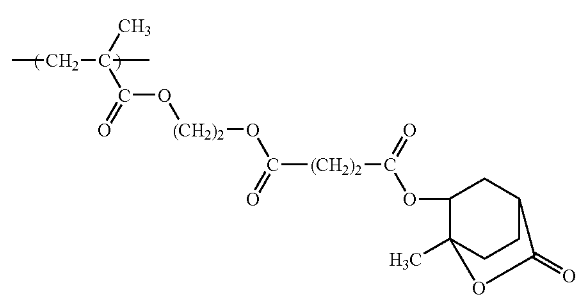

-continued (I-44)

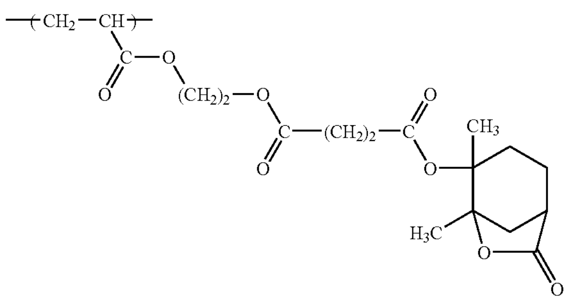

From the viewpoint of rendering the present effects more noticeable, it is advantageous for the resin of component (B) to further contain repeating units having alkali-soluble groups protected by at least one kind of groups selected from the groups containing alicyclic hydrocarbon structures represented by the foregoing formulae (pI) to (pVI).

The alkyl group represented by each of $R_{12}$ to $R_{25}$ in formula (pI) to (pVI) may be substituted or not, and includes $C_1$–$C_4$ straight-chain and branched alkyl groups, such as a methyl group, an ethyl group, an n-propyl group, an isopropyl group, an n-butyl group, an isobutyl group, a sec-butyl group and a t-butyl group.

Examples of a group by which the alkyl group as recited above can further be substituted include $C_1$–$C_4$ alkoxy groups, halogen atoms (namely fluorine, chlorine, bromine and iodine atoms), acyl groups, acyloxy groups, a cyano group, a hydroxyl group, a carboxyl group, alkoxycarbonyl groups and a nitro group.

The alicyclic hydrocarbon group represented by $R_{12}$ to $R_{25}$ each or formed by the combination of Z and the carbon atom may be monocyclic or polycyclic. Examples of such a cyclic group include groups having monocyclic, bicyclic, tricyclic and tetracyclic structures which each contain at least 5 carbon atoms. The suitable number of carbon atoms contained in such a cyclic structure is from 6 to 30, especially from 7 to 25. Each of those alicyclic hydrocarbon groups may have a substituent.

Examples of a structure of the alicyclic moiety contained in the group having an alicyclic hydrocarbon structure are illustrated below:

(1)

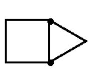

(2)

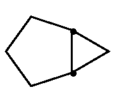

(3)

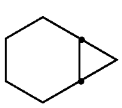

(4)

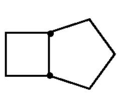

(5)

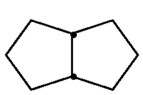

-continued (6)

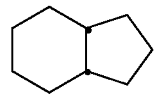

(7)

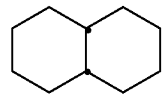

(8)

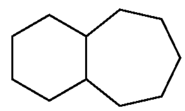

(9)

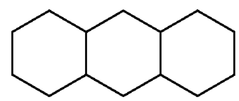

(10)

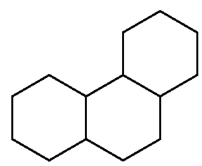

(11)

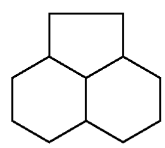

(12)

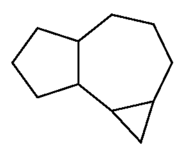

(13)

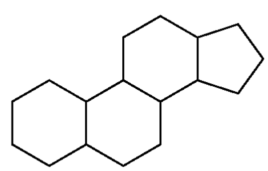

(14)

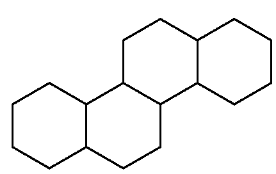

(15)

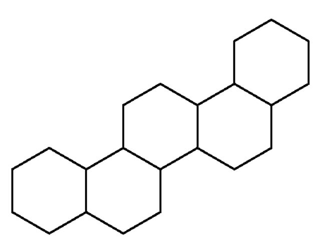

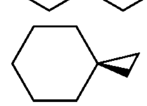

-continued
(17)
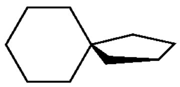
(18)
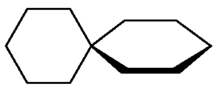
(19)
(20)
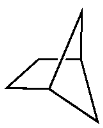
(21)
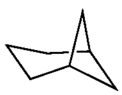
(22)
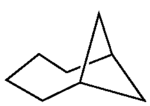
(23)
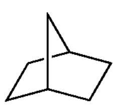
(24)
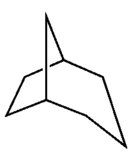
(25)
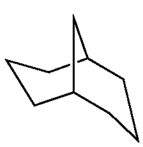
(26)
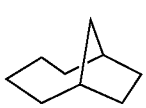
(27)
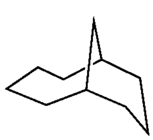
(28)
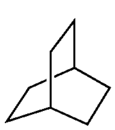
(29)
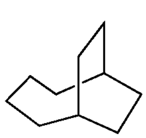
-continued
(30)
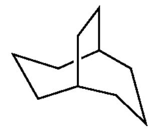
(31)
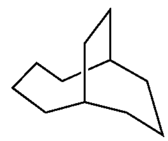
(32)
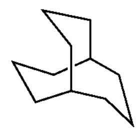
(33)
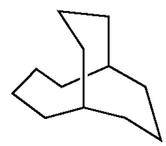
(34)
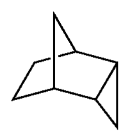
(35)
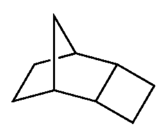
(36)
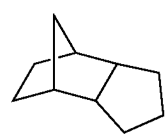
(37)
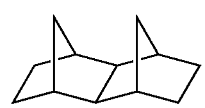
(38)
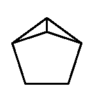
(39)
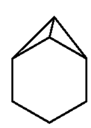
(40)
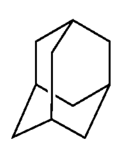
(41)
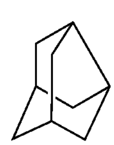

-continued (42)

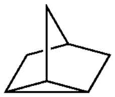

(43)

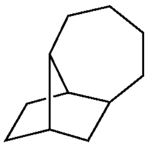

(44)

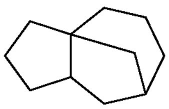

(45)

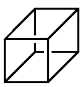

(46)

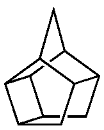

(47)

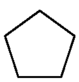

(48)

(49)

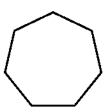

(50)

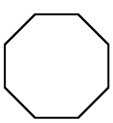

Among the alicyclic moieties as illustrated above, an adamantyl group, a noradamantyl group, a decaline residue, a tricyclodecyl group, a tetracyclododecyl group, a norbornyl group, a sedorol group, a cyclohexyl group, a cycloheptyl group, a cyclooctyl group, a cyclodecyl group and a cyclododecyl group are suitable ones in the invention. Among these groups, an adamantyl group, a decaline residue, a norbornyl group, a sedorol group, a cyclohexyl group, a cycloheptyl group, a cyclooctyl group, a cyclodecyl group and a cyclododecyl group are preferred over the others.

Examples of groups by which those alicyclic hydrocarbon groups maybe substituted include unsubstituted and substituted alkyl groups, cycloalkyl groups, alkenyl groups, acyl groups, halogen atoms, a hydroxyl group, alkoxy groups, a carboxyl group and alkoxycarbonyl groups. As the alkyl substituents, lower alkyl groups such as methyl, ethyl, propyl, isopropyl and butyl group are suitable. Among these lower alkyl groups, methyl, ethyl, propyl and isopropyl groups are preferable. Examples of substituents of the substituted alkyl groups include a hydroxyl group, halogen atoms and alkoxy groups. Examples of the alkoxy substituents (including alkoxy moieties of alkoxycarbonyl groups) include $C_1$–$C_4$ alkoxy groups, such as a methoxy group, an ethoxy group, a propoxy group and a butoxy group. Examples of the cycloalkyl substituents include a cyclopropyl group, a cyclopentyl group and a cyclohexyl group. Examples of the alkenyl substituents include $C_2$–$C_6$ alkenyl groups, such as a vinyl group, a propenyl group, an allyl group, a butenyl group, a pentenyl group and a hexenyl group. Examples of the acyl substituents include an acetyl group, an ethylcarbonyl group and a propylcarbonyl group. Examples of the halogen substituents include a chlorine atom, a bromine atom, an iodine atom and a fluorine atom.

Of the structures represented by formulae (pI) to (pVI), the structure represented by formula (pI) is preferred over the others, and the group represented by formula (II) is far preferred. Examples of an alkyl group represented by $R_{28}$ in formula (pI) and examples of a halogen atom, an alkyl group, a cycloalkyl group, an alkenyl group, an alkoxy group, an alkoxycarbonyl group and an acyl group $R_{29}$ to $R_{31}$ each can represent include the same ones as those recited in the case of the foregoing alicyclic hydrocarbon group.

Examples of alkali-soluble groups in the resin of Component (B), which can be protected by the structures represented by formulae (pI) to (pVI), include various groups known in this technical field.

Specifically, a carboxylic acid group, a sulfonic acid group, a phenol group and a thiol group, preferably carboxylic and sulfonic acid groups, are examples of the alkali-soluble group.

Suitable examples of alkali-soluble groups protected by the structures represented by formulae (pI) to (pVI) in the present resins include groups represented by the following formulae (pVII) to (pXI).

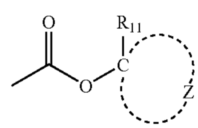

(pVII)

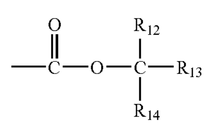

(pVIII)

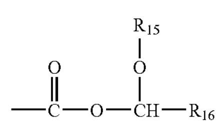

(pIX)

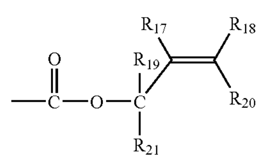

(pX)

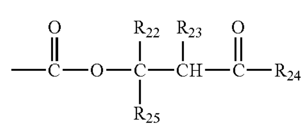

(pXI)

Herein, $R_{11}$ to $R_{25}$ and Z have the same meanings as hereinbefore defined respectively.

Of the repeating units which are contained in the resin of Component (B) and have alkali-soluble groups protected by structures represented by formulae (pI) to (pVI), repeating units represented by the following formula (pA) are preferred.

(pA)

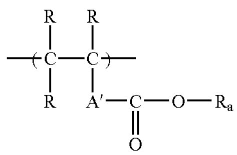

Herein, R each represents a hydrogen atom, a halogen atom, or a $C_1$–$C_4$ substituted or unsubstituted, straight-chain or branched alkyl group, and three R groups may be the same or different. Examples of a halogen atom and an alkyl group R can represent are the same ones as examples of R in formula (a) illustrated hereinafter include.

A' has the same meaning as mentioned above.

Ra represents any of the groups represented by formulae (pI) to (pVI).

Examples of a monomer corresponding to the repeating unit represented by formulae (pA) are illustrated below.

1

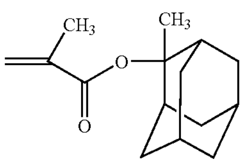

2

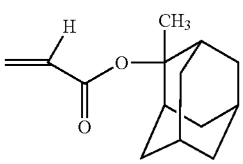

3

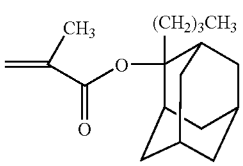

4

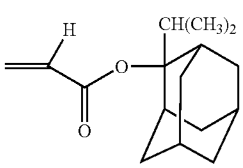

5

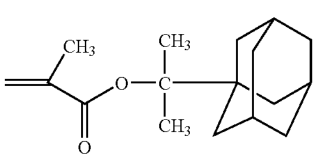

6

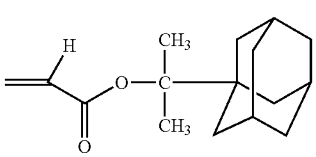

-continued

7

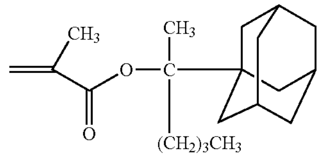

8

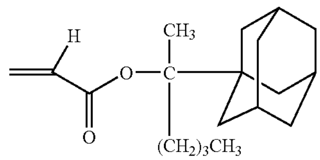

9

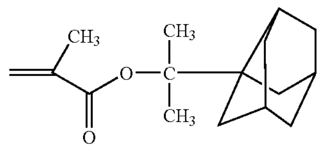

10

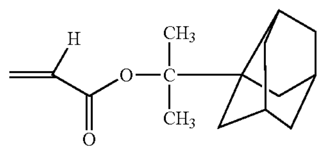

11

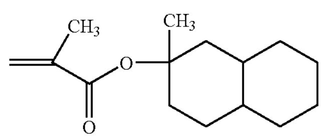

12

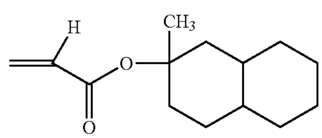

13

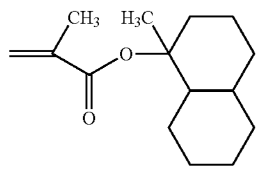

14

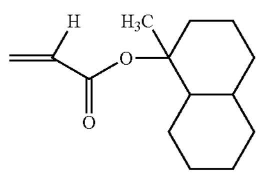

15

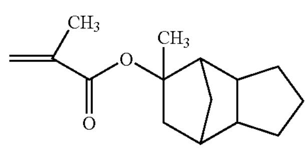

16

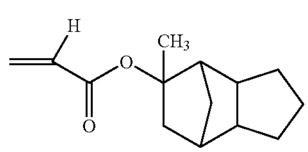

-continued
17
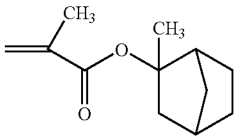
18
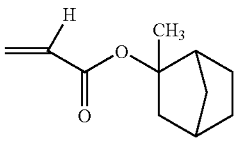
19
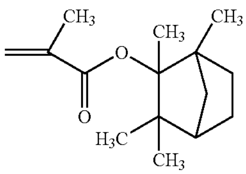
20
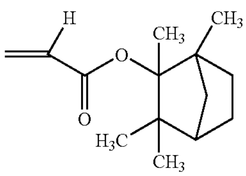
21
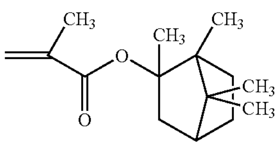
22
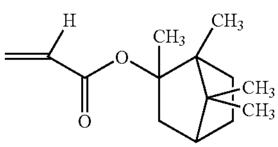
23
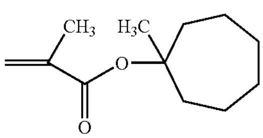
24
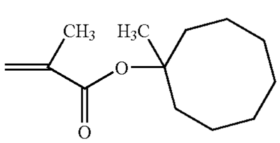
25
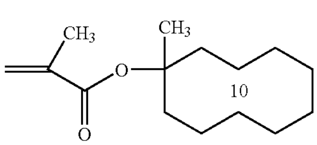
26
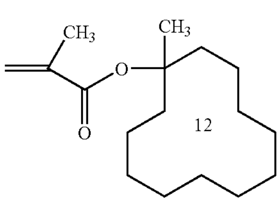
-continued
27
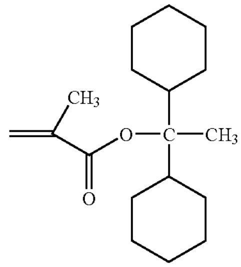
28
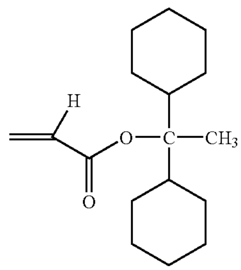
29
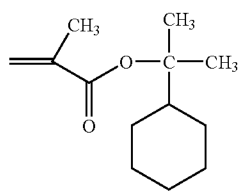
30
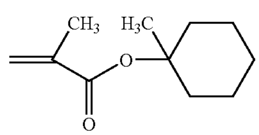
31
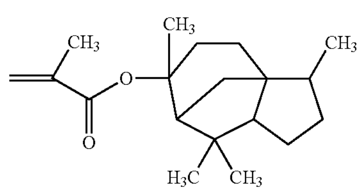
32
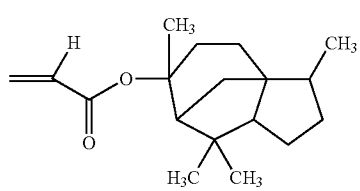
33
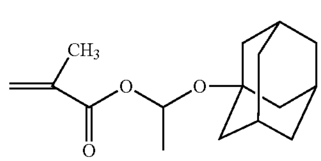
34
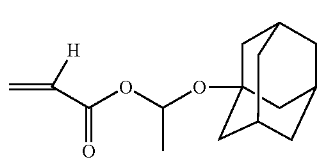

-continued

35

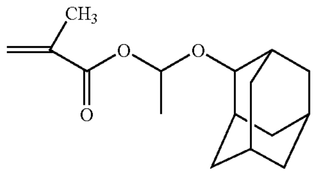

36

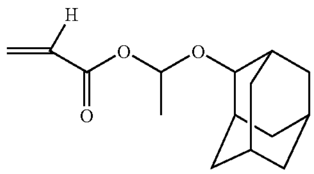

37

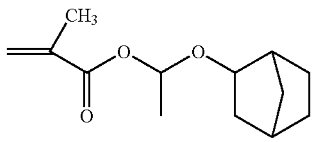

38

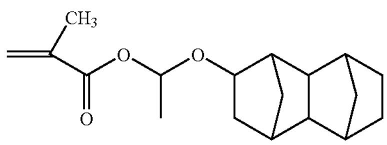

39

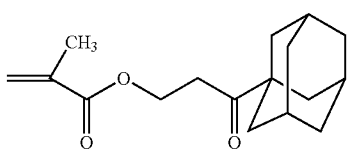

40

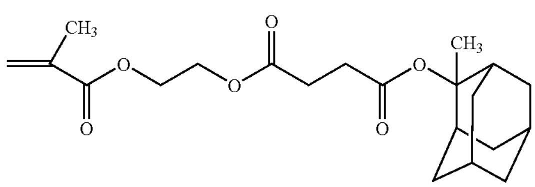

41

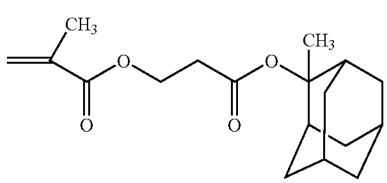

The resin of Component (B) in the invention may further contain other repeating units.

Of the other repeating units, the repeating units represented by the foregoing formula (a) are preferred as other constituents of the copolymer resin. By containing the repeating units of formula (a) in the resin, the developability and the adhesion to substrates are enhanced. Examples of a substituted or unsubstituted alkyl group represented by R in formula (a) include the same groups as included in examples of the alkyl group represented by $R_1$ in formulae (I-1) to (I-4). Examples of a halogen atom represented by R include a fluorine atom, a chlorine atom, a bromine atom and an iodine atom. At least one of $R_{32}$ to $R_{34}$ in formula (a) is a hydroxyl group. The suitable number of hydroxyl groups in formula (a) is 2 or 1, preferably 1.

Furthermore, it is advantageous for the resin of Component (B) to contain repeating units represented by the following formulae (III-a) to (III-d) as other constituents of the copolymer resin. By containing such repeating units, the resolution of contact hole patterns is improved.

(III-a)

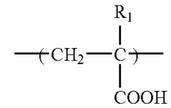

(III-b)

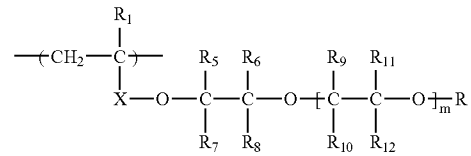

(III-c)

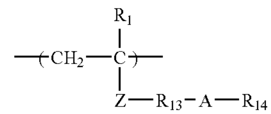

(III-d)

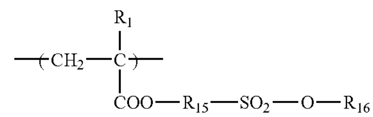

In the above formulae, $R_1$ has the same meaning as R in formula (a). $R_5$ to $R_{12}$ each represents a hydrogen atom or a substituted or unsubstituted alkyl group independently. R represents a hydrogen atom, or a substituted or unsubstituted alkyl, cycloalkyl, aryl or aralkyl group. m represents an integer of 1 to 10. X represents a single bond, or a divalent group that undergoes no decomposition under the action of acids and is selected solely from or is a combination of at least two groups selected from the class consisting of substituted and unsubstituted alkylene, cycloalkylene and arylene groups, an ether group, a thioether group, a carbonyl group, an ester group, an amido group, a sulfonamido group, an urethane group and an urea group.

Z represents a single bond, an ether group, an ester group, an amido group, an alkylene group, or a divalent group formed by combining two or more of these groups. $R_{13}$ represents a single bond, an alkylene group, an arylene group, or a divalent group formed by combining these groups. $R_{15}$ represents an alkylene group, an arylene group, or a divalent group formed by combining these groups. $R_{14}$ represents a substituted or unsubstituted alkyl, cycloalkyl, aryl or aralkyl group. $R_{16}$ represents a hydrogen atom, or a substituted or unsubstituted alkyl, cycloalkyl, alkenyl, aryl or aralkyl group.

A represents any of the functional groups illustrated below.

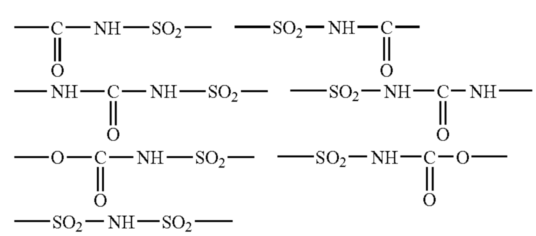

he alkyl groups represented by $R_5$ to $R_{12}$, R, $R_{14}$ and $R_{16}$ respectively are straight-chain or branched ones, and may have substituents. Suitable examples of such straight-chain and branched alkyl groups include $C_1$–$C_{12}$ straight-chain and branched alkyl groups, preferably $C_1$–$C_{10}$ straight-chain and branched alkyl groups, far preferably a methyl group, an ethyl group, a propyl group, an isopropyl group, an n-butyl group, an isobutyl group, a sec-butyl group, a t-butyl group, a pentyl group, a hexyl group, a heptyl group, an octyl group, a nonyl group and a decyl group.

Examples of cycloalkyl groups represented by R, $R_{14}$ and $R_{16}$ respectively include $C_3$–$C_{30}$ cycloalkyl groups, such as including a cyclopropyl group, a cyclopentyl group, a cyclohexyl group, an adamantyl group, a norbornyl group, a bornyl group, a tricyclodecyl group, a dicyclopentenyl group, a norbornane epoxy group, a menthyl group, an isomenthyl group, a neomenthyl group, a tetracyclododecyl group and a steroid residue.

Examples of aryl groups represented by R, $R_{14}$ and $R_{16}$ respectively include $C_6$–$C_{20}$ aryl groups which may have substituents, such as a phenyl group, a tolyl group and a naphthyl group.

Examples of aralkyl groups represented by R, $R_{14}$ and $R_{16}$ respectively include $C_7$–$C_{20}$ aralkyl groups, such as unsubstituted and substituted benzyl, phenetyl and cumyl groups. Examples of an alkenyl group represented by $R_{16}$ include $C_2$–$C_6$ alkenyl groups, such as a vinyl group, a propenyl group, an allyl group, a butenyl group, a pentenyl group, a hexenyl group, a cyclopentenyl group, a cyclohexenyl group, a 3-oxocyclohexenyl group, a 3-oxocyclopentenyl group and a 3-oxoindenyl group. Each of the cycloalkenyl groups recited above may contain an oxygen atom.

Examples of a linkage group X include divalent groups undergoing no decomposition under the action of acids, which are selected independently from or are combinations of at least two groups selected from the class consisting of substituted and unsubstituted alkylene, cycloalkylene and arylene groups, an ether group, a thioether group, a carbonyl group, an ester group, an amido group, a sulfonamido group, an urethane group and an urea group.

Z represents a single bond, an ether group, an ester group, an amido group, an alkylene group, or a divalent group formed by combining two or more of these groups. $R_{13}$ represents a single bond, an alkylene group, an arylene group, or a divalent group formed by combining these groups. $R_{15}$ represents an alkylene group, an arylene group, or a divalent group formed by combining these groups.

Examples of arylene groups represented by X, $R_{13}$ and $R_{15}$ respectively include $C_6$–$C_{10}$arylene groups, which may have substituents. Specifically, such alkylene groups include a phenylene group, a tolylene group and a naphthylene group.

Examples of a cycloalkylene group represented by X include divalent groups derived from the cycloalkyl groups as recited above.

Examples of alkylene groups represented by X, Z, $R_{13}$ and $R_{15}$ respectively include groups represented by the following formula:

$$—[C(Ra)(Rb)]r1—$$

wherein Ra, Rb and r1 have the same meanings as in descriptions of formula (AI) respectively.

Examples of the linkage group X are illustrated below, but these examples should not be construed as limiting the scope of the invention.

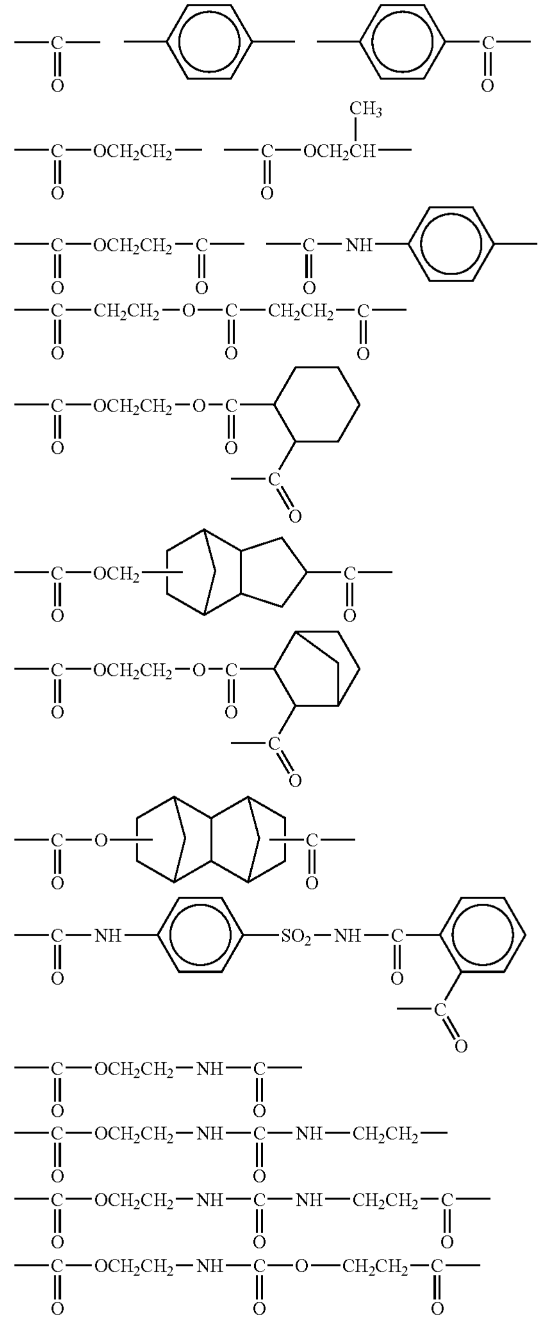

Examples of a substituent the alkyl, cycloalkyl, alkenyl, aryl, aralkyl, alkylene, cycloalkylene and arylene groups each may have include a carboxyl group, an acyloxy group, a cyano group, an unsubstituted alkyl, group, a substituted alkyl group, a halogen atom, a hydroxyl group, an alkoxy group, an acetylamido group, an alkoxycarbonyl group and an acyl group. Examples of the alkyl group mentioned above include lower alkyl groups, such as a methyl group, an ethyl group, a propyl group, an isopropyl group, a butyl group, a cyclopropyl group, a cyclobutyl group and a cyclopentyl group. Examples of a substituent of the substituted alkyl group include a hydroxyl group, a halogen atom and an alkoxy group. Examples of the alkoxy group include $C_1$–$C_4$ alkoxy groups, such as a methoxy group, an ethoxy group, a propoxy group and a butoxy group. An example of the acyloxy group is an acetoxy group. Examples of the halogen atom include a chlorine atom, a bromine atom, a fluorine atom and an iodine atom.

In reciting examples of a side-chain structure in formula (III-b), examples of a terminal structure corresponding to the side chain from which X is removed are illustrated below, but these examples should not be construed as limiting the scope of the invention.

$—O—CH_2CH_2—O—CH_2CH_2—OH$ $—O—CH_2CH_2—O—CH_2CH_2—O—CH_3$ $—O—CH_2CH_2—O—CH_2CH_2—O—CH_2CH_3$ $—O—CH_2CH_2—O—CH_2CH_2—O—CH_2CH_2—OH$ $—O—CH_2CH_2—O—CH_2CH_2—O—CH_2CH_2—O—CH_3$ $—O—CH_2CH_2—O—CH_2CH_2—O—CH_2CH_2—O—CH_2CH_3$ $—O—CH_2CH(CH_3)—O—CH_2CH(CH_3)—O—CH_3$ $—O—CH(CH_3)CH_2—O—CH(CH_3)CH_2—O—CH_3$ $—O—CH_2CH(CH_3)—O—CH_2CH(CH_3)—O—CH_2CH(CH_3)—O—CH_3$ $—O—CH_2CH_2—(O—CH_2CH_2)_3—O—CH_3$ $—O—CH_2CH_2—(O—CH_2CH_2)_4—O—CH_3$

Examples of a monomer corresponding to a repeating unit represented by formula (III-c) are illustrated below. However, these examples should not be construed as limiting the scope of the invention.

(1)

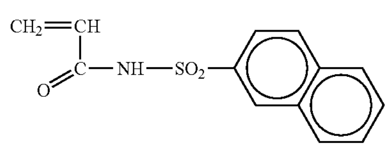

(2)

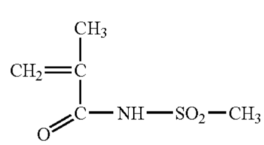

(3)

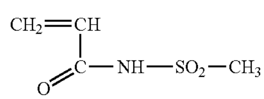

(4)

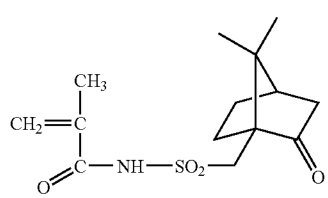

-continued (5)

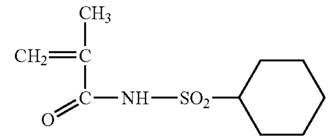

(6)

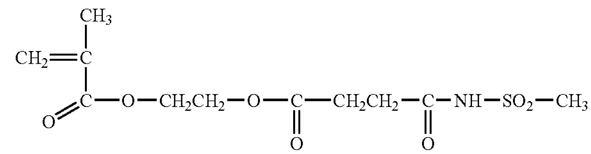

(7)

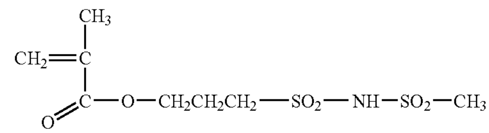

(8)

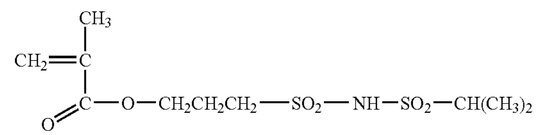

(9)

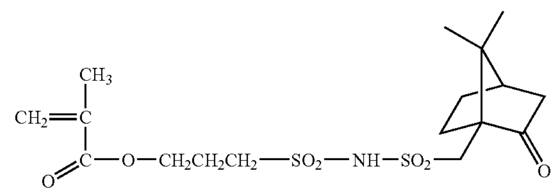

(10)

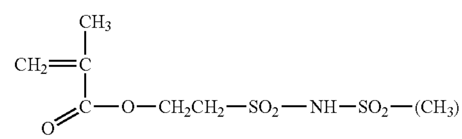

(11)

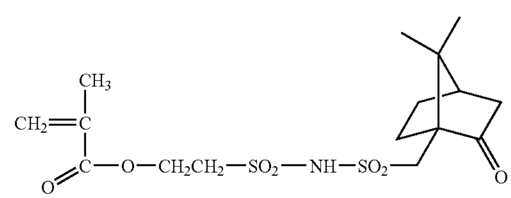

(12)

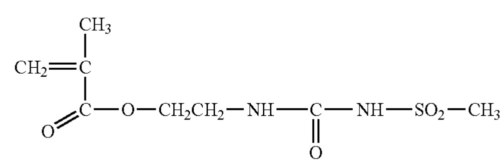

(13)

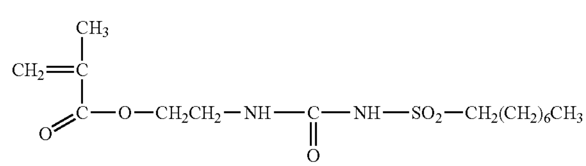

-continued
(14)
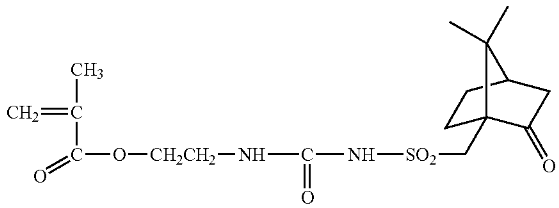
(15)
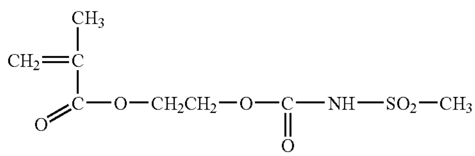
(16)
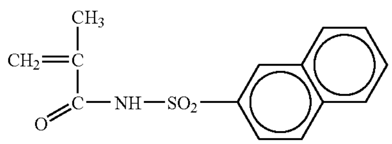
(17)
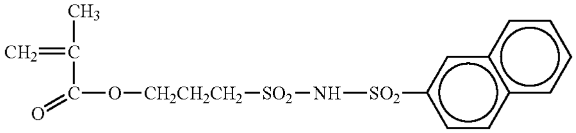
Examples of a monomer corresponding to a repeating unit represented by formula (III-d) are illustrated below. However, these examples should not be construed as limiting the scope of the invention.
(1)
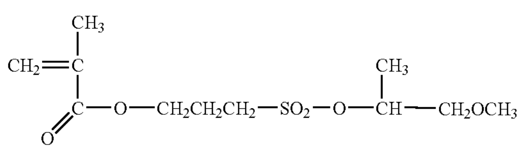
(2)
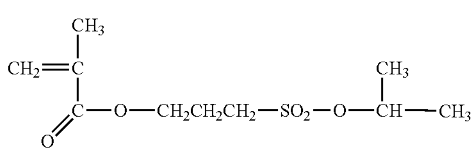
(3)
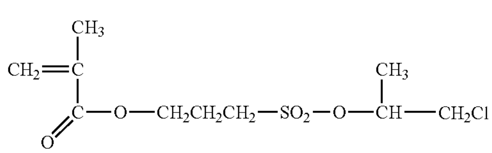
(4)
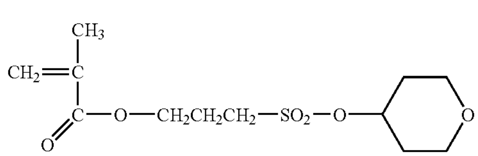
-continued
(5)
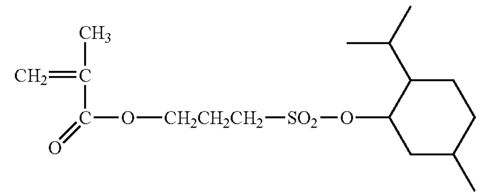
(6)
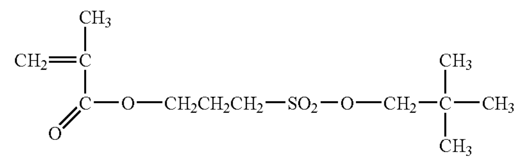
(7)
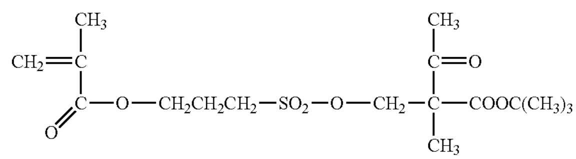
(8)
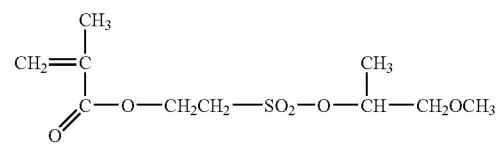
(9)
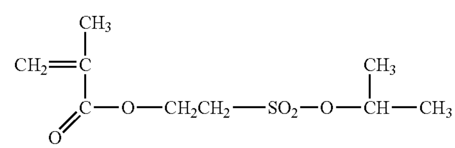
(10)
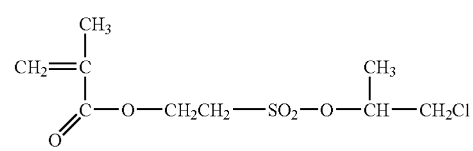
(11)
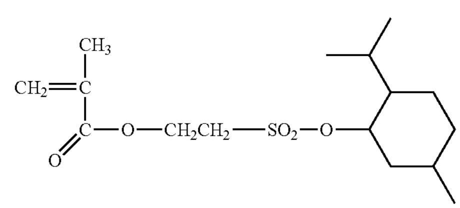
(12)
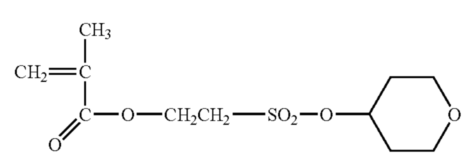
(13)
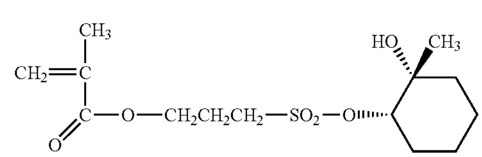

-continued (14)

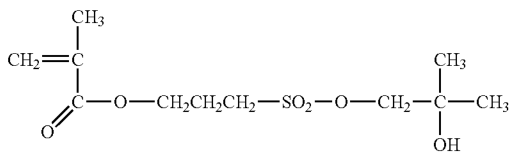

(15)

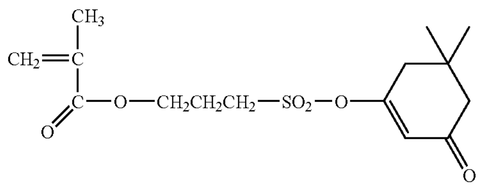

(16)

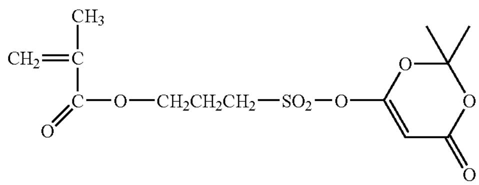

(17)

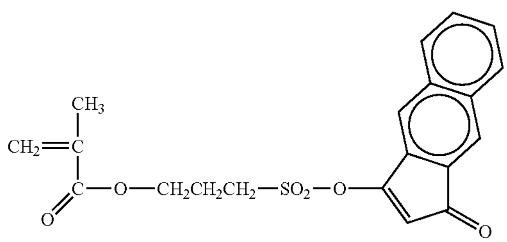

(18)

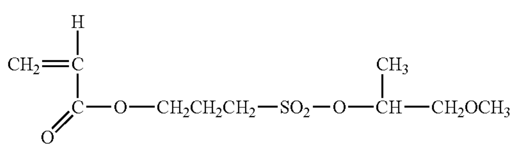

(19)

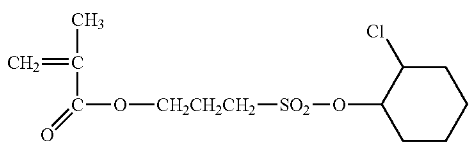

In formula (III-b), each of $R_5$ to $R_{12}$ is preferably a hydrogen atom or a methyl group. R is preferably a hydrogen atom or a $C_1$–$C_4$ alkyl group. m is preferably from 1 to 6.

In formula (III-c), $R_{13}$ is preferably a single bond or an alkylene group, such as a methylene group, an ethylene group, a propylene group or a butylene group. $R_{14}$ is preferably a $C_1$–$C_{10}$ alkyl group, such as a methyl or ethyl group, a cycloalkyl group, such as a cyclopropyl group, a cyclohexyl group or a camphor reside, a naphthyl group or a naphthylmethyl group. Z is preferably a single bond, an ether linkage, an ester linkage, a 1–6C alkylene group, or a combination of two or more thereof, and far preferably a single bond or an ester linkage.

In formula (III-d), $R_{15}$ is preferably a $C_1$–$C_4$ alkylene group. And $R_{16}$ is preferably an unsubstituted or substituted $C_1$–$C_8$ alkyl group (e.g., methyl, ethyl, propyl, isopropyl, butyl, neopentyl, octyl), a cyclohexyl group, an adamantyl group, a norbornyl group, a bornyl group, an isobornyl group, a menthyl group, a morpholino group, a 4-oxocyclohexyl group, an unsubstituted or substituted phenyl, toluyl, mesityl or naphthyl group, or an unsubstituted or substituted camphor residue. Examples of substituents those groups can have include halogen atoms, such as fluorine, and $C_1$–$C_4$ alkoxy groups.

Of the repeating units represented by formulae (III-a) to (III-d) respectively in the invention, the repeating units represented by formulae (III-b) and (III-d) respectively are preferred over the others.

In the invention, it is required for the resin of component (B) to contain repeating units having groups represented by formula (XA) in addition to the repeating units having groups represented by any of formulae (I-1) to (I-4).

Examples of an alkyl group represented by each of R1b and R2b in formula (XA) include $C_1$–$C_4$ alkyl groups, such as a methyl group, an ethyl group, an n-propyl group, an isopropyl group, an n-butyl group, an isobutyl group, a sec-butyl group and a t-butyl group.

R3b and R4b, which may be the same or different, independently represent a hydrogen atom, or a straight-chain, branched or cyclic alkyl group which may have a substituent.

Suitable examples of such a straight-chain alkyl group include those containing 1 to 30, preferably 1 to 20, carbon atoms, such as a methyl group, an ethyl group, an n-propyl group, an n-butyl group, an n-pentyl group, an n-hexyl group, an n-heptyl group, an n-octyl group, an n-nonyl group and an n-decyl group.

Suitable examples of such a branched alkyl group include those containing 1 to 30, preferably 1 to 20, carbon atoms, such as an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group and a t-decyl group.

Suitable examples of such a cyclic alkyl group include those containing 3 to 30, preferably 3 to 20, carbon atoms, such as a cyclopropyl group, a cyclobutyl group, a cyclopentyl group, a cyclohexyl group, a cycloheptyl group, a cyclooctyl group, a cyclononyl group and a cyclodecyl group.

R5b represents an unsubstituted or substituted, straight-chain, branched or cyclic alkyl group, an unsubstituted or substituted aryl group, or an unsubstituted or substituted aralkyl group.

Suitable examples of a straight-chain or branched alkyl group represented by R5b include those containing 1 to 30, preferably 1 to 20, carbon atoms, such as a methyl group, an ethyl group, an n-propyl group, an i-propyl group, an n-butyl group, an i-butyl group, a t-butyl group, an n-pentyl group, an i-pentyl group, a t-pentyl group, an n-hexyl group, an i-hexyl group, a t-hexyl group, an n-heptyl group, an i-heptyl group, a t-heptyl group, an n-octyl group, an i-octyl group, a t-octyl group, an n-nonyl group, an i-nonyl group, a t-nonyl group, an n-decyl group, an i-decyl group, a t-decyl group, an n-undecyl group, an i-undecyl group, an n-dodecyl group, an i-dodecyl group, an n-tridecyl group, an i-tridecyl group, an n-detradecyl group, an i-tetradecyl group, an n-pentadecyl group, an i-pentadecyl group, an n-hexadecyl group, an i-hexadecyl group, an n-heptadecyl group, an i-heptadecyl group, an n-octadecyl group, an i-octadecyl group, an n-nonadecyl group and an i-nonadecyl group.

Suitable examples of a cyclic alkyl group represented by R5b include cycloalkyl groups which each contain 3 to 30, preferably 3 to 20, carbon atoms and may have a substituent even when the number of carbon atoms constituting the cyclic structure is up to 20. More specifically, these cycloalkyl groups include a cyclopropyl group, a cyclobutyl group, a cyclopentyl group, a cyclohexyl group, a cycloheptyl group, a cyclooctyl group, a cyclononyl group, a cyclodecyl group, a cycloundecyl group, a cyclododecyl group, a cyclotridecyl group, a cyclotetradecyl group, a cyclopentadecyl group, a cyclohexadecyl group, a cycloheptadecyl group, a cyclooctadecyl group, a cyclononadecyl group, a 4-cyclohexylcyclohexyl group, a 4-n-hexylcyclohexyl group, a pentanylcyclohexyl group, a hexyloxycyclohexyl group and a pentanyloxycyclohexyl group. Therein, substituted cycloalkyl groups other than those recited above can also be included as far as they are within the range mentioned above.

Suitable examples of an aryl group represented by R5b include those containing 6 to 30, preferably 6 to 20, carbon atoms, such as a phenyl group, a 4-methylphenyl group, a 3-methylphenyl group, a 2-methylphenyl group, a 4-ethylphenyl group, a 3-ethylphenyl group, a 2-ethylphenyl group, a 4-n-propylphenyl group, a 3-n-propylphenyl group, a 2-n-propylphenyl group, a 4-i-propylphenyl group, a 3-i-propylphenyl group, a 2-i-propylphenyl group, a 4-cyclopropylphenyl group, a 3-cyclopropylphenyl group, a 2-cyclopropylphenyl group, a 4-n-butylphenyl group, a 3-n-butylphenyl group, a 2-n-butylphenyl group, a 4-i-butylphenyl group, a 3-i-butylphenyl group, a 2-i-butylphenyl group, a 4-t-butylphenyl group, a 3-t-butylphenyl group, a 2-t-butylphenyl group, a 4-cyclobutylphenyl group, a 3-cyclobutylphenyl group, a 2-cyclobutylphenyl group, a 4-cyclopentylphenyl group, a 4-cyclohexylphenyl group, a 4-cycloheptenylphenyl group, a 4-cyclooctylphenyl group, a 2-cyclopentylphenyl group, a 2-cyclohexylphenyl group, a 2-cycloheptenylphenyl group, a 2-cyclooctylphenyl group, a 3-cyclopentylphenyl group, a 3-cyclohexylphenyl group, a 3-cycloheptenylphenyl group, a 3-cyclooctylphenyl group, a 4-cyclopentyloxyphenyl group, a 4-cyclohexyloxyphenyl group, a 4-cycloheptenyloxyphenyl group, a 4-cyclooctyloxyphenyl group, a 2-cyclopentyloxyphenyl group, a 2-cyclohexyloxyphenyl group, a 2-cycloheptenyloxyphenyl group, a 2-cyclooctyloxyphenyl group, a 3-cyclopentyloxyphenyl group, a 3-cyclohexyloxyphenyl group, a 3-cycloheptenyloxyphenyl group, a 3-cyclooctyloxyphenyl group, a 4-n-pentylphenyl group, a 4-n-hexylphenyl group, a 4-n-heptenylphenyl group, a 4-n-octylphenyl group, a 2-n-pentylphenyl group, a 2-n-hexylphenyl group, a 2-n-heptenylphenyl group, a 2-n-octylphenyl group, a 3-n-pentylphenyl group, a 3-n-hexylphenyl group, a 3-n-heptenylphenyl group, a 3-n-octylphenyl group, a 2,6-di-isopropylphenyl group, a 2,3-di-isopropylphenylgroup, a 2,4-di-isopropylphenyl group, a 3,4-di-isopropylphenyl group, a 2,6-di-t-butylphenyl group, a 2,3-di-t-butylphenyl group, a 2,4-di-t-butylphenyl group, a 3,4-di-t-butylphenyl group, a 2,6-di-n-butylphenyl group, a 2,3-di-n-butylphenyl group, a 2,4-di-n-butylphenyl group, a 3,4-di-n-butylphenyl group, a 2,6-di-i-butylphenyl group, a 2,3-di-i-butylphenyl group, a 2,4-di-i-butylphenyl group, a 3,4-di-i-butylphenyl group, a 2,6-di-t-amylphenyl group, a 2,3-di-t-amylphenyl group, a 2,4-di-t-amylphenyl group, a 3,4-di-t-amylphenyl group, a 2,6-di-i-amylphenyl group, a 2,3-di-i-amylphenyl group, a 2,4-di-i-amylphenyl group, a 3,4-di-i-amylphenyl group, a 2,6-di-n-pentylphenyl group, a 2,3-di-n-pentylphenyl group, a 2,4-di-n-pentylphenyl group, a 3,4-di-n-pentylphenyl group, a 4-adamantylphenyl group, a 2-adamantylphenyl group, a 4-isobornylphenyl group, a 3-isobornylphenyl group, a 2-isobornylphenyl group, a 4-cyclopentyloxyphenyl group, a 4-cyclohexyloxyphenyl group, a 4-cycloheptenyloxyphenyl group, a 4-cyclooctyloxyphenyl group, a 2-cyclopentyloxyphenyl group, a 2-cyclohexyloxyphenyl group, a 2-cycloheptenyloxyphenyl group, a 2-cyclooctyloxyphenyl group, a 3-cyclopentyloxyphenyl group, a 3-cyclohexyloxyphenyl group, a 3-cycloheptenyloxyphenyl group, a 3-cyclooctyloxyphenyl group, a 4-n-pentyloxyphenyl group, a 4-n-hexyloxyphenyl group, a 4-n-heptenyloxyphenyl group, a 4-n-octyloxyphenyl group, a 2-n-pentyloxyphenyl group, a 2-n-hexyloxyphenyl group, a 2-n-heptenyloxyphenyl group, a 2-n-octyloxyphenyl group, a 3-n-pentyloxyphenyl group, a 3-n-hexyloxyphenyl group, a 3-n-heptenyloxyphenyl group, a 3-n-octyloxyphenyl group, a 2,6-di-isopropyloxyphenyl group, a 2,3-di-isopropyloxyphenyl group, a 2,4-di-isopropyloxyphenyl group, a 3,4-di-isopropyloxyphenyl group, a 2,6-di-t-butyloxyphenyl group, a 2,3-di-t-butyloxyphenyl group, a 2,4-di-t-butyloxyphenyl group, a 3,4-di-t-butyloxyphenyl group, a 2,6-di-n-butyloxyphenyl group, a 2,3-di-n-butyloxyphenyl group, a 2,4-di-n-butyloxyphenyl group, a 3,4-di-n-butyloxyphenyl group, a 2,6-di-i-butyloxyphenyl group, a 2,3-di-i-butyloxyphenyl group, a 2,4-di-i-butyloxyphenyl group, a 3,4-di-i-butyloxyphenyl group, a 2,6-di-t-amyloxyphenyl group, a 2,3-di-t-amyloxyphenyl group, a 2,4-di-t-amyloxyphenyl group, a 3,4-di-t-amyloxyphenyl group, a 2,6-di-i-amyloxyphenyl group, a 2,3-di-i-amyloxyphenyl group, a 2,4-di-i-amyloxyphenyl group, a 3,4-di-i-amyloxyphenyl group, a 2,6-di-n-pentyloxyphenyl group, a 2,3-di-n-pentyloxyphenyl group, a 2,4-di-n-pentyloxyphenyl group, a 3,4-di-n-pentyloxyphenyl group, a 4-adamantyloxyphenyl group, a 3-adamantyloxyphenyl group, a 2-adamantyloxyphenyl group, a 4-isobornyloxyphenyl group, a 3-isobornyloxyphenyl group and a 2-isobornyloxyphenyl group. These groups each may further have a substituent as far as the total number of carbon atoms contained therein is within the range mentioned above. The substituents the aryl groups recited above may further have are not limited to groups other than the substituents contained in the aryl groups recited above.

Suitable examples of an aralkyl group represented by R5b include those containing 7 to 30, preferably 7 to 20, carbon atoms, such as a phenylethyl group, a 4-methylphenylethyl group, a 3-methylphenylethyl group, a 2-methylphenylethyl group, a 4-ethylphenylethyl group, a 3-ethylphenylethyl group, a 2-ethylphenylethyl group, a 4-n-propylphenylethyl group, a 3-n-propylphenylethyl group, a 2-n-propylphenylethyl group, a 4-i-propylphenylethyl group, a 3-i-propylphenylethyl group, a 2-i-propylphenylethyl group, a 4-cyclopropylphenylethyl group, a 3-cyclopropylphenylethyl group, a 2-cyclopropylphenylethyl group, a 4-n-butylphenylethyl group, a 3-n-butylphenylethyl group, a 2-n-butylphenylethyl group, a 4-i-butylphenylethyl group, a 3-i-butylphenylethyl group, a 2-i-butylphenylethyl group, a 4-t-butylphenylethyl group, a 3-t-butylphenylethyl group, a 2-t-butylphenylethyl group, a 4-cyclobutylphenylethyl group, a 3-cyclobutylphenylethyl group, a 2-cyclobutylphenylethyl group, a 4-cyclopentylphenylethyl group, a 4-cyclohexylphenylethyl group, a 4-cycloheptenylphenylethyl group, a 4-cyclooctylphenylethyl group, a 2-cyclopentylphenylethyl group, a 2-cyclohexylphenylethyl group, a 2-cycloheptenylphenylethyl group, a 2-cyclooctylphenylethyl group, a 3-cyclopentylphenylethyl group, a 3-cyclohexylphenylethyl group, a 3-cycloheptenylphenylethyl group, a 3-cyclo-octylphenylethyl group, a 4-cyclopentyloxyphenylethyl group, a 4-cyclohexyloxyphenylethyl group, a 4-cycloheptenyloxy-phenylethyl group, a 4-cyclooctyloxyphenylethyl group, a 2-cyclopentyloxyphenylethyl group, a 2-cyclohexyloxy-phenylethyl group, a 2-cycloheptenyloxyphenylethyl group, a 2-cyclooctyloxyphenylethyl group, a 3-cyclopentyloxy-phenylethyl group, a 3-cyclohexyloxyphenylethyl group, a 3-cycloheptenyloxyphenylethyl group, a 3-cyclooctyloxy-phenylethyl group, a 4-n-pentylphenylethyl group, a 4-n-hexylphenylethyl group, a 4-n-heptenylphenylethyl group, a 4-n-octylphenylethyl group, a 2-n-pentylphenylethyl group, a 2-n-hexylphenylethyl group, a 2-n-heptenylphenylethyl group, a 2-n-octylphenylethyl group, a 3-n-pentylphenylethyl group, a 3-n-hexylphenylethyl group, a 3-n-heptenylphenylethyl group, a 3-n-octylphenylethyl group, a 2,6-di-isopropylphenylethyl group, a 2,3-di-isopropylphenylethyl group, a 2,4-di-isopropylphenylethyl group, a 3,4-di-isopropylphenylethyl group, a 2,6-di-t-butylphenylethyl group, a 2,3-di-t-butylphenylethyl group, a 2,4-di-t-butylphenylethyl group, a 3,4-di-t-butylphenylethyl group, a 2,6-di-n-butylphenylethyl group, a 2,3-di-n-butylphenylethyl group, a 2,4-di-n-butylphenylethyl group, a 3,4-di-n-butylphenylethyl group, a 2,6-di-i-butylphenylethyl group, a 2,3-di-i-butylphenylethyl group, a 2,4-di-i-butylphenylethyl group, a 3,4-di-i-butylphenylethyl group, a 2,6-di-t-amylphenylethyl group, a 2,3-di-t-amylphenylethyl group, a 2,4-di-t-amylphenylethyl group, a 3,4-di-t-amylphenylethyl group, a 2,6-di-i-amylphenylethyl group, a 2,3-di-i-amylphenylethyl group, a 2,4-di-i-amylphenylethyl group, a 3,4-di-i-amylphenylethyl group, a 2,6-di-n-pentylphenylethyl group, a 2,3-di-n-pentylphenylethyl group, a 2,4-di-n-pentylphenylethyl group, a 3,4-di-n-pentylphenylethyl group, a 4-adamantylphenylethyl group, a 2-adamantylphenylethyl group, a 4-isobornylphenylethyl group, a 3-isobornylphenylethyl group, a 2-isobornylphenylethyl group, a 4-cyclopentyloxyphenylethyl group, a 4-cyclohexyloxyphenylethyl group, a 4-cycloheptenyloxyphenylethyl group, a 4-cyclooctyloxyphenylethyl group, a 2-cyclopentyloxyphenylethyl group, a 2-cyclohexyloxyphenylethyl group, a 2-cycloheptenyloxyphenylethyl group, a 2-cyclooctyloxyphenylethyl group, a 3-cyclopentyloxyphenylethyl group, a 3-cyclohexyloxyphenylethyl group, a 3-cycloheptenyloxyphenylethyl group, a 3-cyclooctyloxyphenylethyl group, a 4-n-pentyloxyphenylethyl group, a 4-n-hexyloxyphenylethyl group, a 4-n-heptenyloxyphenylethyl group, a 4-n-octyloxyphenylethyl group, a 2-n-pentyloxyphenylethyl group, a 2-n-hexyloxyphenylethyl group, a 2-n-heptenyloxyphenylethyl group, a 2-n-octyloxyphenylethyl group, a 3-n-pentyloxyphenylethyl group, a 3-n-hexyloxyphenylethyl group, a 3-n-heptenyloxyphenylethyl group, a 3-n-octyloxyphenylethyl group, a 2,6-di-isopropyloxy-phenylethyl group, a 2,3-di-isopropyloxyphenylethyl group, a 2,4-di-isopropyloxyphenylethyl group, a 3,4-di-isopropyloxyphenylethyl group, a 2,6-di-t-butyloxy-phenylethyl group, a 2,3-di-t-butyloxyphenylethyl group, a 2,4-di-t-butyloxyphenylethyl group, a 3,4-di-t-butyloxyphenylethyl group, a 2,6-di-n-butyloxyphenylethyl group, a 2,3-di-n-butyloxyphenylethyl group, a 2,4-di-n-butyloxyphenylethyl group, a 3,4-di-n-butyloxyphenylethyl group, a 2,6-di-i-butyloxyphenylethyl group, a 2,3-di-i-butyloxyphenylethyl group, a 2,4-di-i-butyloxyphenylethyl group, a 3,4-di-i-butyloxyphenylethyl group, a 2,6-di-t-amyloxyphenylethyl group, a 2,3-di-t-amyloxyphenylethyl group, a 2,4-di-t-amyloxyphenylethyl group, a 3,4-di-t-amyloxyphenylethyl group, a 2,6-di-i-amyloxyphenylethyl group, a 2,3-di-i-amyloxyphenylethyl group, a 2,4-di-i-amyloxyphenylethyl group, a 3,4-di-i-amyloxyphenylethyl group, a 2,6-di-n-pentyloxyphenylethyl group, a 2,3-di-n-pentyloxyphenylethyl group, a 2,4-di-n-pentyloxyphenylethyl group, a 3,4-di-n-pentyloxyphenylethyl group, a 4-adamantyloxyphenylethyl group, a 3-adamantyloxyphenylethyl group, a 2-adamantyloxyphenylethyl group, a 4-isobornyloxyphenylethyl group, a 3-isobornyloxyphenylethyl group, a 2-isobornyloxyphenylethyl group, and the same aralkyl groups as recited herein, except that the alkyl moiety thereof is replaced by methyl, propyl or butyl group.

Examples of substituents the aralkyl groups recited above may further have include a hydroxyl group, halogen atoms (such as fluorine, chlorine, bromine and iodine atoms), a nitro group, a cyano group, the alkyl groups as recited above, alkoxy groups (such as a methoxy group, an ethoxy group, a hydroxyethoxy group, a propoxy group, a hydroxypropoxy group, an n-butoxy group, an isobutoxy group, a sec-butoxy group and a t-butoxy group), alkoxycarbonyl groups (such as a methoxycarbonyl group and an ethoxycarbonyl group), aralkyl groups (such as a benzyl group, a phenetyl group and a cumyl group), aralkyloxy groups, acyl groups (such as a formyl group, an acetyl group, a butyryl group, a benzoyl group, a cinnamoyl group and a varleryl group), acyloxy groups (such as a butyryloxy group), alkenyl groups as recited above, alkenyloxy groups (such as a vinyloxy group, a propenyloxy group, an allyloxy group and a butenyloxy group), the aryl groups as recited above, aryloxy groups (such as a phenoxy group) and aryloxycarbonyl groups (such as a benzoyloxy group).

The subsituent of R5b is preferably a $C_1$–$C_{20}$ alkyl group, a $C_6$–$C_{20}$ aryl group or a $C_7$–$C_{20}$ aralkyl group. These groups each may further have a substituent.

Examples of a group represented by formula (XA) are illustrated below. However, these examples should not be construed as limiting the scope of the invention.

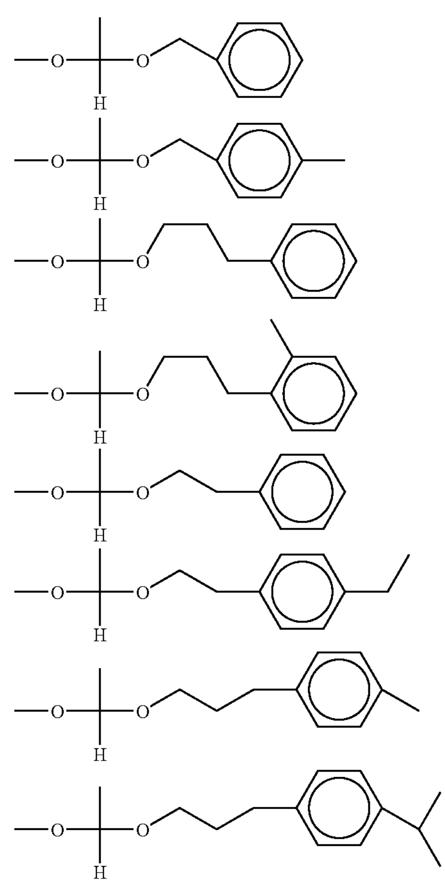

-continued

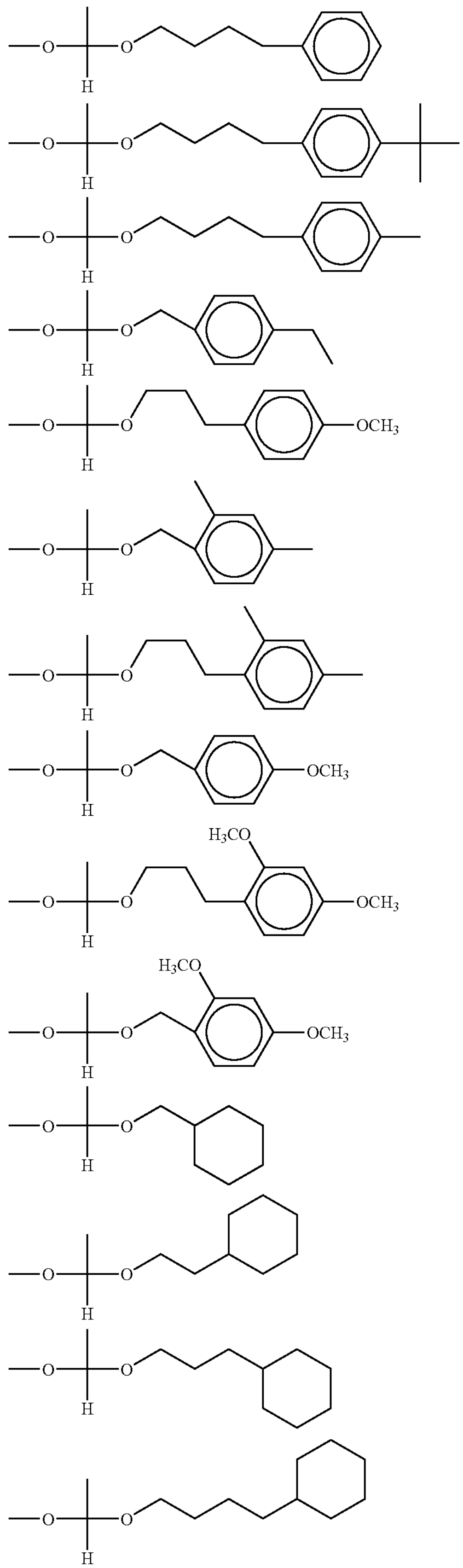

-continued

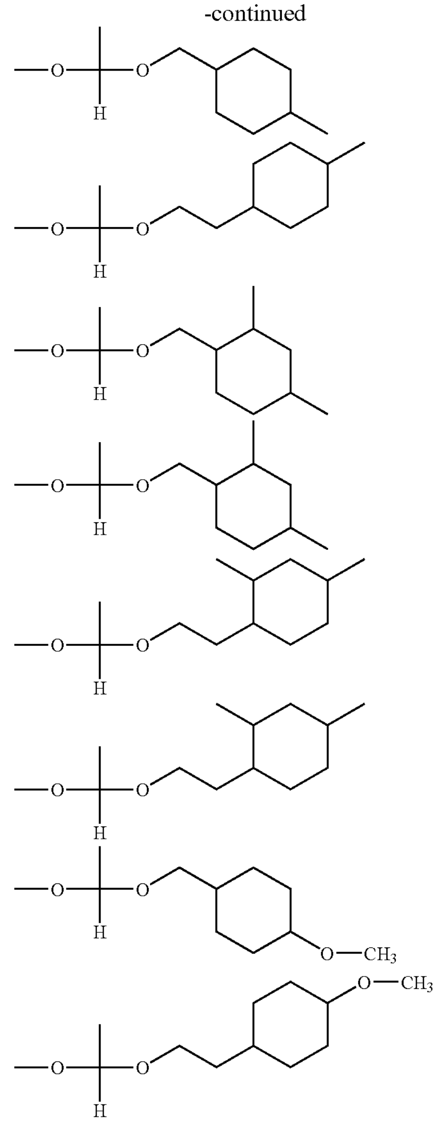

The present resin containing groups represented by formula (XA) and decomposing under the action of acids to increase the solubility in an alkali developer (hereafter referred to as the resin containing groups represented by formula (XA), too) is a compound which is prepared by polymerizing monomers, has a molecular weight distribution and a structure characterized by introduction of acid-decomposable groups represented by formula (XA), and is rendered alkali-soluble by the action of acids.

The resin having groups represented by formula (XA) is a resin containing groups represented by formula (XA) in the main chain, side chains, or both main and side chains. The groups represented by formula (XA) are preferably present in side chains of the resin.

In the case of binding the groups represented by formula (XA) as side chains, the mother resin used is an alkali-soluble resin containing —OH or —COOH groups, preferably —$R^0$—COOH or —Ar—OH, in its side chains. Examples of such an alkali-soluble resin include acid-decomposable group-free alkali-soluble resins described hereinafter. Therein, —$R^0$— represents a divalent or higher aliphatic or aromatic hydrocarbon group which may have a substituent, and —Ar— represents a monocyclic or polycyclic, divalent or higher aromatic group which may have a substituent.

The mother resins preferred in the invention are alkali-soluble resins having phenolic hydroxyl groups.

It is appropriate that the phenolic hydroxyl group-containing alkali-soluble resin used in the invention be a copolymer containing repeating units corresponding to o-, m- or p-hydroxystyrene (generically called hydroxystyrenes), or o-, m- or p-hydroxy-α-methylstyrene (generically called hydroxy-α-methylstyrenes) in a proportion of at least 30 mole %, preferably at least 50 mole %, or a homopolymer of hydroxystyrene or hydroxy-α-methylstyrene, or a resin containing partially hydrogenated benzene nuclei in the repeating units as recited above. Among these resins, p-hydroxystyrene homopolymer is preferred over the others.

Suitable examples of monomers, other than hydroxystyrenes and hydroxy-α-methylstyrenes, for preparing the foregoing copolymers by copolymerization include acrylic acid esters, methacrylic acid esters, acrylamides, methacrylamides, acrylonitrile, methacrylonitrile, maleic anhydride, styrene, α-methylstyrene, acetoxystyrene and alkoxystyrenes. Of these monomers, styrene, acetoxystyrene and t-butoxystyrene are preferred over the others.

The repeating units (structural units) having the groups represented by formula (XA) are contained in the present resin in a proportion of 5 to 50 mole %, preferably 10 to 45 mole %, far preferably 15 to 40 mole %, to the total repeating units.

In addition to the groups represented by formula (XA), other acid-decomposable groups may be contained in the present resin.

The resin containing groups represented by formula (XA) can be obtained by synthesizing the corresponding vinyl ether, and allowing the vinyl ether to react with a phenolic hydroxyl-containing alkali-soluble resin dissolved in an appropriate solvent, such as tetrahydrofuran, according to a known method. The reaction is generally performed in the presence of an acid catalyst, preferably acid ion exchange resin, hydrochloric acid or p-toluenesulfonic acid, or in the presence of a salt, such as pyridiniumtosylate. The corresponding vinyl ether as mentioned above can be prepared from an active material, such as chloroethyl vinyl ether, in a nucleophilic replacement process. In addition, it can be synthesized by the use of a mercury or palladium catalyst.

Alternatively, the present resin can be synthesized by a method of carrying out acetal exchange by the use of the corresponding alcohol and vinyl ether. In this case, the synthesis is effected in the presence of an acid, such as p-toluenesulfonic acid or pyridinium tosylate under conditions that the alcohol is made to have the substituent to be introduced and relatively unstable vinyl ether such as t-butyl vinyl ether is included in the mixed vinyl ethers used.

The suitable weight average molecular weight (Mw) of the resin containing groups represented by formula (XA) is from 1,000 to 1,000,000, preferably from 1,500 to 500,000, far preferably from 2,000 to 200,000, particularly preferably from 2,500 to 100,000, as measured by gel permeation chromatography (GPC) and calculated in terms of polystyrene. The greater the weight average molecular weight, the more the heat resistance is improved on one hand and the lower the developability becomes on the other. Therefore, the molecular weight is adjusted to the range enabling a proper balance between those properties. The range of molecular weight distribution (Mw/Mn) is from 1.01 to 4.0, preferably from 1.05 to 3.00. For obtaining a polymer having such a molecular weight distribution, it is appropriate to use a technique such as anionic polymerization or radical polymerization.

Examples of the structural formula of a repeating unit containing a group represented by formula (XA) are illustrated below. However, these examples should not be construed as limiting the scope of the invention.

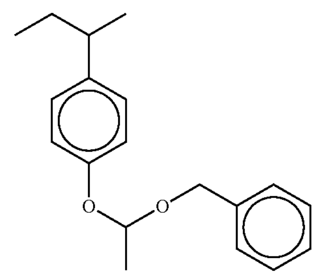

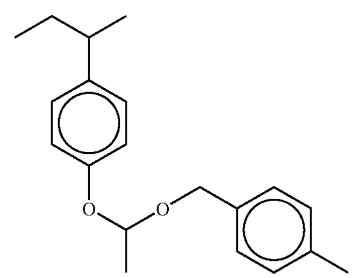

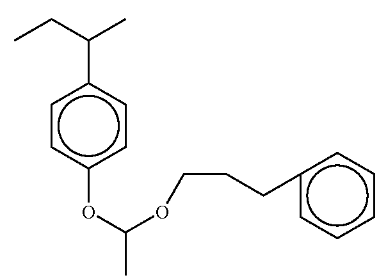

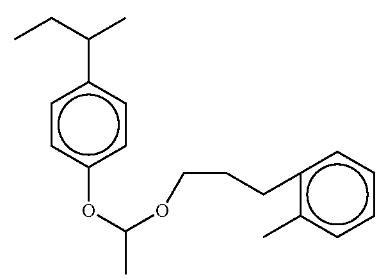

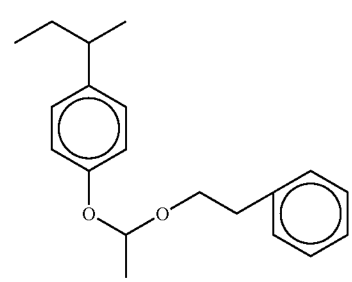

-continued
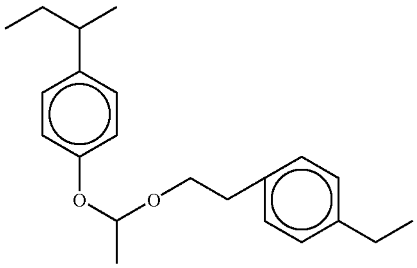
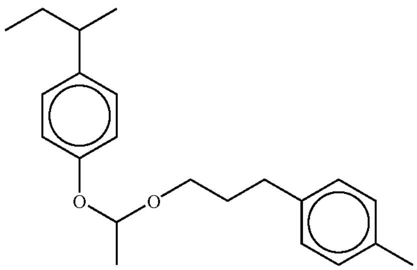
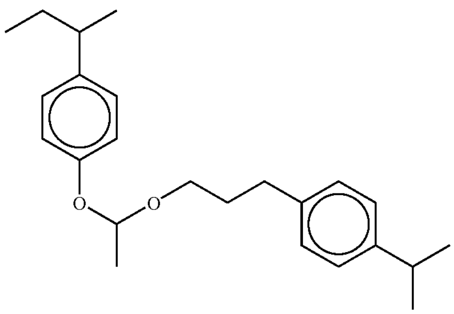
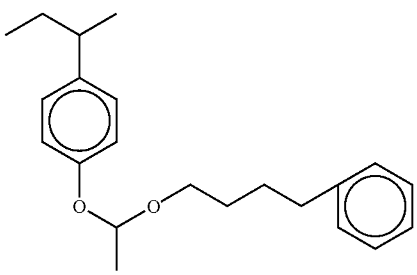
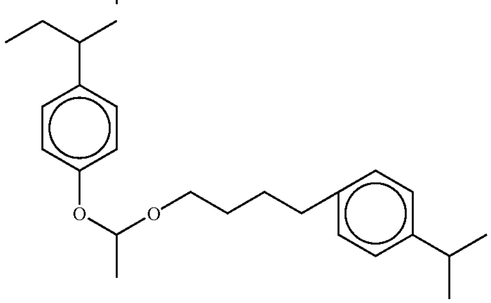
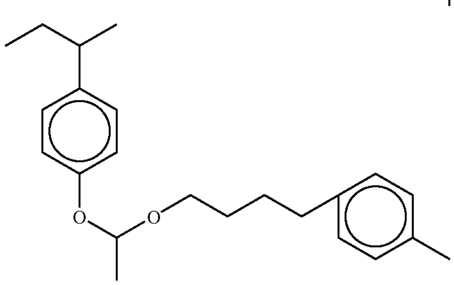
-continued
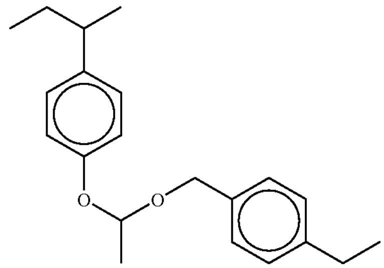
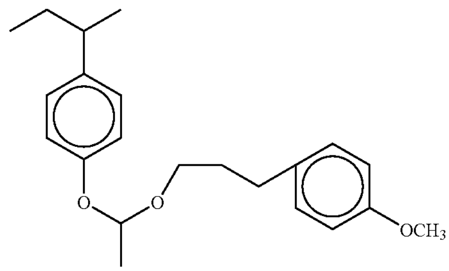
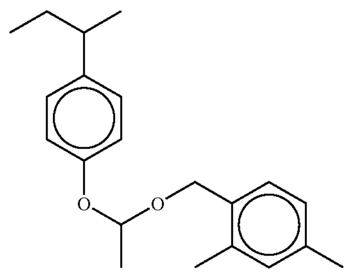
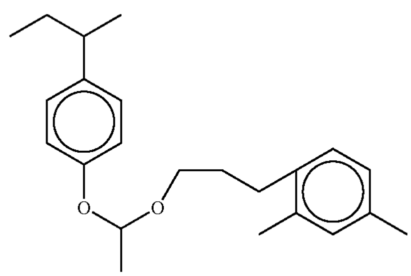
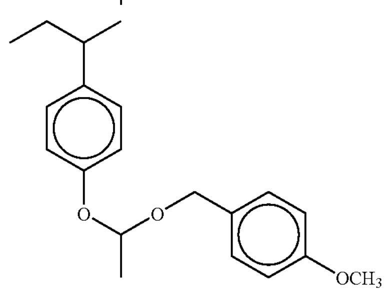
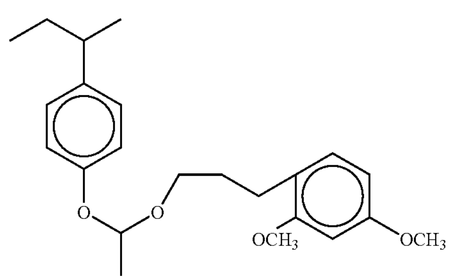

-continued

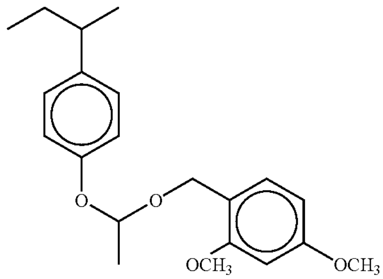

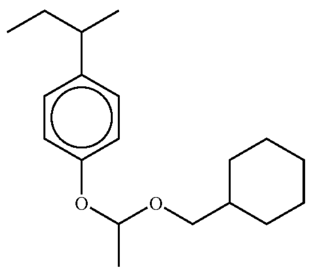

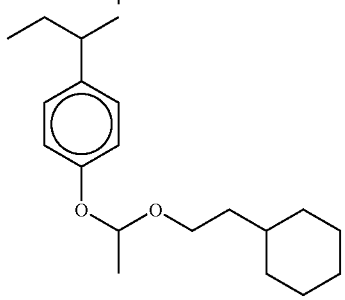

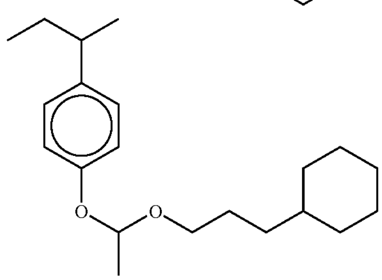

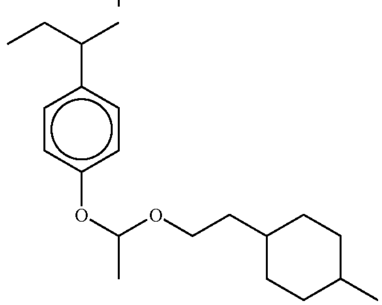

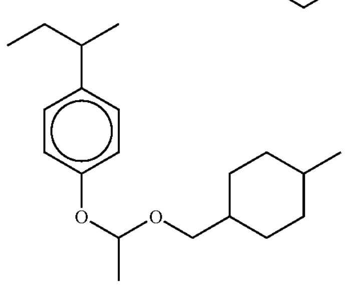

The repeating units having groups represented by formula (XA) can include repeating units of formulae (IA), (IIA) and (IIIA).

In formulae (IA) to (IIIA), R21b represents a hydrogen atom or a methyl group.

Examples of a substituent undergoing no decomposition under the action of acids (referred to as an acid-stable group) represented by R22b include a hydrogen atom, halogen atoms, alkyl groups, cycloalkyl groups, alkenyl groups, aryl groups, alkyloxy groups (exclusive of -O-tertiary alkyl), acyl groups, cycloalkyloxy groups, alkenyloxy groups, aryloxy groups, alkylcarbonyloxy groups, alkylamidomethyloxy groups, alkylamido groups, arylamidomethyl groups and arylamido groups. Of these acid-stable groups, acyl, alkylcarbonyloxy, alkyloxy, cycloalkyloxy, aryloxy, alkylamidomethyloxy and alkylamido groups are preferred over the others. Further, acyl, alkylcarbonyloxy, alkyloxy, cycloalkyloxy and aryloxy groups have advantages over the other groups As to the acid-stable group of R22b, it is appropriate that the alkyl group include $C_1$–$C_4$ alkyl groups, such as a methyl group, an ethyl group, a propyl group, an n-butyl group, a sec-butyl group and a t-butyl group, the cycloalkyl group include $C_3$–$C_{10}$cycloalkyl groups, such as a cyclopropyl group, a cyclobutyl group, a cyclohexyl group and an adamantyl group, the alkenyl group include $C_2$–$C_4$ alkenyl groups, such as a vinyl group, a propenyl group, an allyl group and a butenyl group, the aryl group include $C_6$–$C_{14}$ aryl groups, such as a phenyl group, a xylyl group, a tolyl group, a cumenyl group, a naphthyl group and a anthracenyl, and the alkoxy group include $C_1$–$C_4$ alkoxy groups, such as a methoxy group, an ethoxy group, a hydroxyethoxy group, a propoxy group, a hydroxypropoxy group, an n-butoxy group, an isobutoxy group and a sec-butoxy group.

The halogen atom suitable as R23b is a fluorine atom, a chlorine atom, a bromine atom or an iodine atom. Examples of an alkyl group suitable as R23b include $C_1$–$C_8$ alkyl groups, such as methyl, ethyl, propyl, n-butyl, sec-butyl, t-butyl, hexyl and octyl groups. Examples of an aryl group suitable as R23b include $C_6$–$C_{14}$ aryl groups, such as phenyl, xylyl, tolyl, cumenyl, naphthyl and anthracenyl. Examples of an alkoxy group suitable as R23b include $C_1$–$C_4$ alkoxy groups, such as methoxy, ethoxy, hydroxyethoxy, propoxy, hydroxypropoxy, n-butoxy, isobutoxy, sec-butoxy and t-butoxy groups. Examples of an acyl group suitable as R23b include $C_1$–$C_7$ acyl groups, such as formyl, acetyl, propanoyl, butanoyl and benzoyl groups. Examples of an acyloxy group suitable as R23b include $C_2$–$C_7$ acyloxy groups, such as acetoxy, propanoyloxy, butanoyloxy and benzoyloxy groups.

The substituent W in formula (IA) is a group represented by formula (XA), and the formula (XA) is illustrated hereinbefore.

Examples of the structural formula of a repeating unit represented by formula (IA) are illustrated below. However, these examples should not be construed as limiting the scope of the invention.

-continued
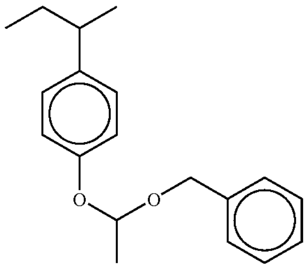
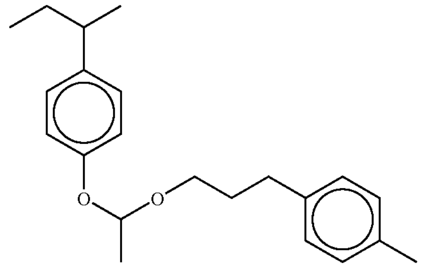
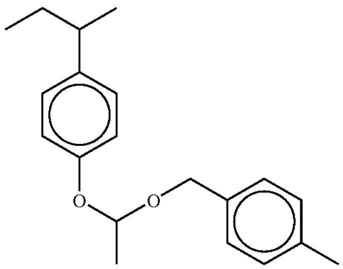
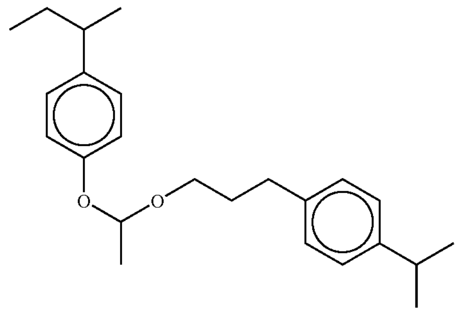
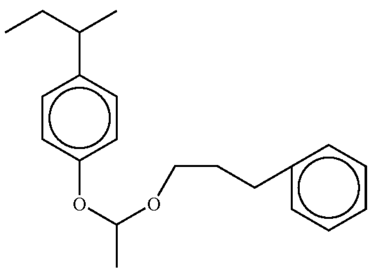
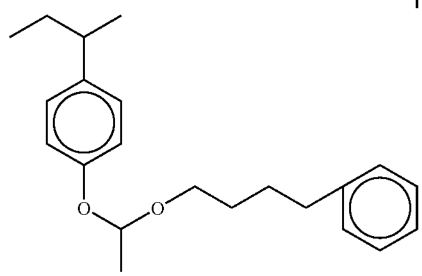
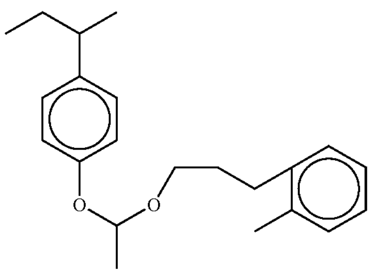
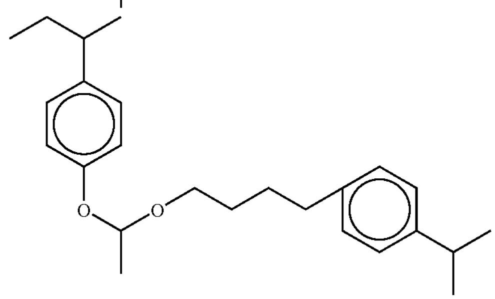
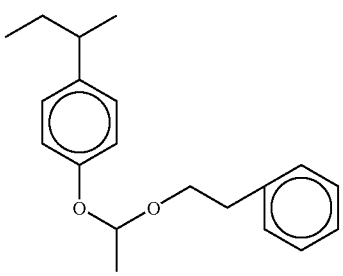
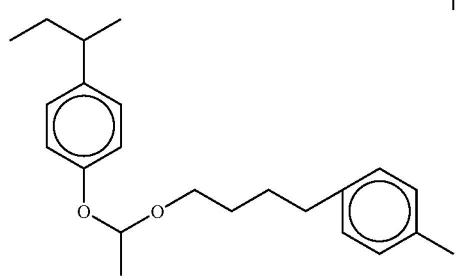
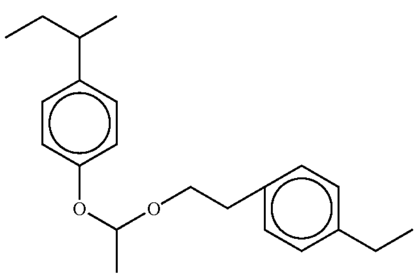
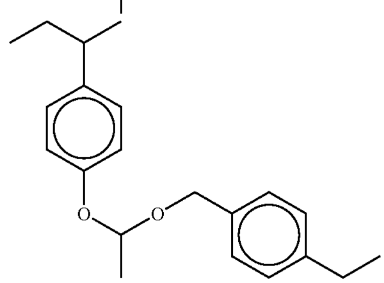

-continued

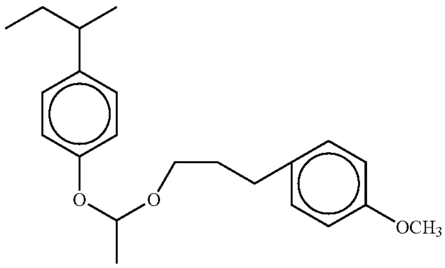

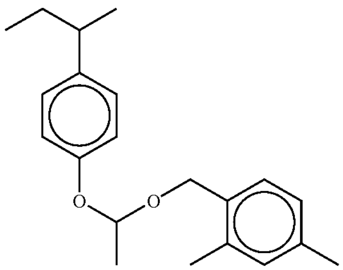

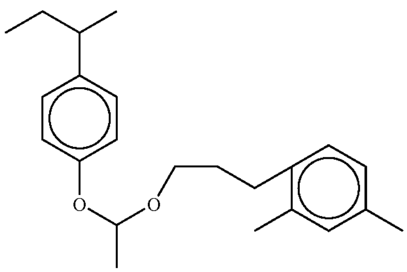

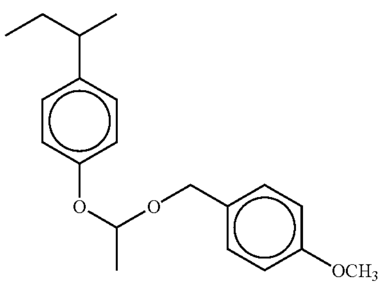

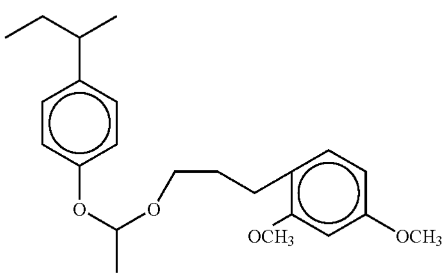

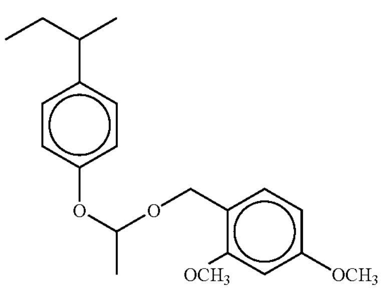

-continued

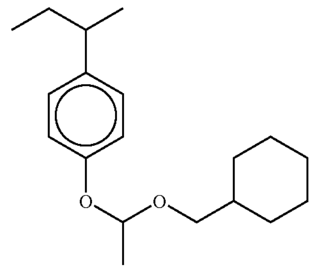

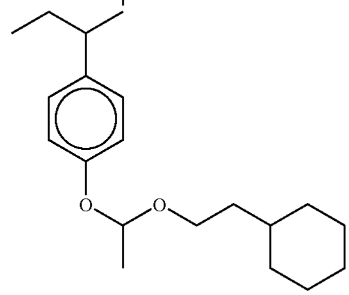

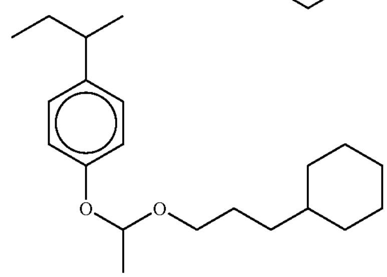

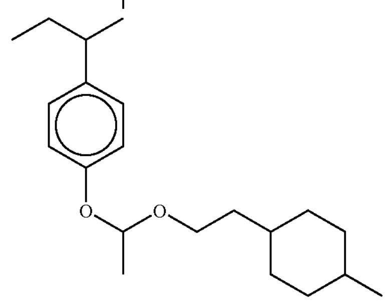

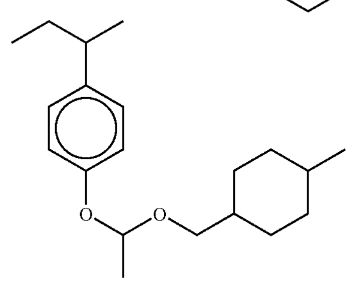

When the structural units represented by formula (IIA) are present in the resin, the resin can decompose under the action of acids, and thereby the control of alkali developer solubility becomes possible.

In addition, the incorporation of such structural units into the resin makes it possible to achieve highly rectangular profiles. Moreover, the incorporation of structural units represented by formula (IIA) is effective in controlling the proportion of the structural units represented by formula (IA).

Examples of a polymerizing monomer with a structural unit represented by formula (IIA) are illustrated below. However, these examples should not be construed as limiting the scope of the invention.
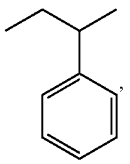
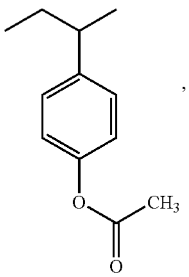
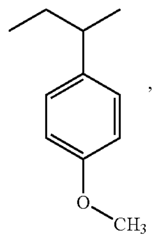
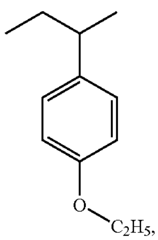
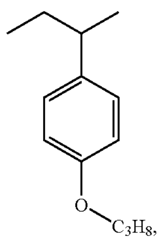
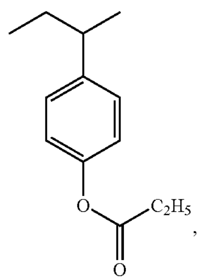
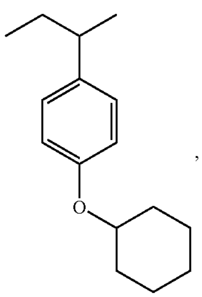
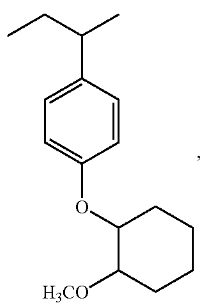
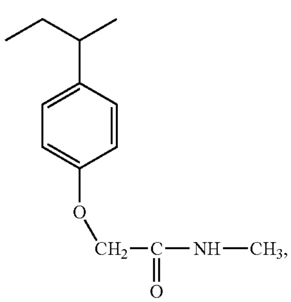
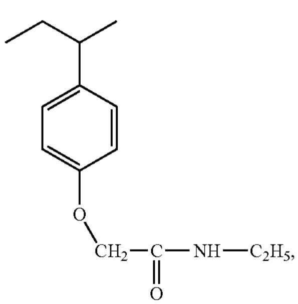
-continued
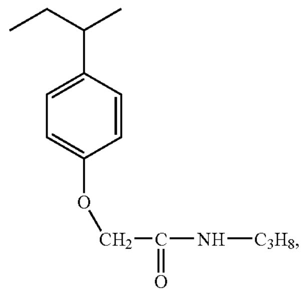
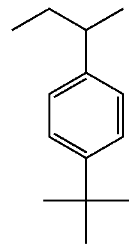
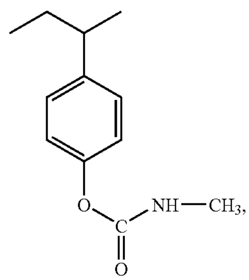
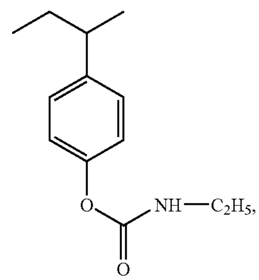
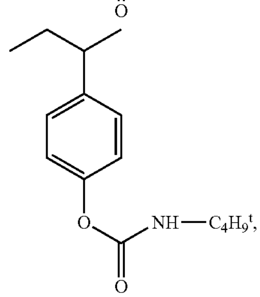
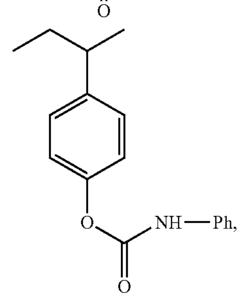
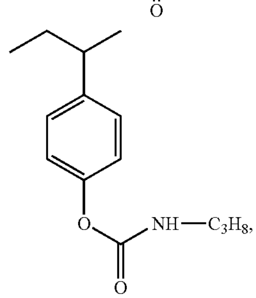
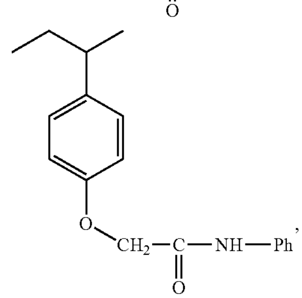
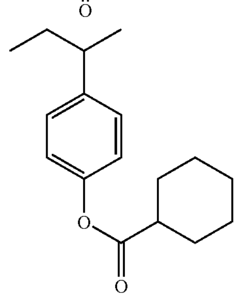
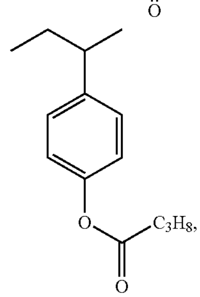
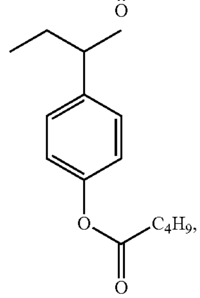

By incorporating structural units represented by formula (IIA) into the resin, development residue and development defects can be reduced.

Examples of a polymerizing monomer with a structural unit represented by formula (IIIA) are illustrated below. However, these examples should not be construed as limiting the scope of the invention.

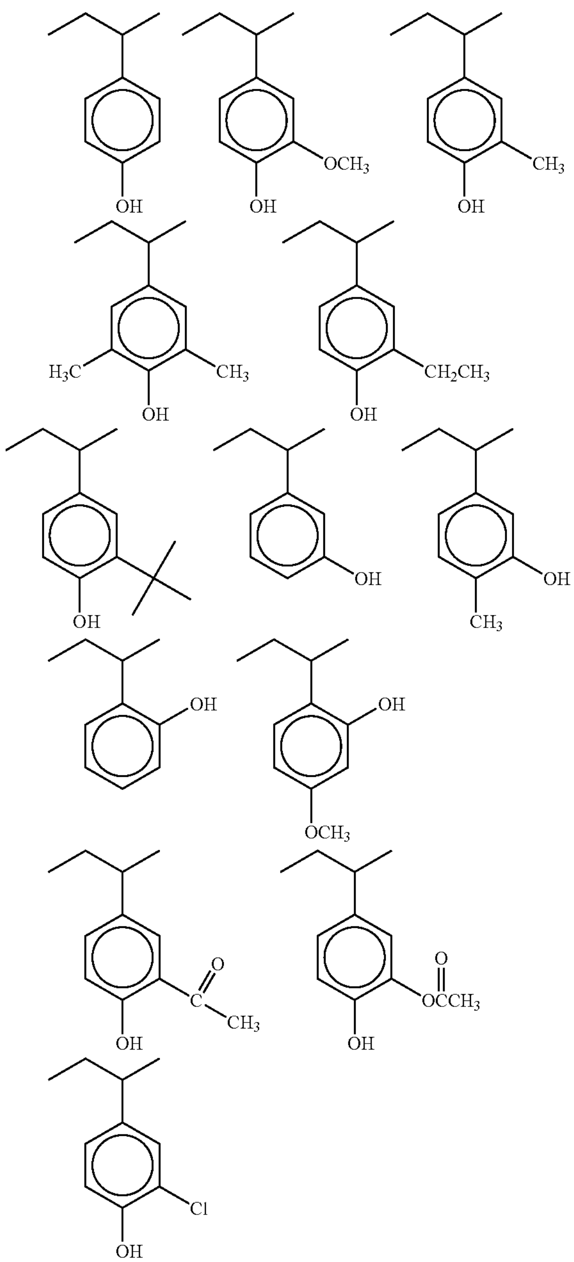

When the present resin contains repeating units represented by formula (IA), (IIA) and (IIIA) respectively, it is appropriate that the compositional mole fractions of those repeating units satisfy the following inequalities (i), (ii) and (iii) for each of the repeating units:

(i) $0.07<(IA)/[(IA)+(IIA)+(IIIA)]<0.30$ (ii) $0.01<(IA)/[(IA)+(IIA)+(IIIA)]<0.17$ (iii) $0.05<(IA)/[(IA)+(IIA)+(IIIA)]<0.40$ The resin of Component (B) can be used in the form of a copolymer prepared using various kinds of monomers to add repeating units other than the above-recited ones for the purposes of controlling not only dry etching resistance, suitability for standard developers, adhesion to substrates, resist profile, and factors generally required for resist, such as resolution, heat resistance and sensitivity.

Examples of repeating units to be added for the foregoing purposes include the repeating units derived from the following monomers, but these examples should not be construed as limiting the scope of the invention.

By containing such repeating units, it becomes possible to make fine adjustments of capabilities required for the resin, especially (1) solubility in coating solvents, (2) film formability (glass transition temperature), (3) alkali developability, (4) prevention from lessening film thickness (hydrophile-hydrophobe balance, alkali-soluble group selection), (5) adhesion of unexposed areas to a substrate, and (6) dry etching resistance.

Those monomers for copolymerization can be selected from compounds containing one addition-polymerizable unsaturated bond per molecule, with examples including acrylic acid esters, methacrylic acid esters, acrylamides, methacrylamides, allyl compounds, vinyl ethers and vinyl esters.

Examples of the acrylic acid esters include alkyl acrylates (preferably containing 1 to 10 carbon atoms in their respective alkyl moieties), such as methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate.

Examples of the methacrylic acid esters include alkyl methacrylates (preferably containing 1 to 10 carbon atoms in their respective alkyl moieties), such as methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octylmethacrylate, 2-hydroxyethylmethacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate.

Examples of the acrylamides include acrylamide, N-alkylacrylamides (which each have an alkyl moiety containing 1 to 10 carbon atoms, such as methyl, ethyl, propyl, butyl, t-butyl, heptyl, octyl, cyclohexyl or hydroxyethyl group), N,N-dialkylacrylamides (which each have an alkyl moiety containing 1 to 10 carbon atoms, such as methyl, ethyl, butyl, isobutyl, ethylhexyl or cyclohexyl group), N-hydroxyethyl-N-methylacrylamide and N-2-acetamidoethyl-N-acetylacrylamide.

Examples of the methacrylamides include methacrylamide, N-alkylmethacrylamides (which each have an alkyl moiety containing 1 to 10 carbon atoms, such as methyl, ethyl, t-butyl, ethylhexyl, hydroxyethyl or cyclohexyl group), N,N-dialkylmethacrylamides (the alkyl moieties of which include ethyl, propyl and butyl groups), and N-hydroxyethyl-N-methylmethacrylamide.

Examples of the allyl compounds include allyl esters (such as allyl acetate, allyl caproate, allyl caprylate, allyl laurate, allylpalmitate, allylstearate, allyl benzoate, allyl acetacetate and allyl lactate), and allyloxyethanol.

Examples of the vinyl ethers include alkyl vinyl ethers (such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether.

Examples of the vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetacetate, vinyl lactate, vinyl-β-phenylbutyrate, and vinyl chlorohexylcarboxylate.

In addition to the compounds recited above, other monomers which can be used include dialkyl itaconates (such as dimethyl itaconate, diethyl itaconate and dibutyl itaconate).

Further, di- and monoalkyl fumarates (e.g., dibutyl fumarate) can be used as the monomers. Moreover, acrylic acid, methacrylic acid, crotonic acid, itaconic acid, maleic anhydride, maleimide, acrylonitrile, methacrylonitrile and maleylonitrile may be used as the monomers. Besides the monomers recited above, addition-polymerizable unsaturated compounds may be used as comonomers as long as they can form copolymers together with the monomers corresponding to the various repeating units as illustrated above.

The molar ratio between repeating units to constitute the resin (B) is chosen appropriately so as to adjust the acid value, the dry etching resistance of resist, the standard developer suitability of resist, the adhesion of resist to a substrate, the pitch dependency of resist profile, and characteristics generally required for resist, such as resolution, heat resistance and sensitivity.

In the resin (B), the content of the repeating units which each contain any one of groups represented by formulae (I-1) to (I-4) is from 20 to 60 mole %, preferably from 25 to 55 mole %, far preferably from 30 to 50 mole %, based on the total repeating units.

And the content of the repeating units which each have any of groups represented by formulae (pI) to (pVI) is generally from 15 to 70 mole %, preferably from 20 to 65 mole %, far preferably from 25 to 60 mole %, based on the total repeating units.

In the resin (B), the content of the repeating units represented by formula (a) is generally from 0 to 60 mole %, preferably from 5 to 35 mole %, far preferably from 10 to 25 mole %, based on the total repeating units.

And the content of the repeating units represented by formulae (III-a) to (III-d) in the resin of component (B) is generally from 0.1 to 25 mole %, preferably from 0.5 to 20 mole %, far preferably from 1 to 15 mole %, of the total repeating units.

Further, the content of the repeating units represented by formula (XA) in the resin (B) is generally from 5 to 50 mole %, preferably from 10 to 45 mole %, far preferably from 15 to 40 mole %, based on the total repeating units.

Furthermore, the content of repeating units derived from the other comonomers in the resin (B) can be determined appropriately depending on the desired resist performances. In general, the suitable proportion of such repeating units to the total mole number of the repeating units which each have a group represented by any of formulae (I-1) to (I-4), the repeating units which each have a group represented by any of formulae (pI) to (pVI) and the repeating units represented by formula (XA) is 99 mole % or below, preferably 90 mole % or below, far preferably 80 mole % or below.

The suitable weight average molecular weight (Mw) of the resin (B) is from 1,000 to 1,000,000, preferably from 1,500 to 500,000, far preferably from 2,000 to 200,000, particularly preferably from 2,500 to 100,000, as measured by GPC and calculated in terms of polystyrene. The greater the weight average molecular weight, the more the heat resistance is improved on one hand and the lower the developability becomes on the other. Therefore, the molecular weight is adjusted to the range enabling a proper balance between those properties.

The resin (B) used in the invention can be synthesized according to a usual technique, such as radical polymerization.

Examples of the present resin (B) are illustrated below. However, these examples should not be construed as limiting the scope of the invention.

(1)

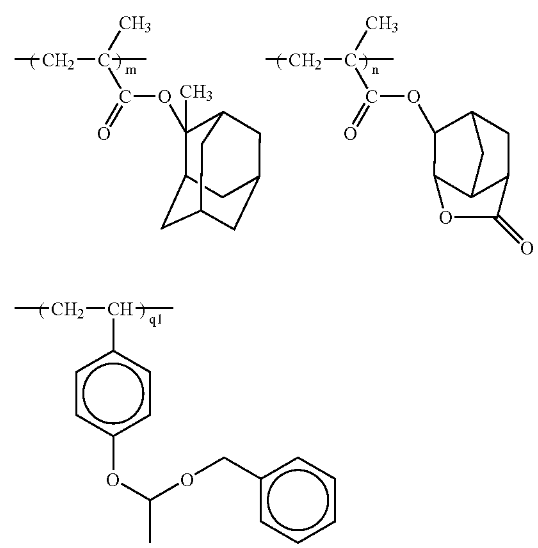

(2)

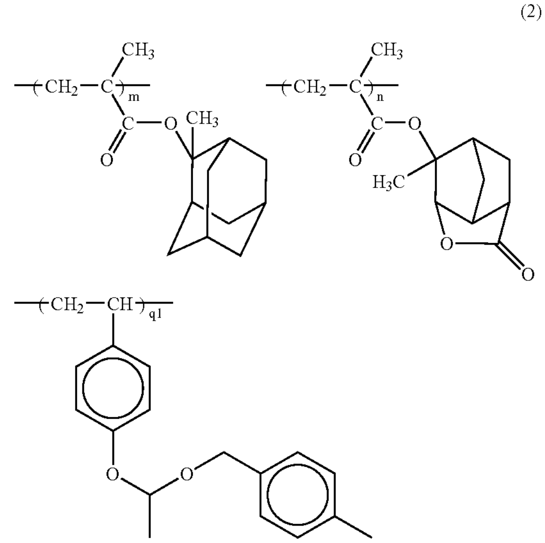

-continued
(3)
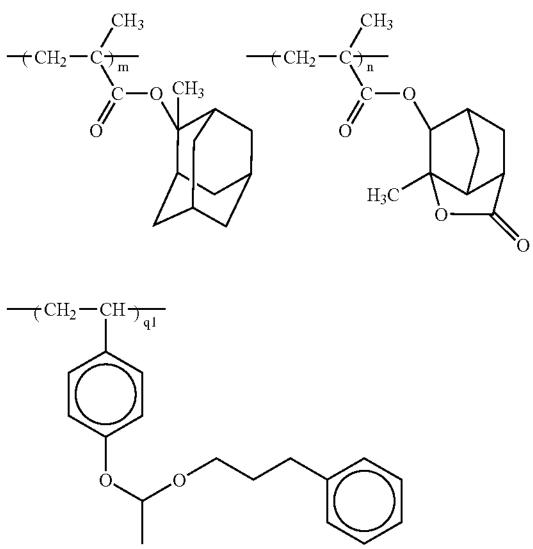
(4)
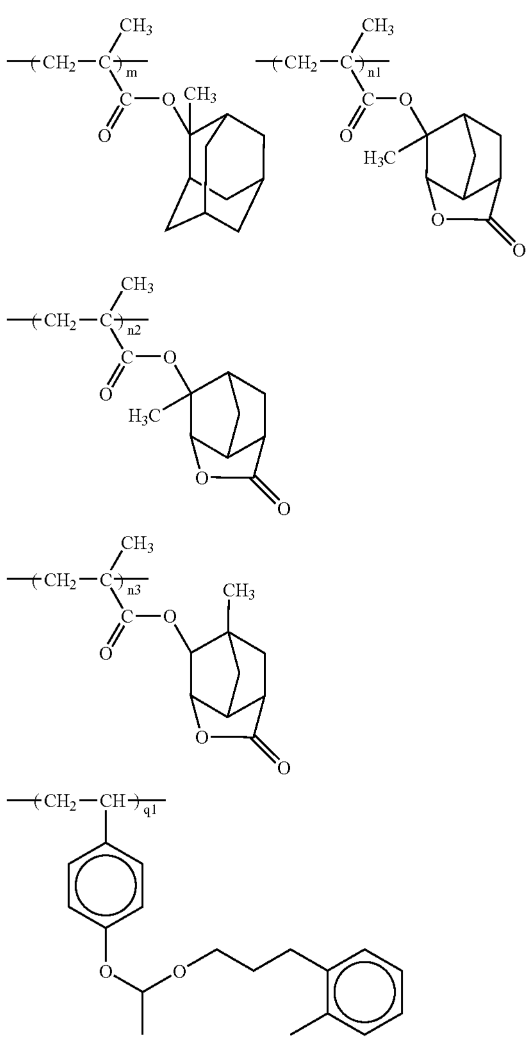
-continued
(5)
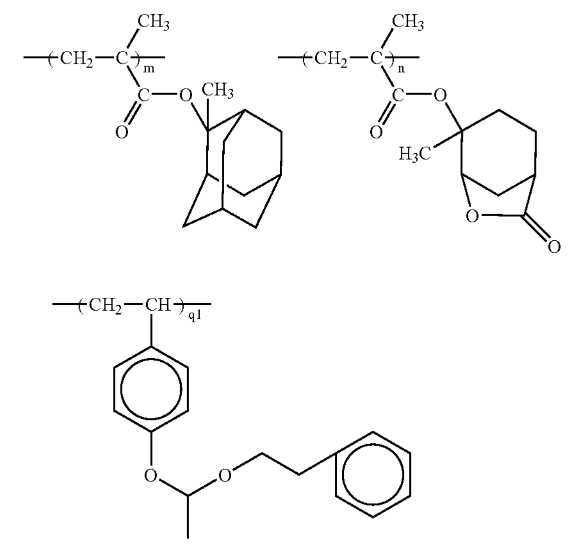
(6)
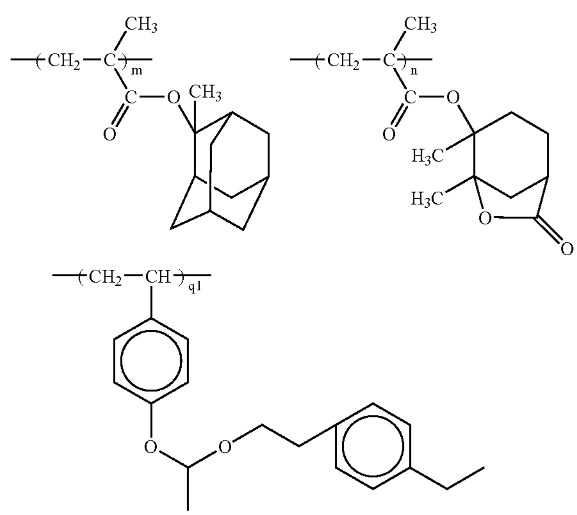
(7)
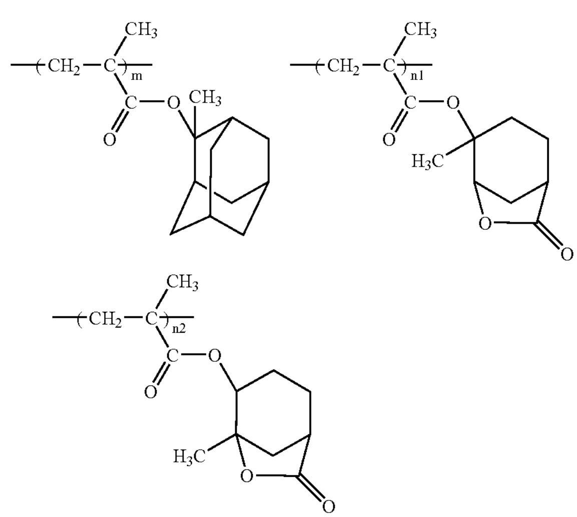

-continued
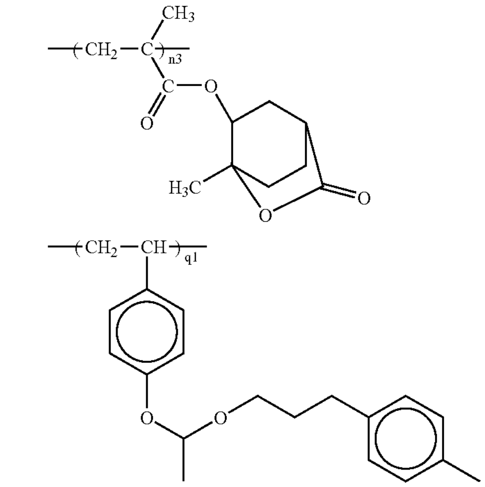
(8)
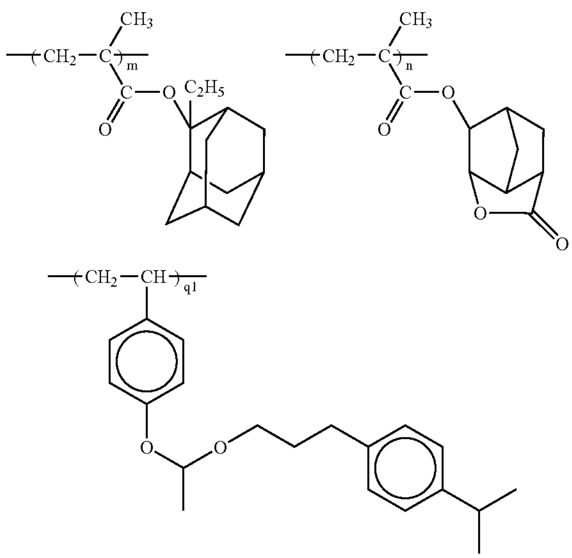
(9)
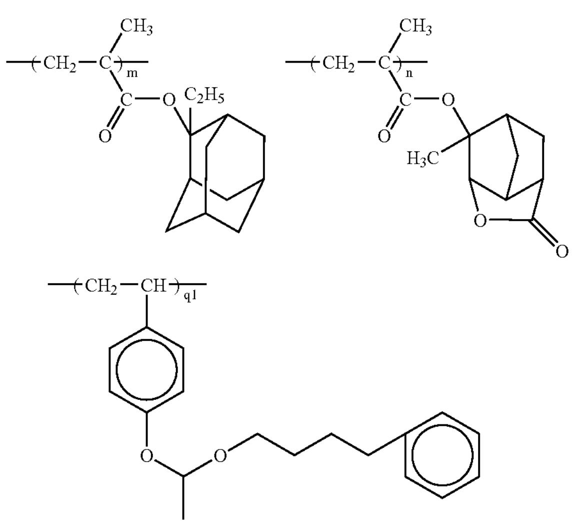
-continued
(10)
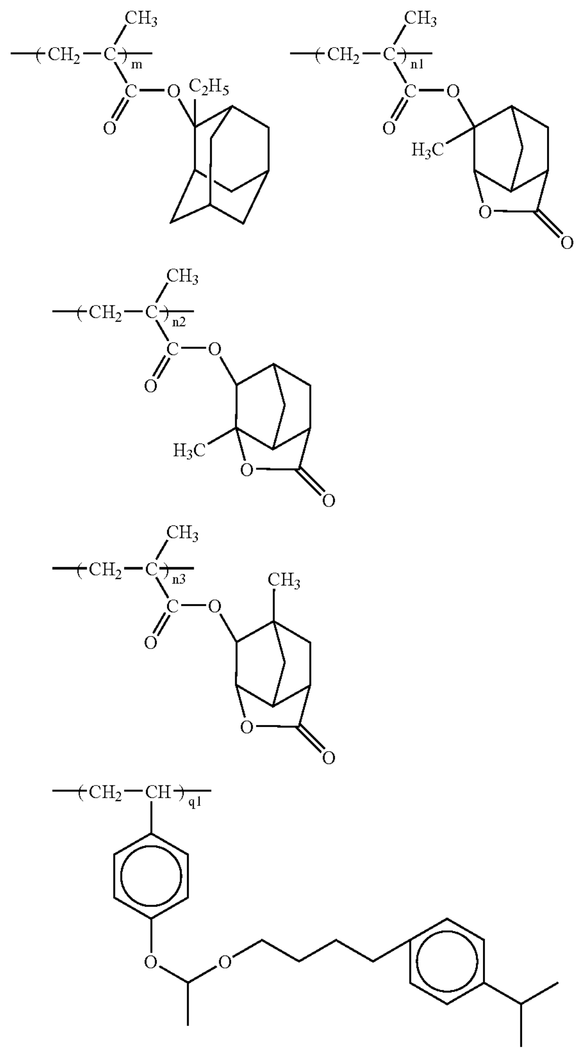
(11)
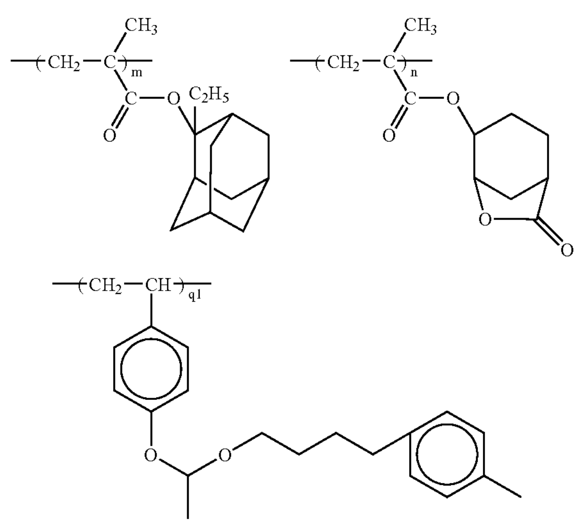

-continued
(12)
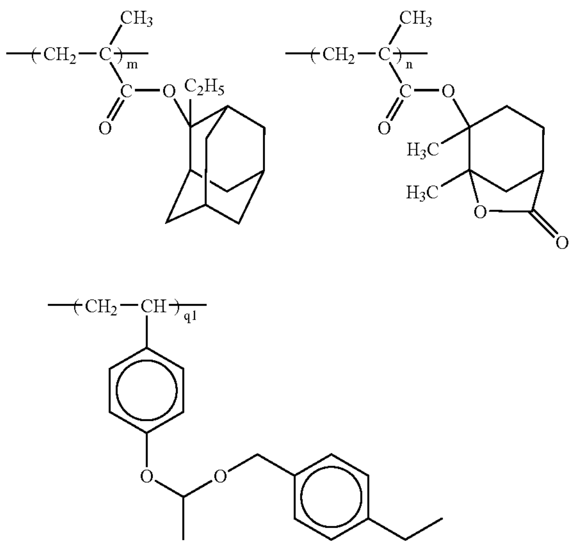
(13)
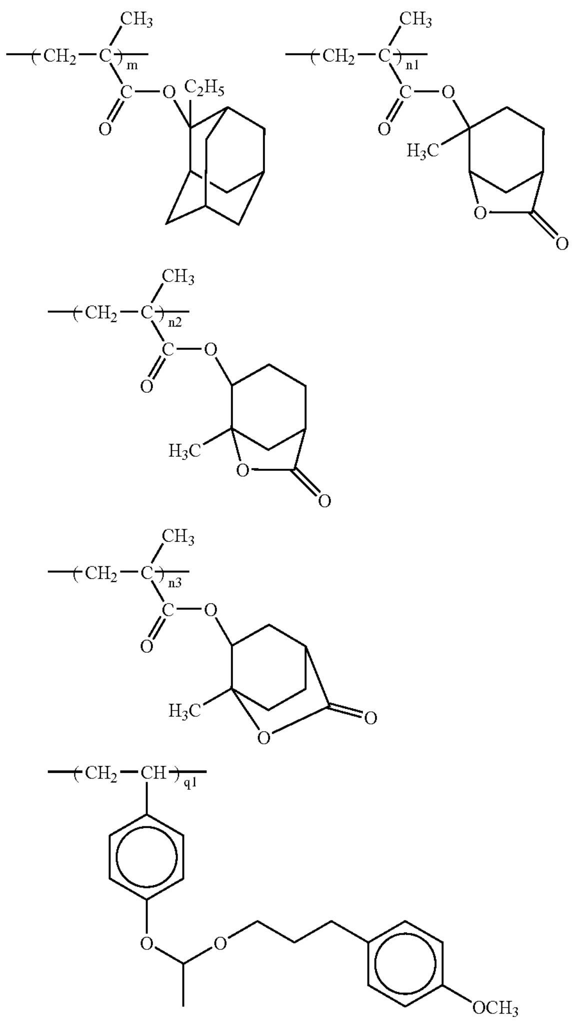
-continued
(14)
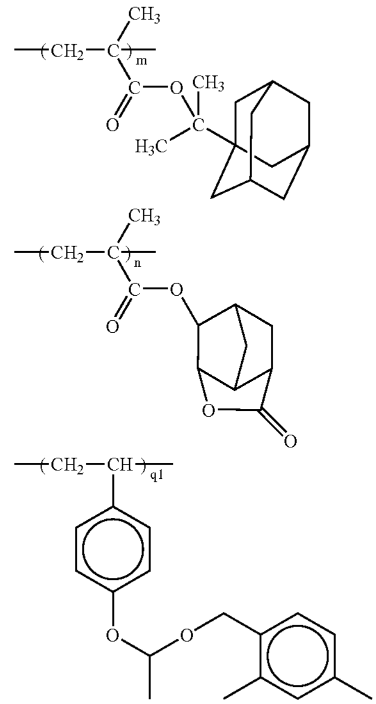
(15)
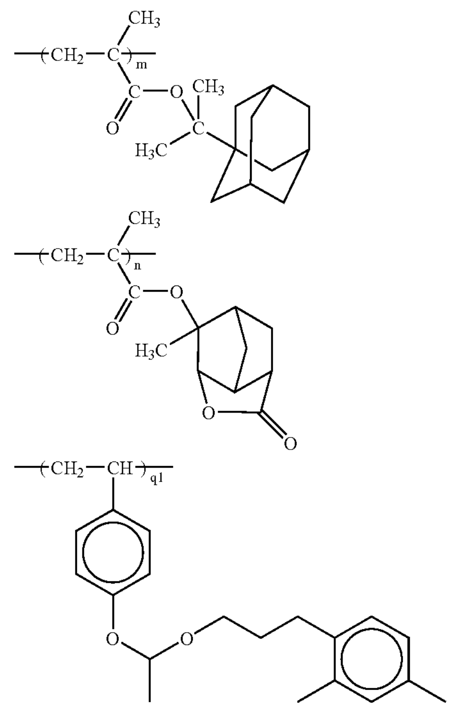
(16)
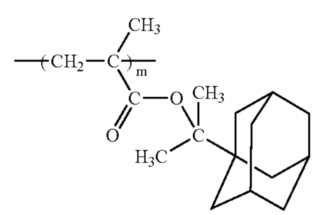

-continued
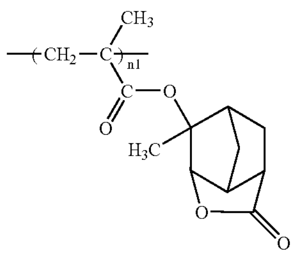
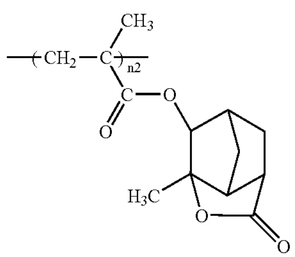
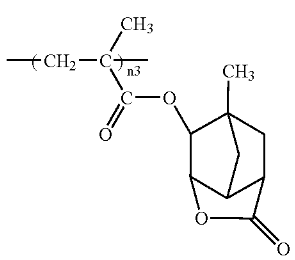
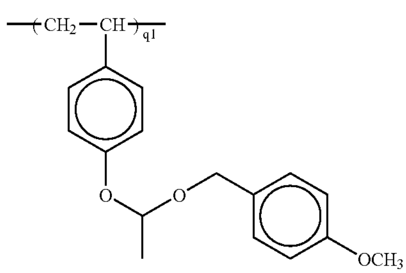
(17)
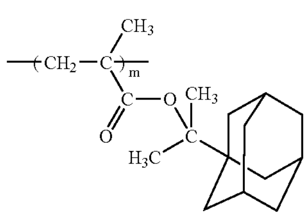
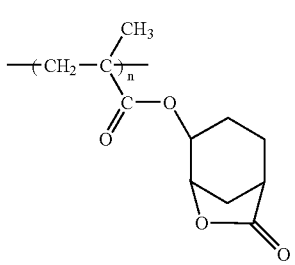
-continued
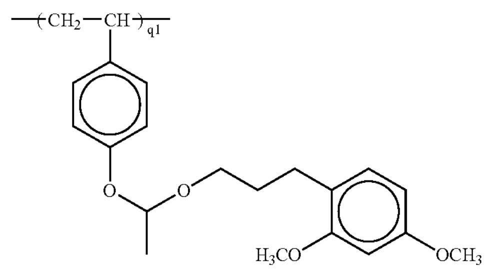
(18)
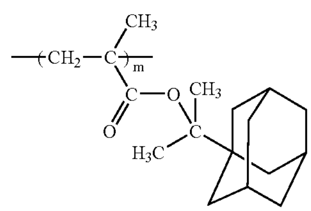
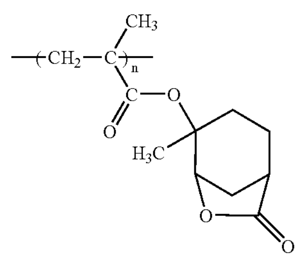
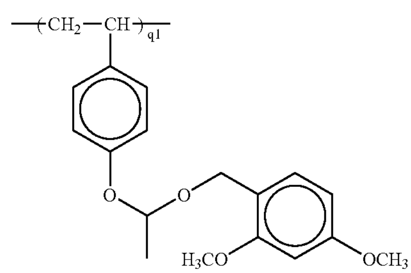
(19)
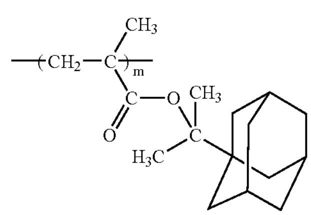
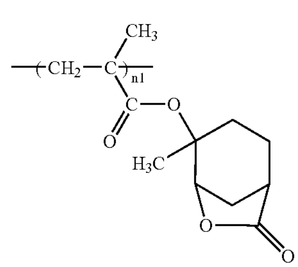

-continued
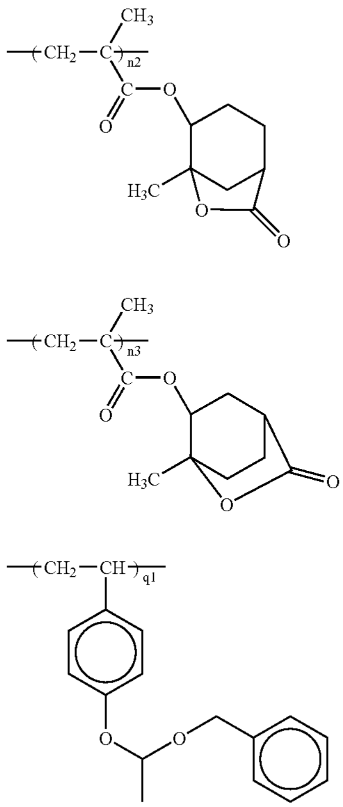
(20)
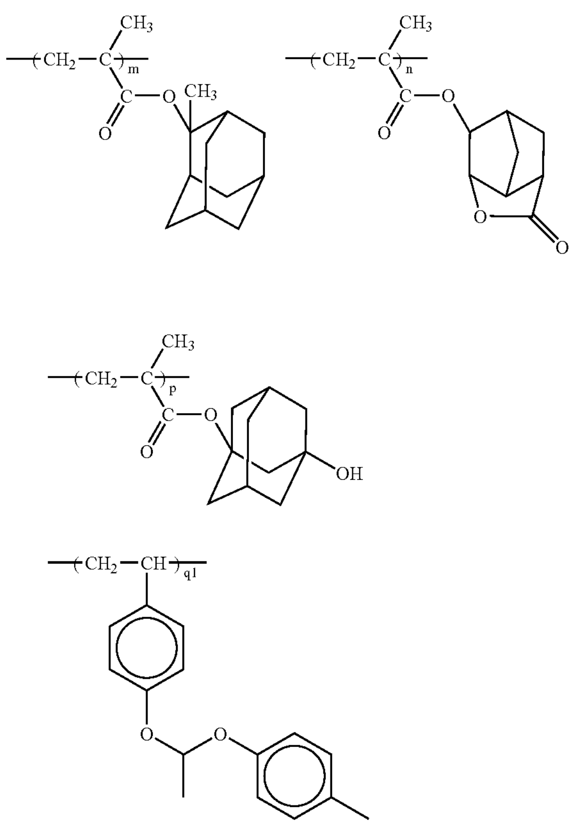
-continued
(21)
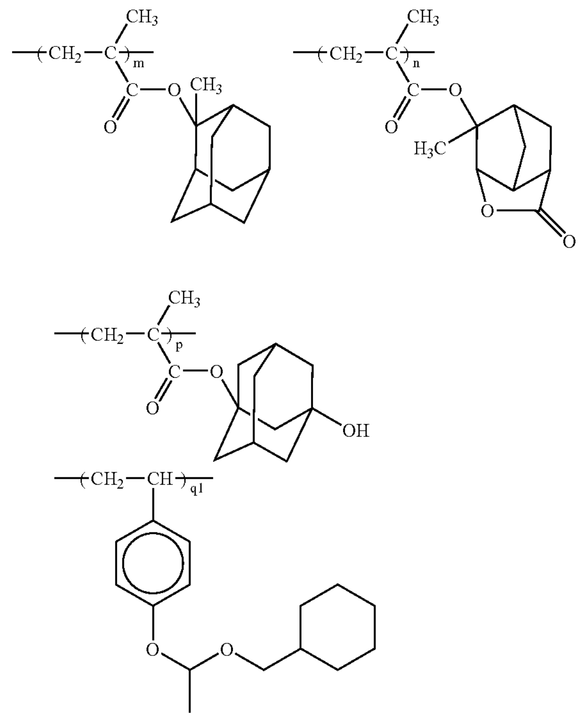
(22)
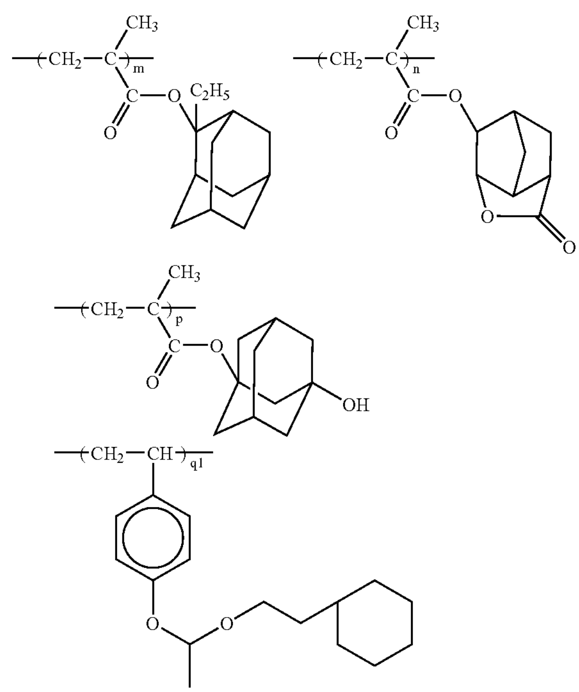
(23)
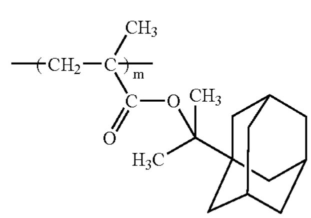

-continued
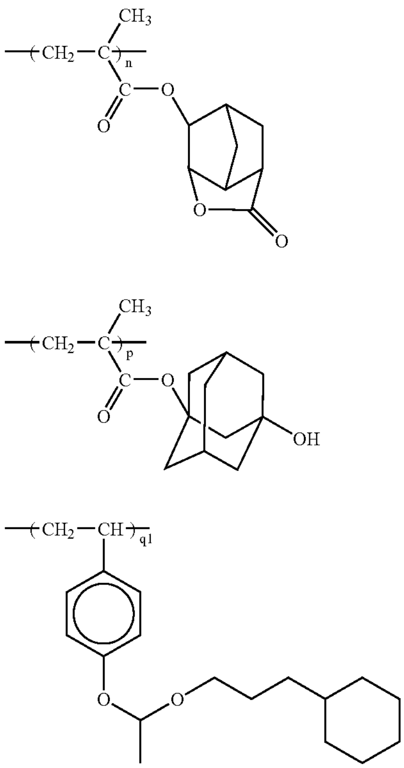
(24)
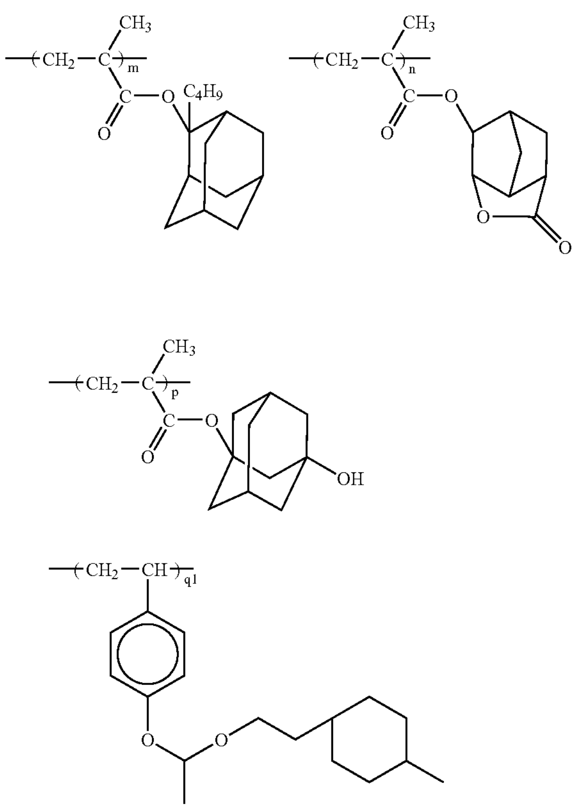
-continued
(25)
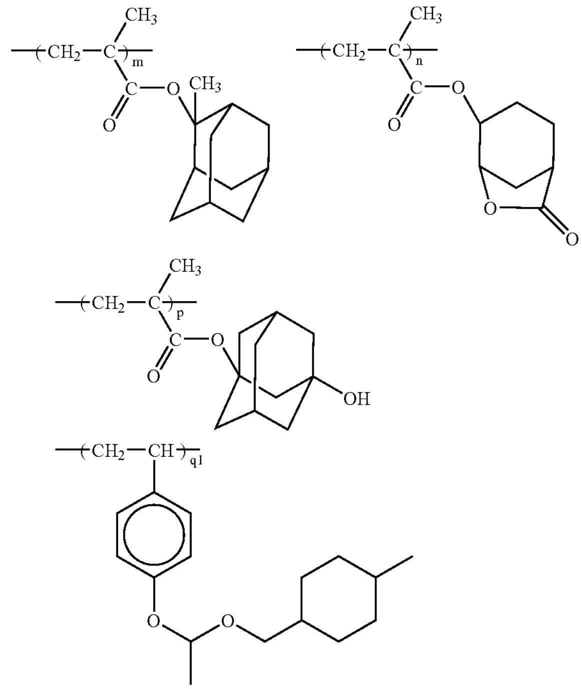
(26)
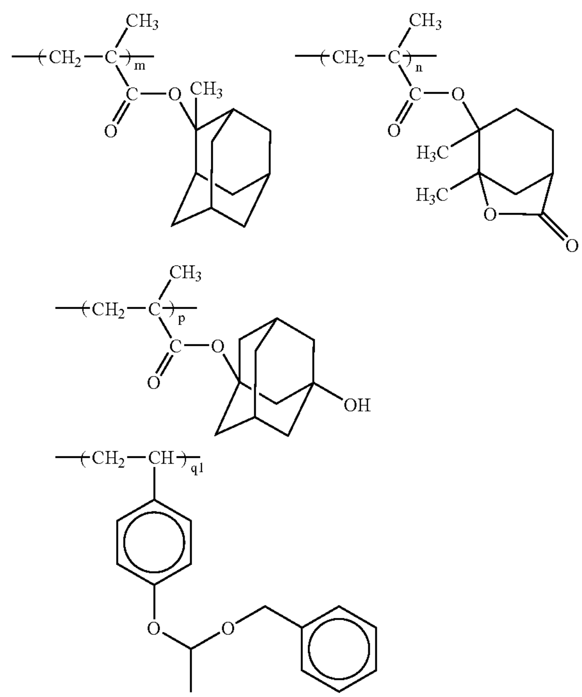
(27)
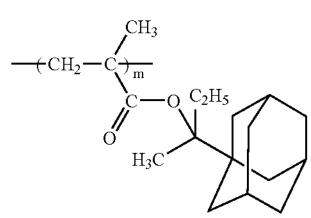

-continued
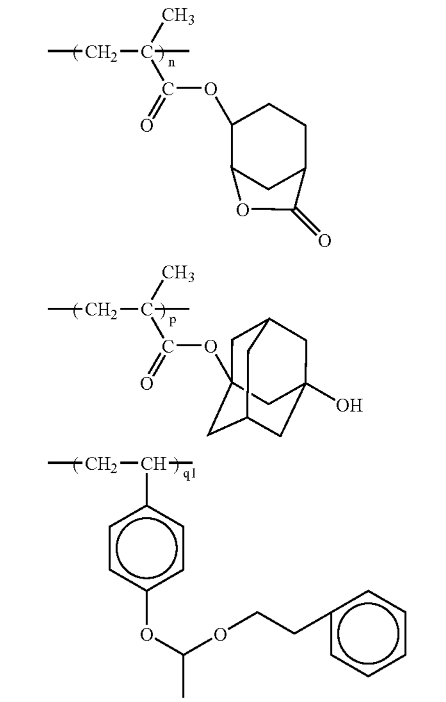
(28)
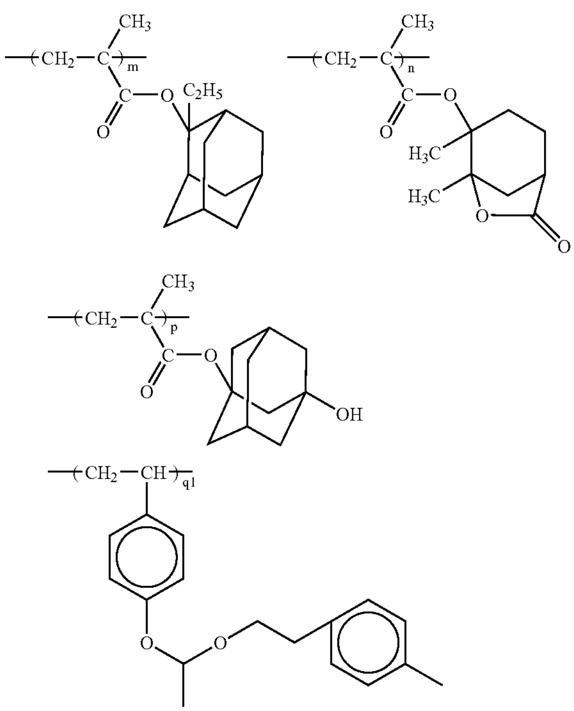
(29)
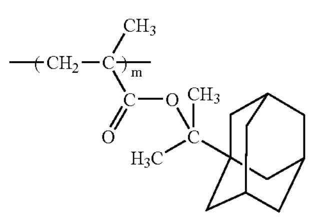
-continued
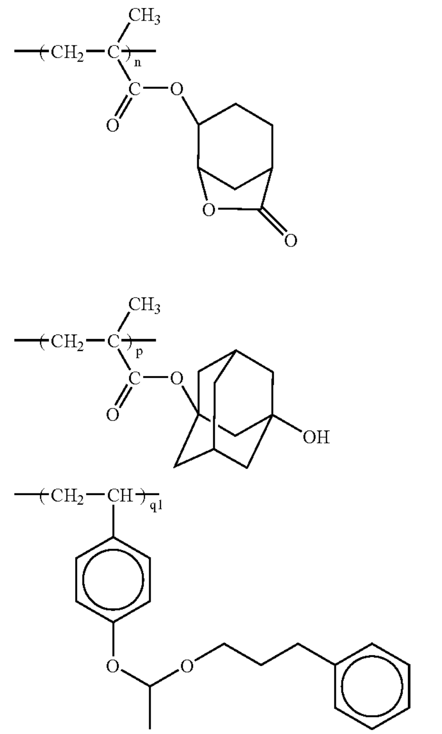
(30)
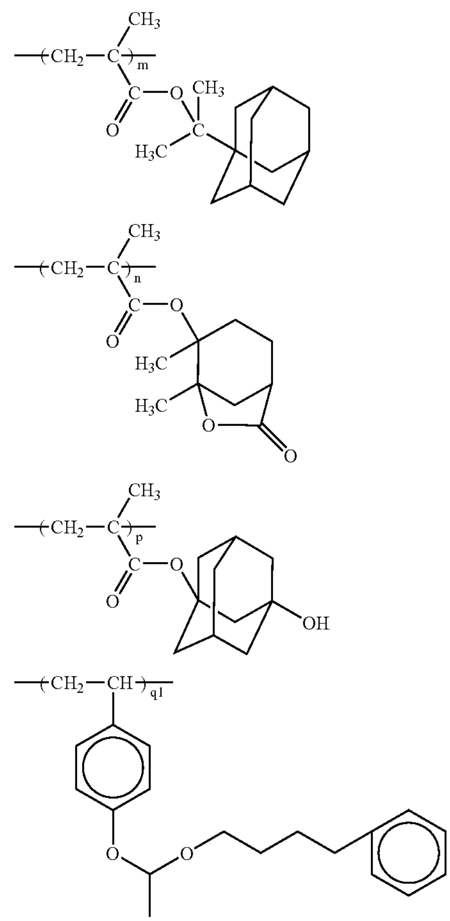

-continued
(31)
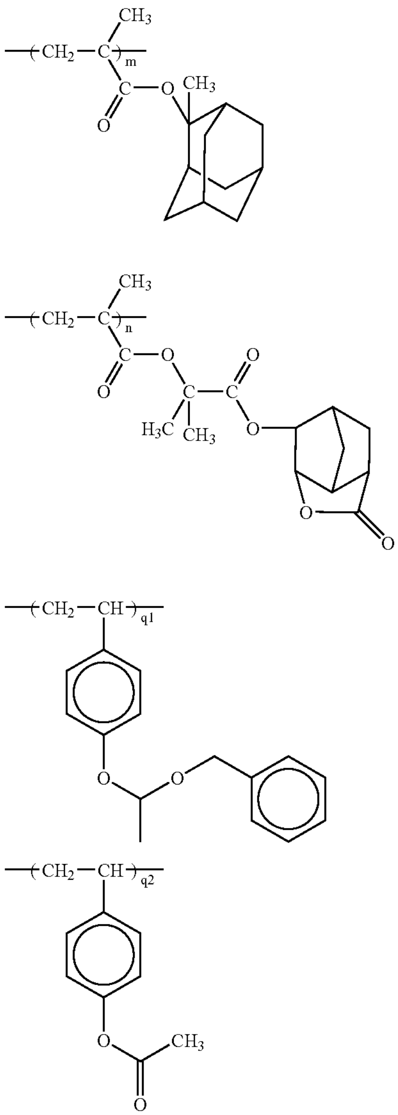
(32)
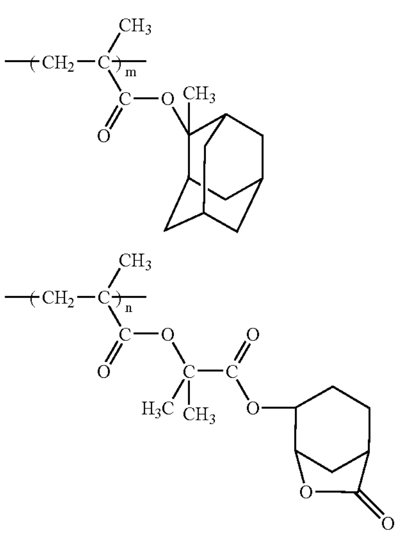
-continued
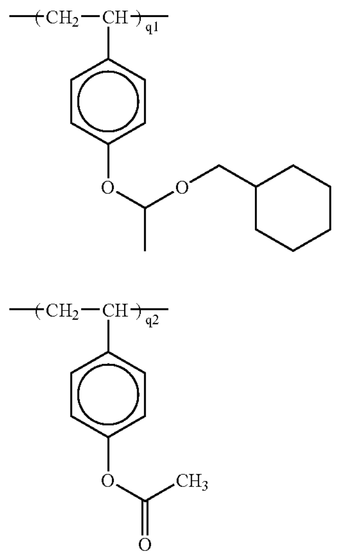
(33)
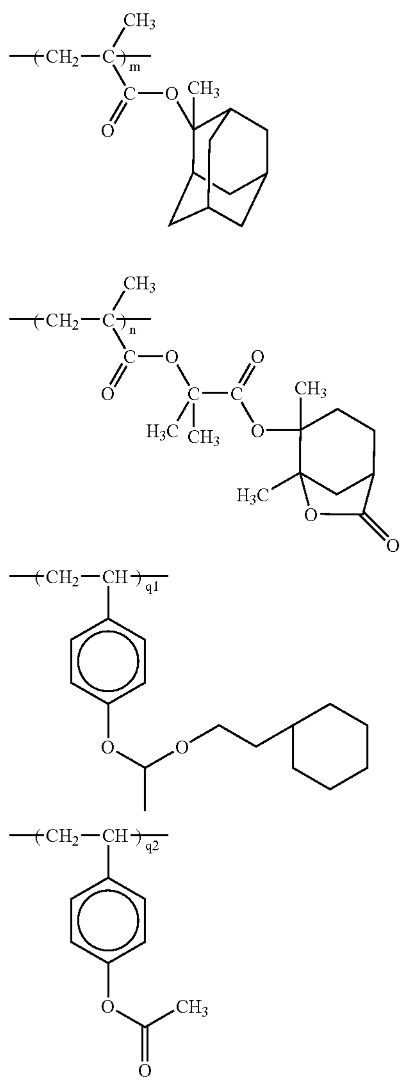

-continued
(34)
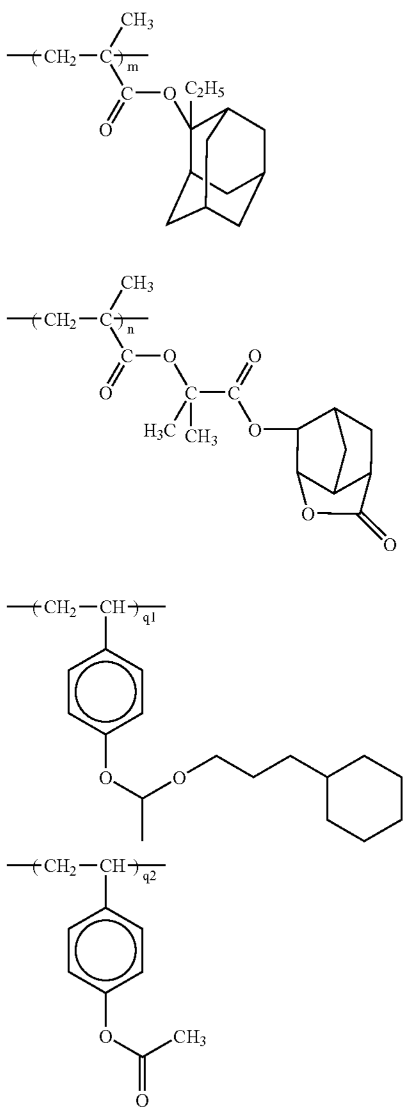
(35)
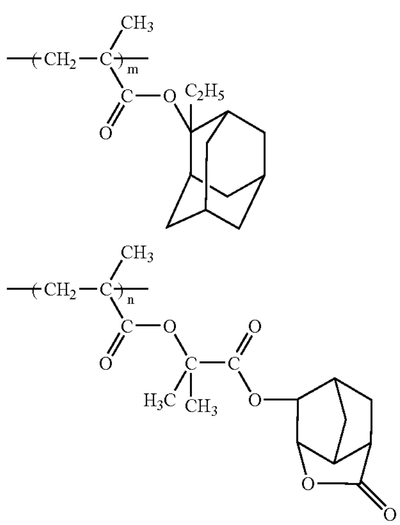
-continued
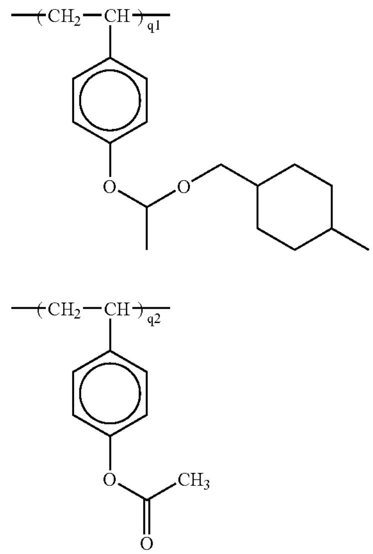
(36)
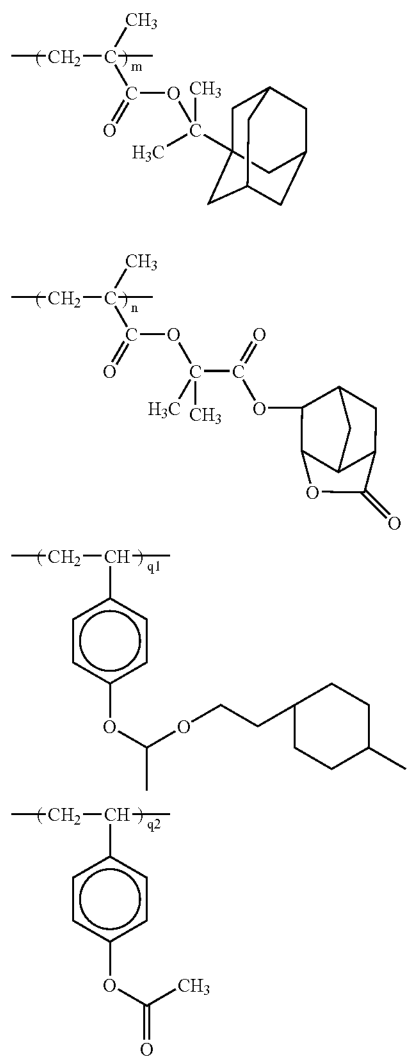

-continued
(37)
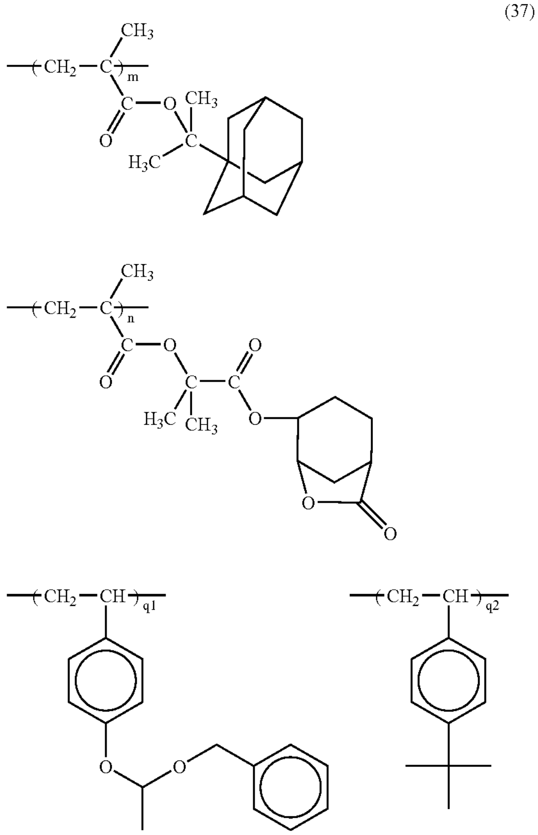
(38)
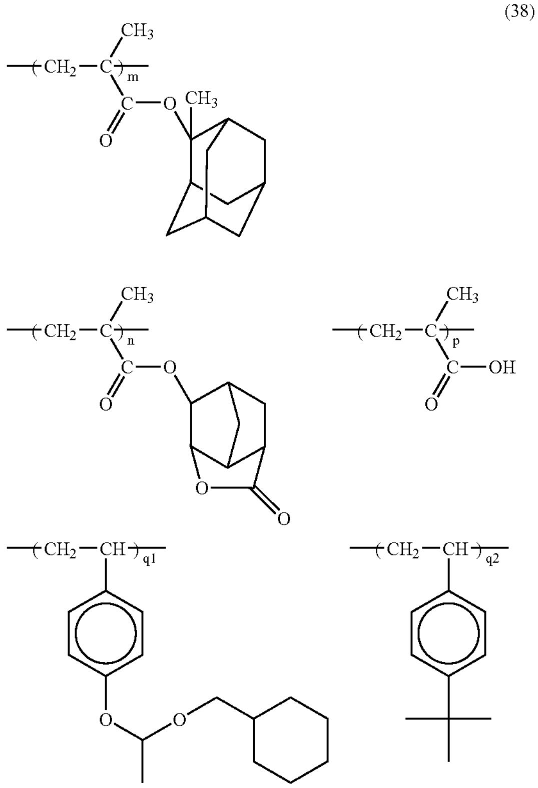
-continued
(39)
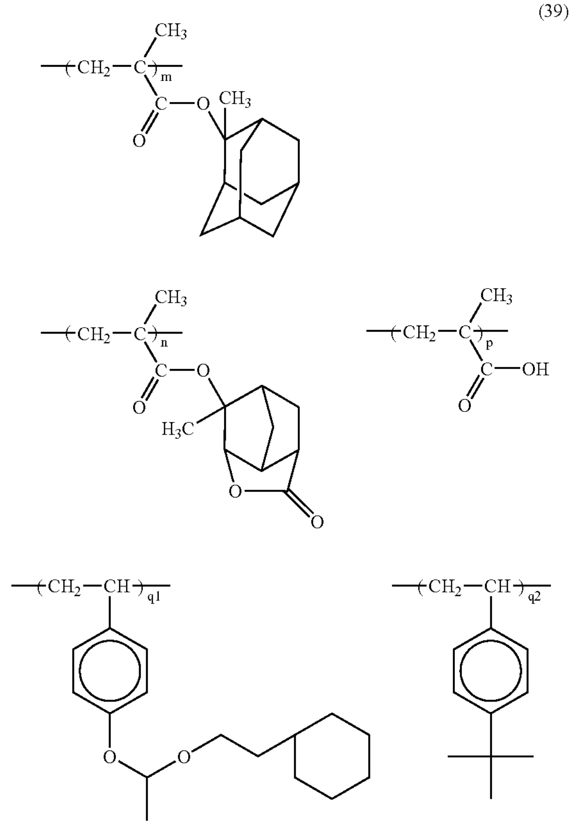
(40)
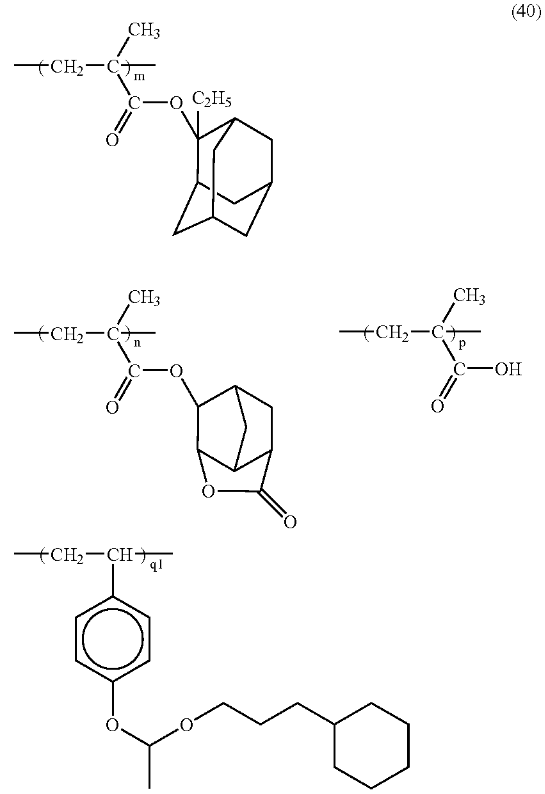

-continued
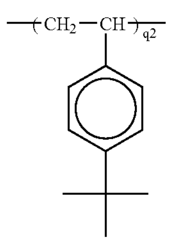
(41)
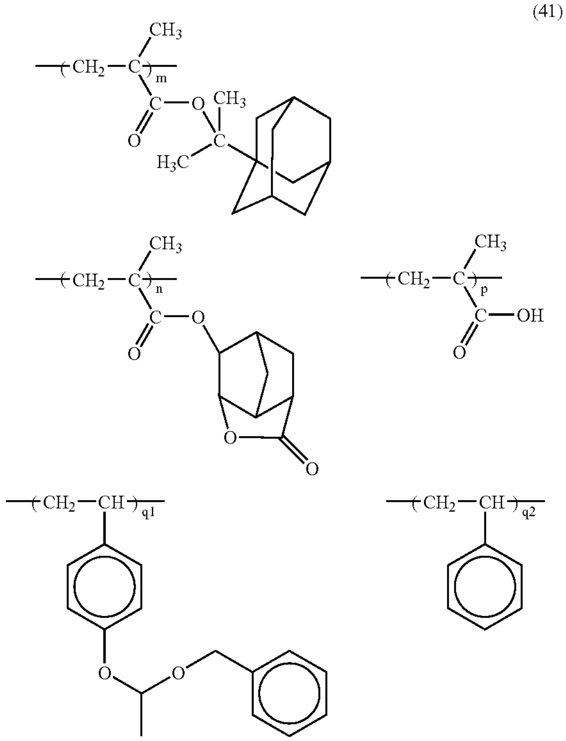
(42)
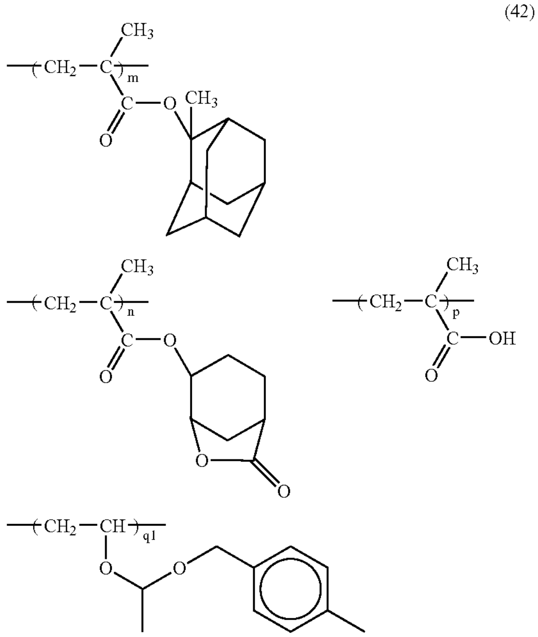
-continued
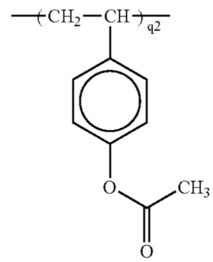
(43)
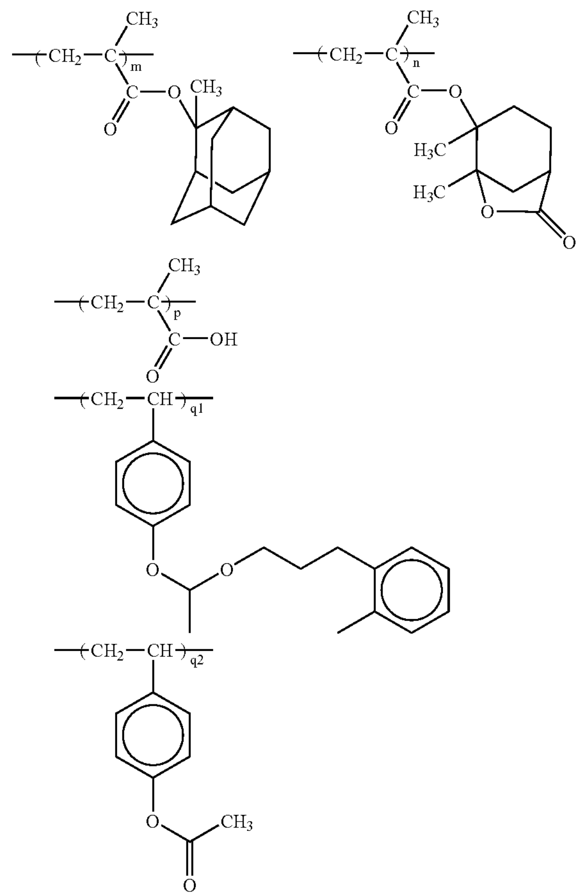
(44)
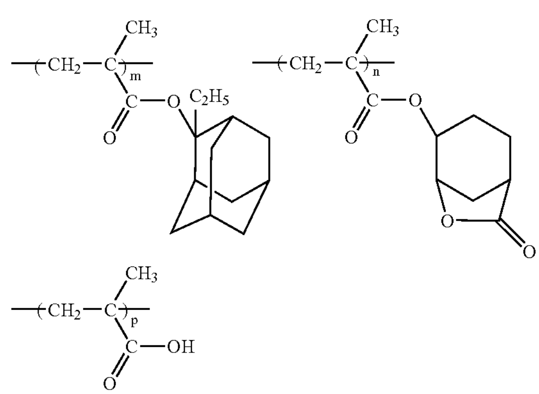

-continued
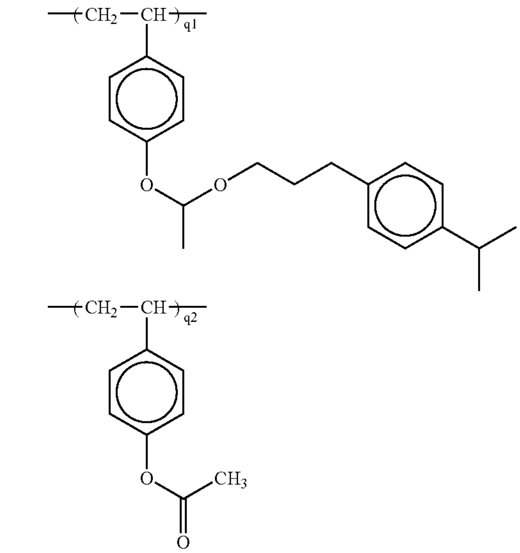
(45)
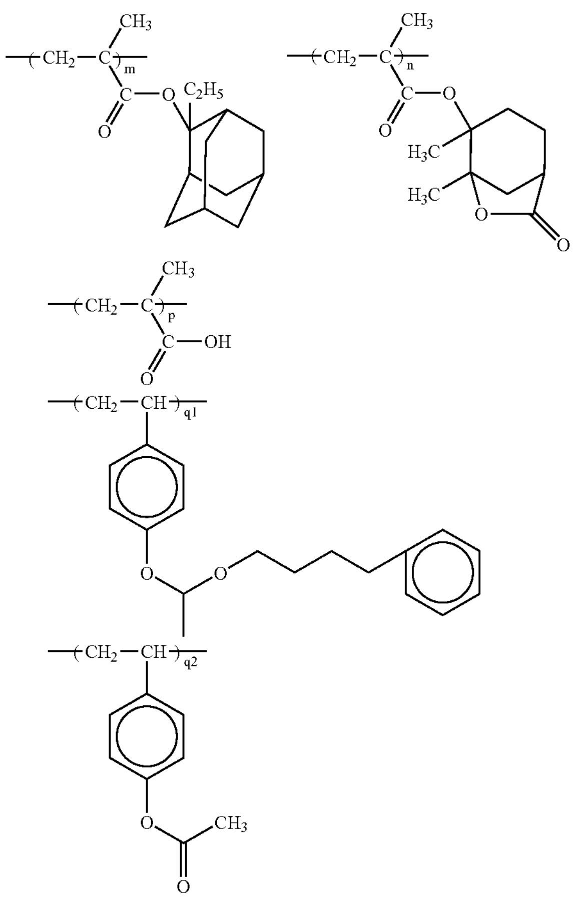
(46)
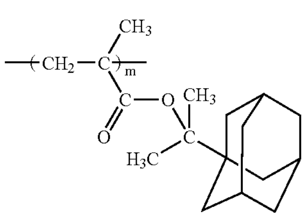
-continued
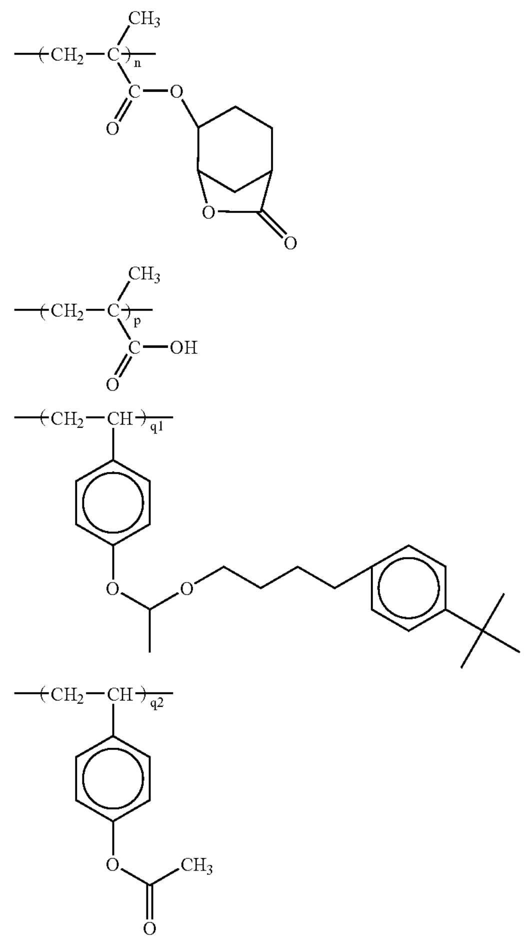
(47)
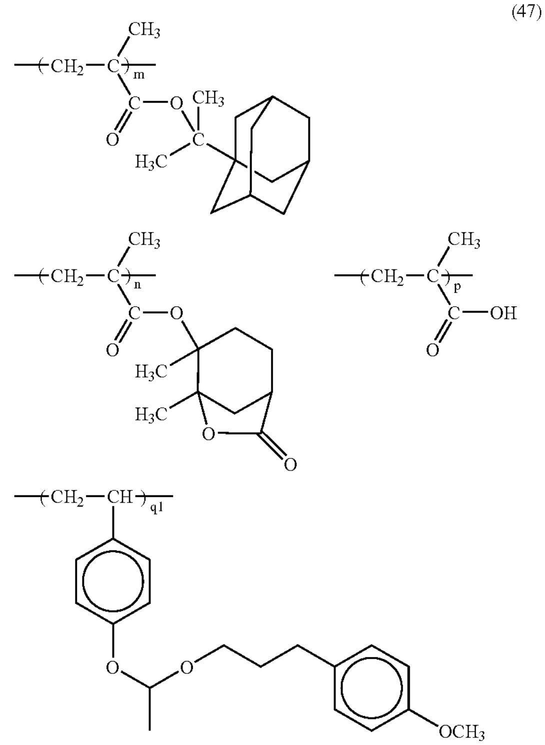

-continued
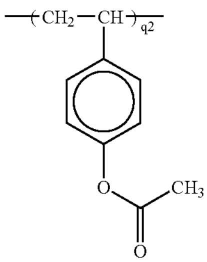
(48)
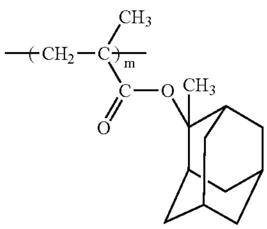
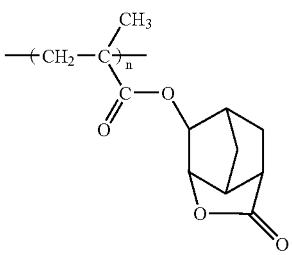
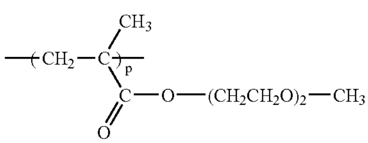
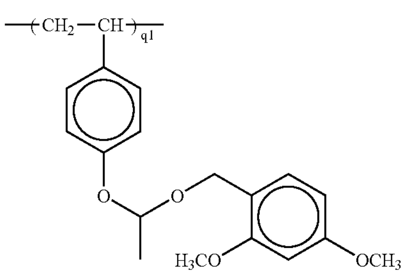
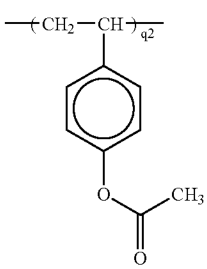
(49)
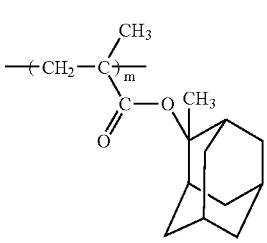
-continued
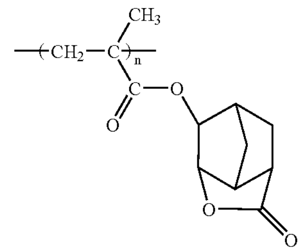
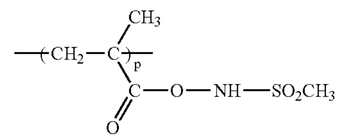
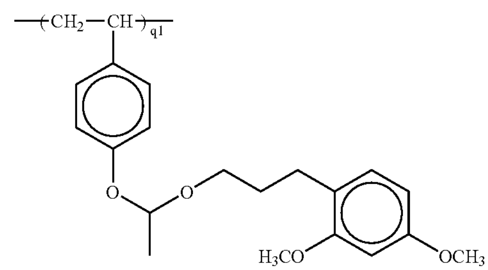
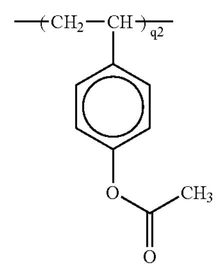
(50)
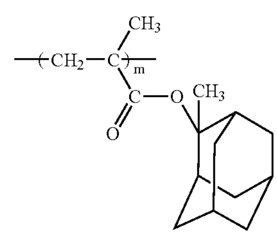
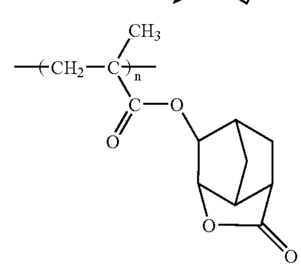
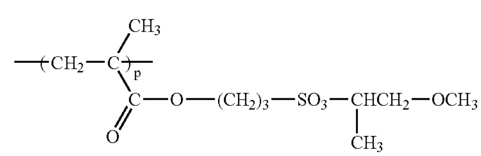

-continued
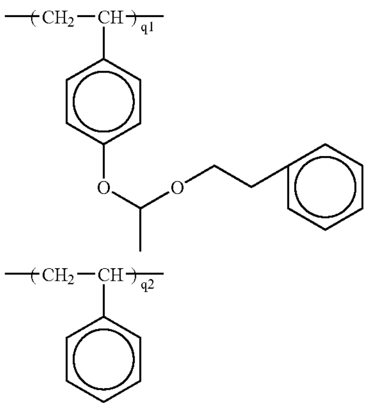
(51)
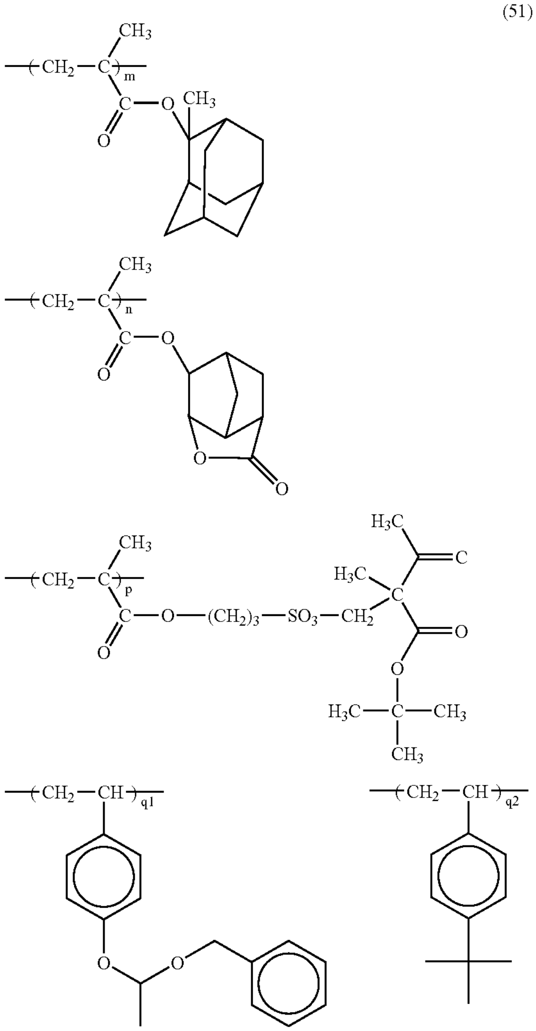
(52)
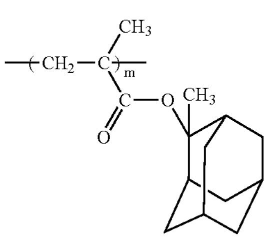
-continued
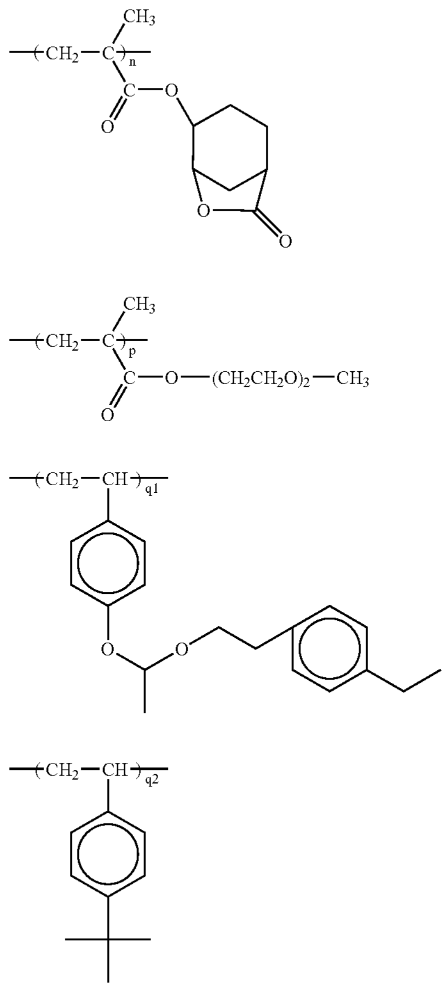
(53)
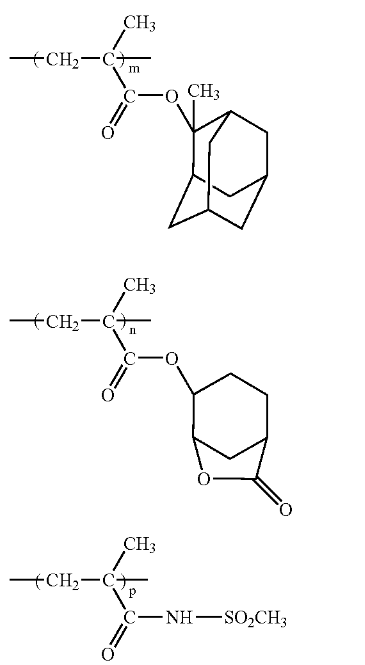

-continued
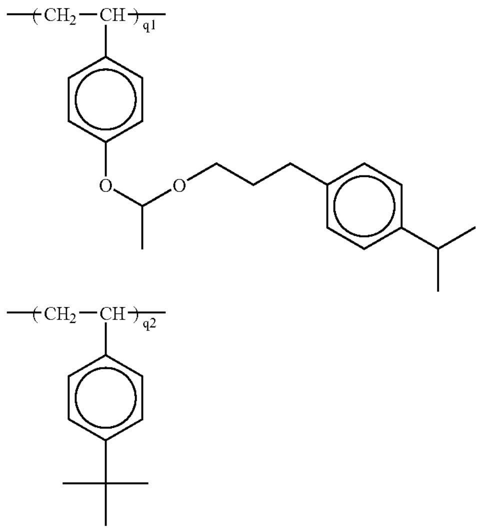
(54)
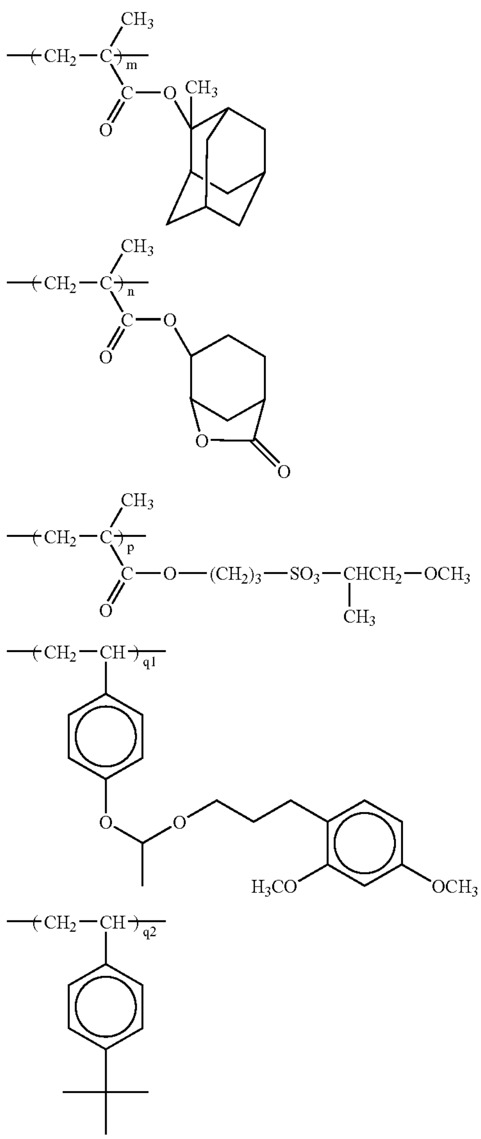
-continued
(55)
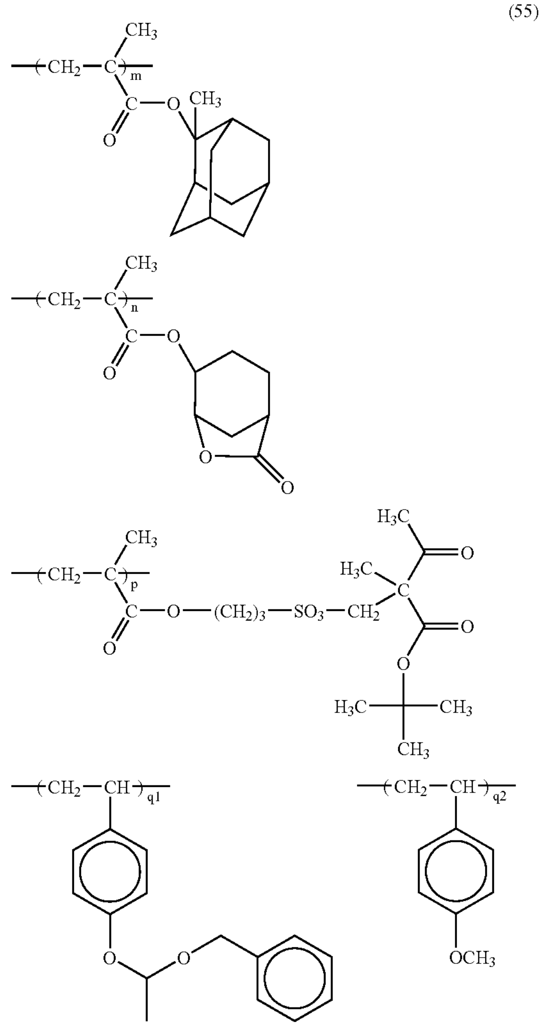
(56)
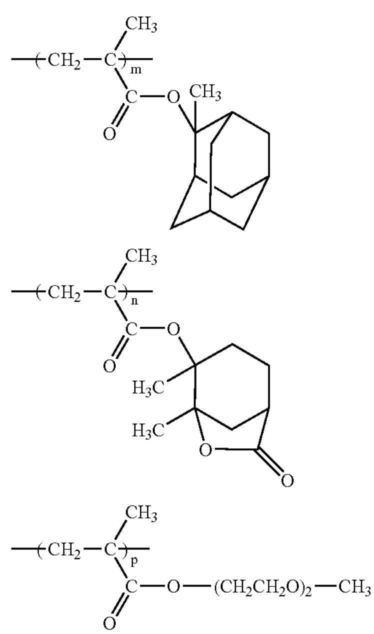

-continued
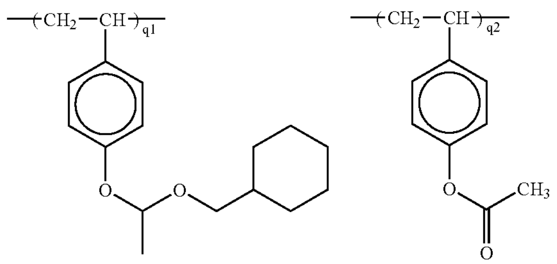
(57)
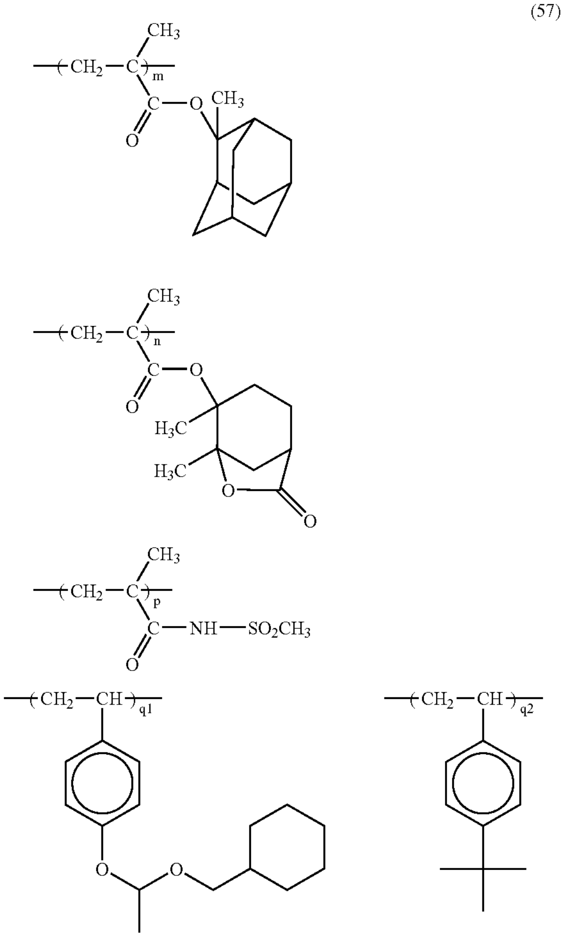
(58)
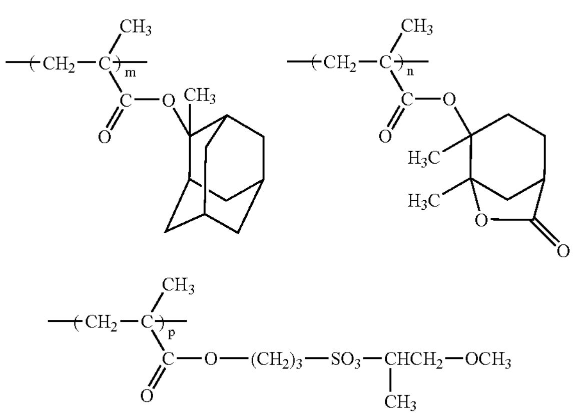
-continued
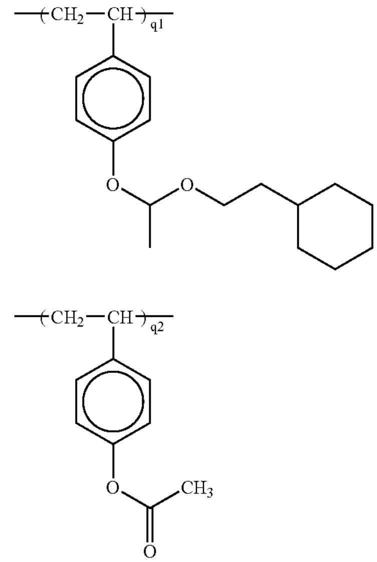
(59)
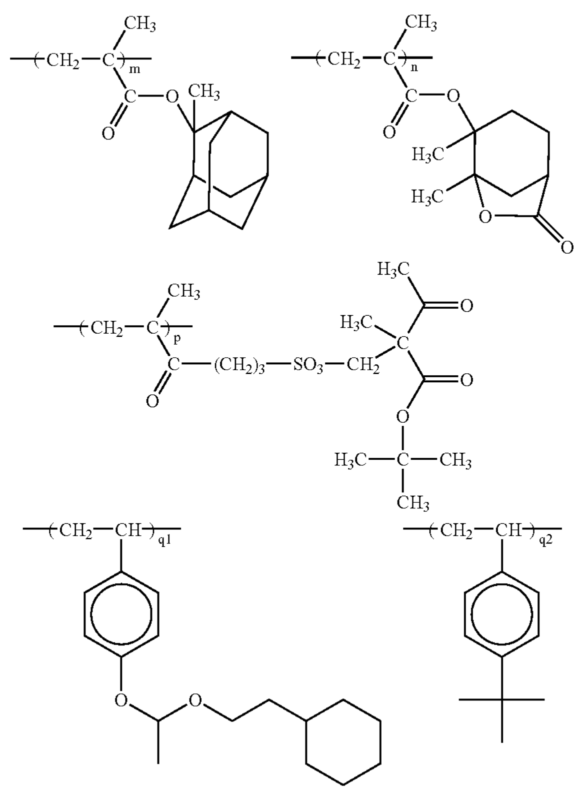
(60)
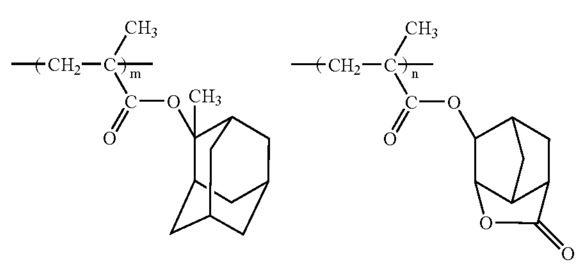

-continued
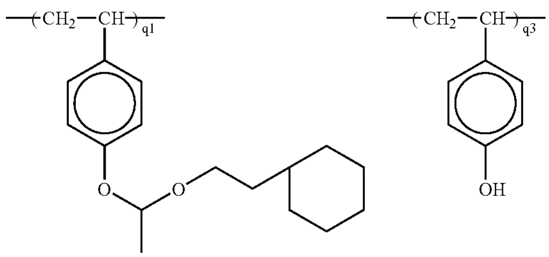
(61)
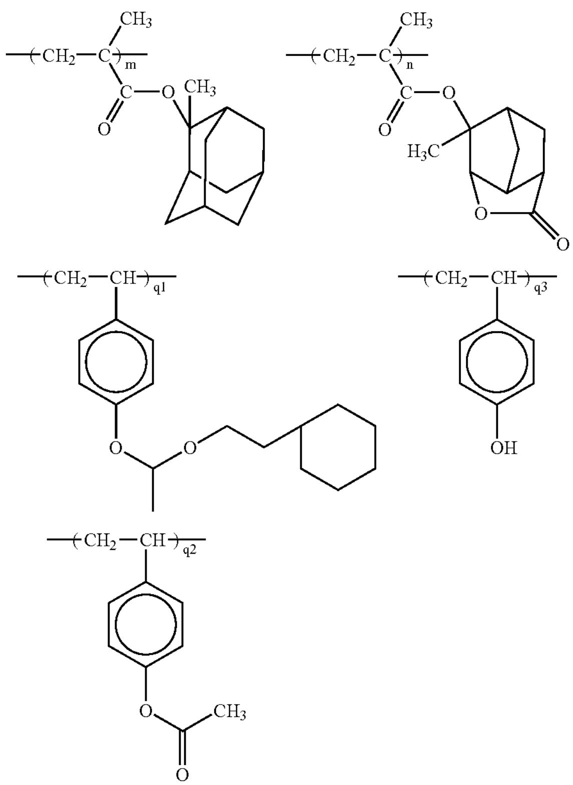
(62)
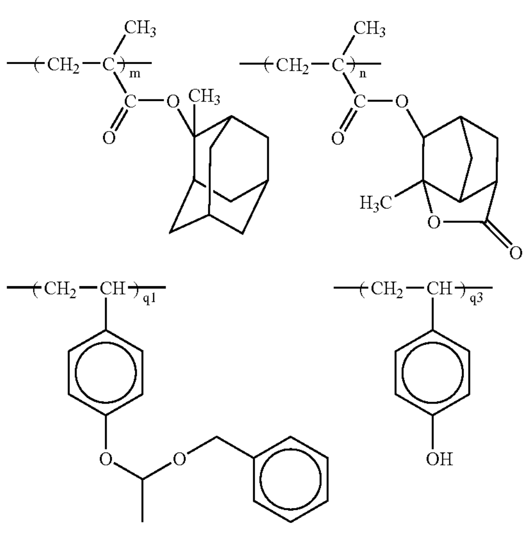
-continued
(63)
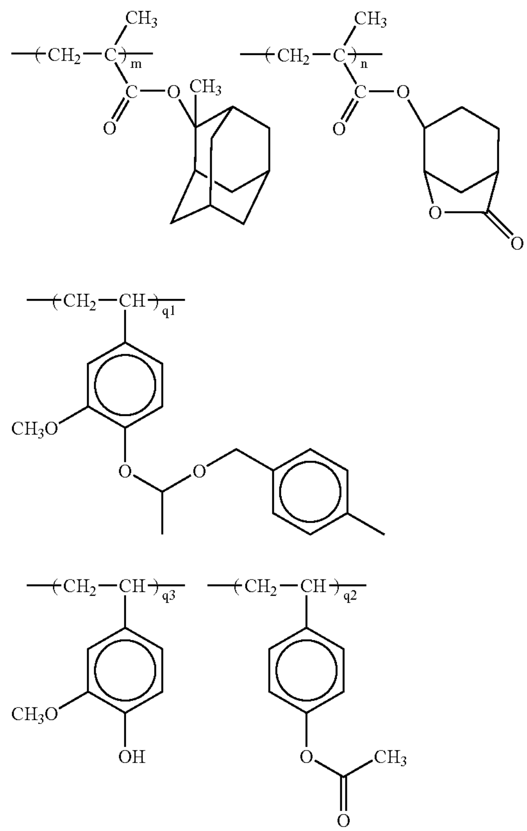
(64)
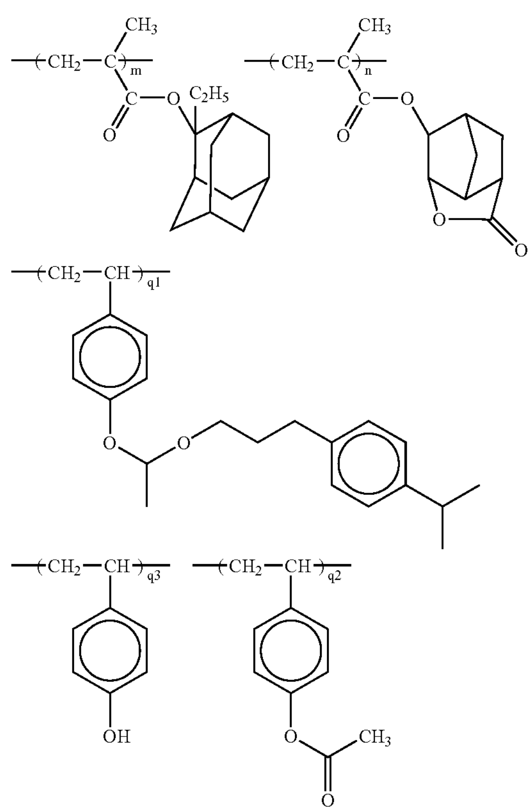

-continued
(65)
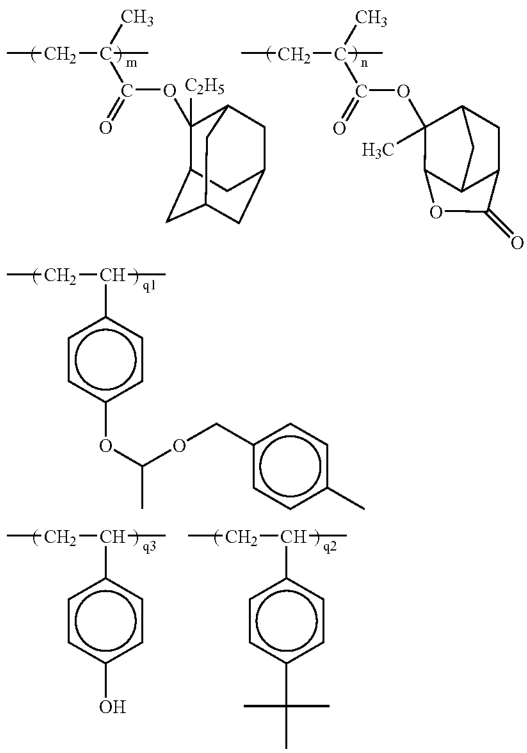
(66)
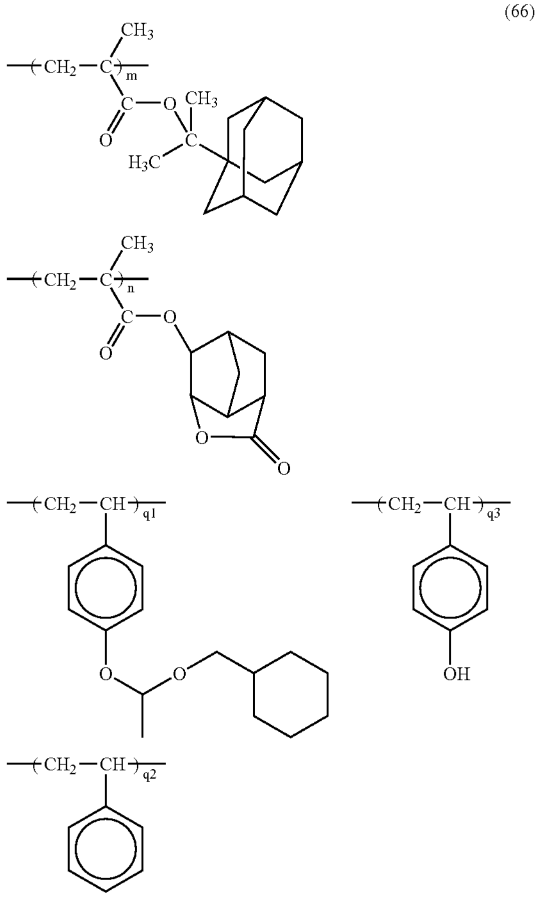
-continued
(67)
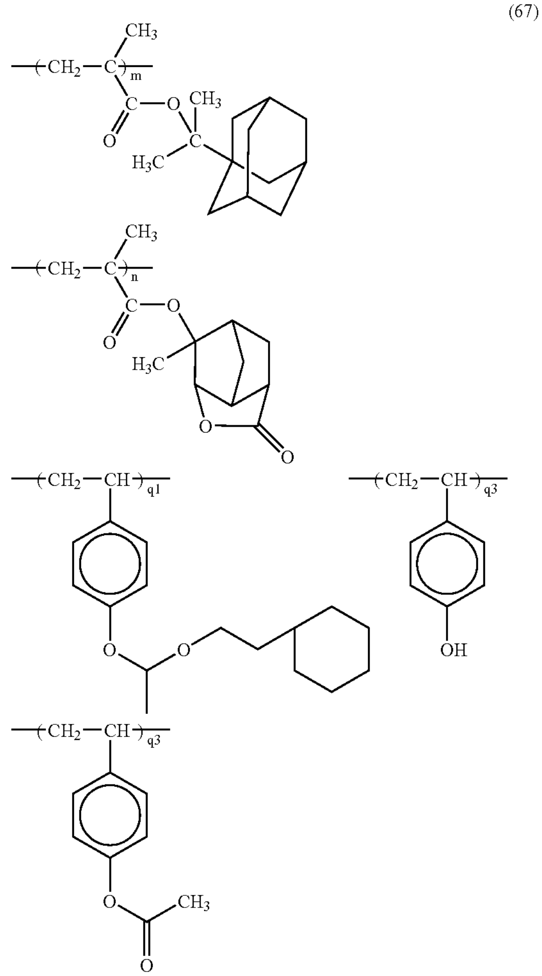
(68)
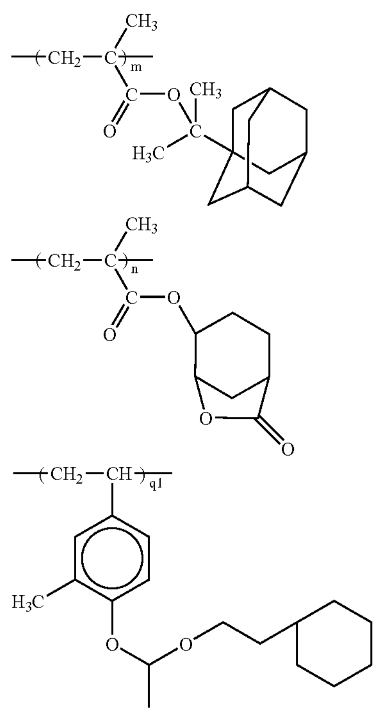

-continued
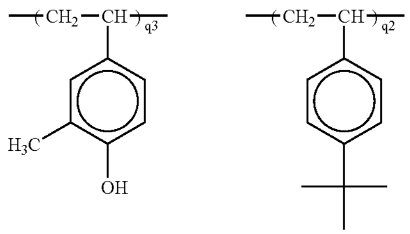
(69)
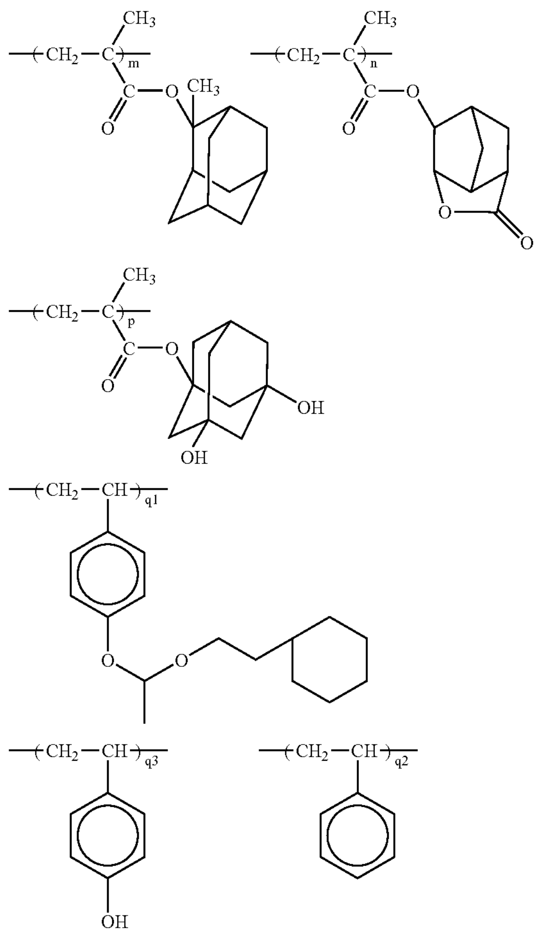
(70)
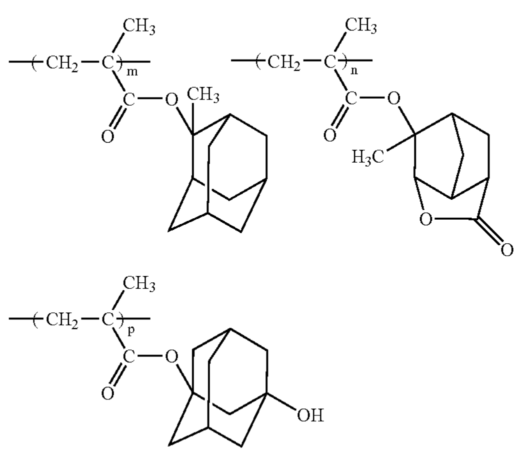
-continued
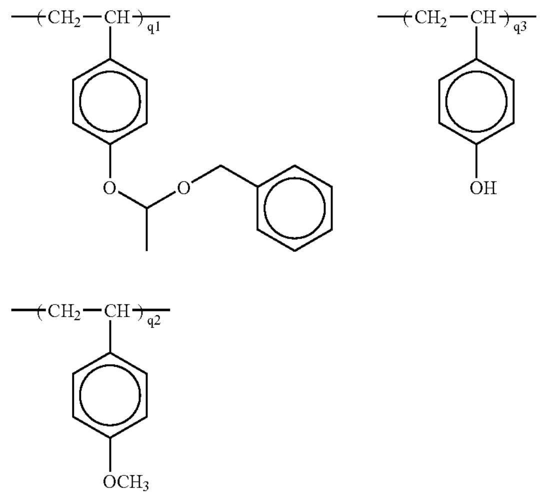
(71)
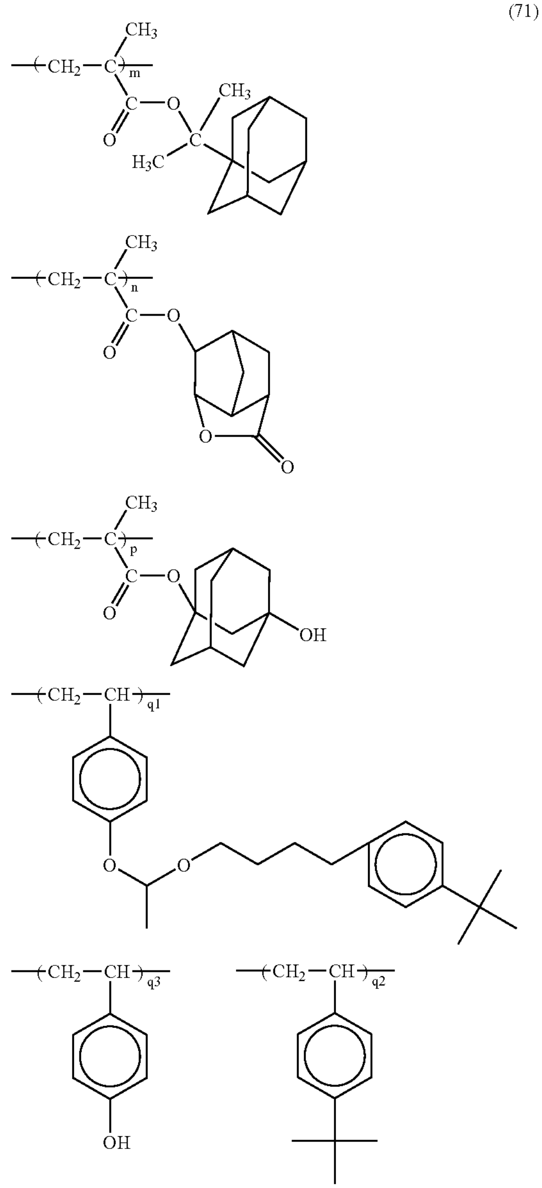

-continued (72)

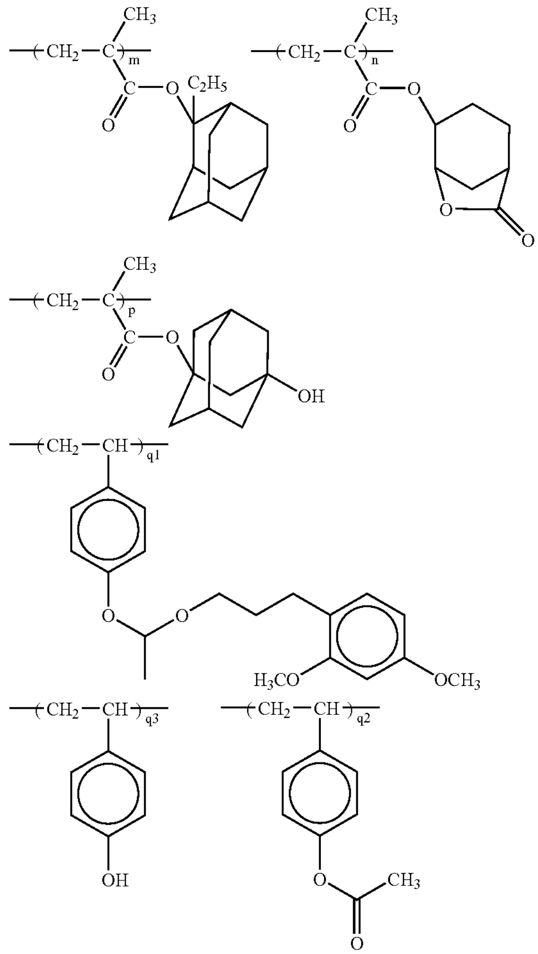

In the above formulae, m, n, p, q1, q2, q3, n1, n2 and n3 represent mole fractions of the repeating units corresponding thereto respectively. The mole fraction of the repeating unit containing any of the groups represented by formulae (I-1) to (i-4) is represented by n. When two or more of such repeating units are present in combination, the mole fractions thereof are represented by n1, n2 and so forth, respectively. On the other hand, the mole fraction of the repeating unit containing any of groups having an alicyclic hydrocarbon structure represented by any of formulae (pI) to (pVI) is represented by m. The mole fraction of the repeating unit represented by any of formulae (a) and (III-a) to (III-d) is represented by p. The mole fractions of the repeating units represented by formulae (IA), (IIA) and (IIIA) are represented by q1, q2 and q3, respectively.

In the case of containing the repeating units represented by formulae (III-a) to (III-d), m/n/p/q is (20–60)/(20–55)/(3–30)/(5–45). In the case of not containing the repeating units represented by formulae (III-a) to (III-d), on the other hand, m/n/q is (20–60)/(15–55)/(20–60). The resins as recited above may be block copolymers or random copolymers. They may be regular polymers or irregular polymers.

In the present resin composition, the suitable content of the resin of Component (B) is from 40 to 99.99% by weight, preferably from 50 to 99.97% by weight, based on total solids in the composition.

The acid-decomposable resins used in the invention can be synthesized by a usual method (e.g., a radical polymerization method). In a general synthesis method, for instance, monomer species are placed in a reaction vessel collectively or intermittently, dissolved and homogenized, if needed, in a solvent, e.g., an ether such as tetrahydrofuran, 1,4-dioxane or diisopropyl ether, a ketone such as methyl ethyl ketone or methyl isobutyl ketone, an ester solvent such as ethyl acetate, or a solvent capable of dissolving the present composition, such as propylene glycol monomethyl ether acetate, which is described hereinafter, and then the polymerization thereof is initiated by use of a commercially available radical initiator (e.g., azo initiator, peroxide) in an atmosphere of inert gas such as nitrogen or argon and, if needed, under heating. The additional initiator is added by the lump or in several portions, if required. At the conclusion of the reaction, the reaction mixture is poured into a solvent, and the intended polymer is recovered therefrom by a powder or solid recovery method. The concentration of the reaction solution is at least 20% by weight, preferably at least 30% by weight, particularly preferably at least 40% weight. The reaction temperature is from 10° C. to 150° C., preferably from 30° C. to 120° C., particularly preferably from 50° C. to 100° C.

<<(C) Basic Compounds>>

For reducing property changes with a lapse of time during a period from exposure to heating, it is preferable that the present resin composition further contain (C) a basic compound.

Examples of a structure suitable for such a basic compound include those represented by the following formulae (A) to (E).

(A)

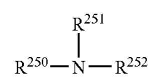

Herein, $R^{250}$, $R^{251}$ and $R^{252}$ each independently represents a hydrogen atom, a $C_1$–$C_{20}$ alkyl group, a $C_1$–$C_{20}$ aminoalkyl group, a $C_1$–$C_{20}$ hydroxyalkyl group, or a substituted or unsubstituted $C_6$–$C_{20}$ aryl group. Further, $R^{250}$ and $R^{251}$ may combine to form a ring.

Additionally, those alkyl chains each may contain an oxygen, sulfur or nitrogen atom.

(B)

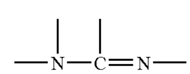

(C)

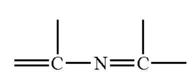

(D)

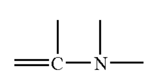

(E)

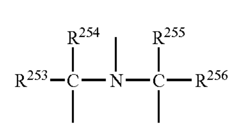

In the formula (E), $R^{253}$, $R^{254}$, $R^{255}$ and $R_{256}$ independently represent a $C_1$–$C_6$ alkyl group.

Examples of such compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a subsituted or unsubstituted piperazine a subsituted or unsubstituted aminomorpholine, and a substituted or unsubstituted aminoalkylmorpholine, mono-, di-and tri-alkylamines, a substituted or unsubstituted aniline, a substituted or unsubstituted piperidine, and mono- or di-ethanolamine. Examples of substituents suitable for the above-recited compounds include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Suitable examples of basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl) pyrrolidine, pyrazole, 3-amino-5-methylpyrazole, 5-amino-3-methyl-i-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazobicyclo[4.3.0]nona-5-ene, 1,8-diazabicyclo[5.4.0]-undeca-7-ene, 2,4,5-triphenylimidazole, tri(n-butyl)amine, tri (n-octyl)amine, N-phenyldiethanolamine, N-hydroxyethylpiperidine, 2,6-diisopropylaniline, and N-cyclohexyl-N'-morpholinoethylthiourea. However, these examples should not be construed as limiting the scope of the basic compounds usable in the invention.

Examples of compounds more suitable as the basic compound (C) include a substituted or unsubstituted guanidine, a substituted or unsubstituted aminopyrrolidine, a substituted or unsubstituted pyrazole, a subsituted or unsubstituted pyrazoline, a substituted or unsubstituted piperazine, a substituted or unsubstituted aminomorpholine, a substituted or unsubstituted aminoalkylmorpholine, a substituted or unsubstituted piperidine, and a compound having an imidazole structure, a diazabicyclo structure, an onium hydroxide structure, an onium carboxylate structure or an aniline structure.

Examples of the compound having an imidazole structure include imidazole, 2,4,5-triphenylimidazole and benzimidazole. Examples of the compound having a diazabicyclo structure include 1,4-diazabicyclo[2.2.2]octane, 1,5-diazabicyclo[4.3.0]nona-5-ene and 1,8-diazabicyclo[5.4.0]undeca-7-ene. Examples of the compound having an onium hydroxide structure include triarylsulfonium hydroxides (e.g., triphenylsulfonium hydroxide and tris(t-butylphenyl) sulfonium hydroxide), phenacylsulfonium hydroxides (e.g., phenacylthiophenium hydroxide), sulfonium hydroxides having 2-oxoalkyl groups (e.g., 2-oxopropylthiophenium hydroxide), and bis(t-butylphenyl)iodoniumhydroxide. The compound having an onium carboxylate structure is a compound whose anion part is a carboxylate instead of the hydroxide in the compound having an onium hydroxide structure as recited above. Examples of such a carboxylate include acetate, adamantane-i-carboxylate and perfluoroalkylcarboxylates. Examples of the compound having an aniline structure include 2,6-diisopropylaniline and N,N-dimethylaniline. Each of those compounds should not be construed as being limited to the examples recited above.

The basic compounds (C) as recited above are used alone or as a mixture of two or more thereof in a proportion of generally 0.001 to 10% by weight, preferably 0.01 to 5% by weight, based on solids content in the composition.

When the proportion is smaller than 0.001% by weight, the basic compound(s) added can produce no appreciable effect. When the proportion is greater than 10% by weight, on the other hand, there is a tendency to cause deterioration in sensitivity and developability of unexposed areas.

<<(D) Surfactant Containing at Least One Fluorine or Silicon Atom, or Both of at Least One Fluorine Atom and at Least One Silicon Atom>>

It is preferable that the present composition further contain a surfactant containing at least one fluorine atom or/and at least one silicon atom, namely any of a fluorine-containing surfactant, a silicon-containing surfactant and a surfactant containing both fluorine and silicon atoms, or a combination of at least two of these surfactants.

Incorporation of the surfactant (D) into the present composition enables the composition to form resist patterns having strong adhesion and reduced development defects while ensuring the composition both satisfactory sensitivity and high resolution at the time of using an exposure light source of 250 nm or shorter, especially 220 nm or shorter.

Examples of such a surfactant (D) include the surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, and U.S. Pat. Nos. 5,405,720, 5,360,692, 5,529,881, 5,296,330, 5,436,098, 5,576,143, 5,294,511 and 5,824,451. In addition, the following commercially available surfactants can be used as they are.

Examples of commercial surfactants usable herein include fluorine-containing surfactants and silicon-containing surfactants, such as Eftop EF301 and EF303 (produced by Shin-Akita Kasei K.K.), Florad FC430 and FC431 (produced by Sumitomo 3M, Inc.), Megafac F171, F173, F176, F189 and R08 (produced by Dainippon Ink & Chemicals, Inc.), Surflon S-382, SC101, SC102, SC103, SC104, SC105 and SC106 (produced by Asahi Glass Co., Ltd.), and Troysol S-366 (produced by Troy Chemical Industries, Inc.). In addition, organosiloxane polymer KP-341 (produced by Shin-Etsu Chemical Industry Co., Ltd.) can be used as a silicon-containing surfactant.

Those surfactants are used in a proportion of generally from 0.0001 to 2% by weight, preferably from 0.001 to 1% by weight, based on the total ingredients (excepting solvents) in the present composition.

<<(E) Organic Solvent>>

The present composition can be used in a state that it is dissolved in an appropriate solvent capable of dissolving the ingredients as mentioned above. Examples of a solvent usable herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethyl ether acetate, propylene glycol monomethyl ether, propylene glycol monomethyl ether acetate, toluene, ethyl acetate, butyl acetate, methyl lactate, ethyl lactate, methyl methoxypropionate, ethyl ethoxypropionate, methylpyruvate, ethyl pyruvate, propyl pyruvate, N,N-dimethylformamide, dimethyl sulfoxide, N-methylpyrrolidone, and tetrahydrofuran.

In the invention, those organic solvents may be used alone or as a mixture of two or more thereof. However, it is appropriate that the organic solvent used be a mixture of a solvent containing a hydroxyl group in its structure and a solvent containing no hydroxyl groups. By using such a mixed solvent, it becomes possible to retard development of particles during storage of the resist solution Examples of a hydroxyl group-containing solvent include ethylene glycol, ethylene glycol monomethyl ether, ethylene glycol monoethyl ether, propylene glycol, propylene glycol monomethyl ether, propylene glycol monoethyl ether, and ethyl lactate. Of these solvents, propylene glycol monomethyl ether and ethyl lactate are preferred in particular.

Examples of a hydroxyl group-free solvent include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Of these solvents, propylene glycol monomethyl ether acetate, ethyl ethoxypropionate, 2-heptanone, γ-butyrolactone, cyclohexanone and butyl acetate are preferred over the others. In particular, propylene glycol monomethyl ether acetate, ethyl ethoxypropionate and 2-heptanone are advantageous over the others.

The suitable mixing ratio (by weight) between the hydroxyl group-containing solvent and the hydroxyl group-free solvent is from 1/99 to 99/1, preferably from 10/90 to 90/10, far preferably from 20/80 to 60/40. The mixed solvent containing a hydroxyl group-free solvent in a proportion of at least 50% by weight is especially desirable from the view point of coating uniformity.

<<(F) Acid-Decomposable Dissolution-Inhibiting Compound>>

It is appropriate that the present positive photosensitive composition further contain (F) a compound having a molecular weight of not more than 3000 which is capable of decomposing by the action of acid to increase solubility in an alkali developing solution (referred as to "acid-decomposable dissolution-inhibiting compound (F)).

In order not to lower transparency at 220 nm or shorter in particular, acid-decomposable group-containing alicyclic or aliphatic compounds, such as cholic acid derivatives containing acid-decomposable groups as described in *Proceeding of SPIE,* 2724, 355 (1996), are suitable as acid-decomposable dissolution-inhibiting compounds (F). With respect to the acid-decomposable groups and alicyclic structures contained in those compounds, the same ones as recited in the description of the acid-decomposable resins can be recited as examples thereof.

The molecular weight of the acid-decomposable dissolution-inhibiting compound used in the invention is 3,000 or below, preferably from 300 to 3,000, far preferably from 500 to 2,500.

The proportion of acid-decomposable dissolution-inhibiting compound (F) added is from 3 to 50% by weight, preferably 5 to 40% by weight, based on the total solids content in the composition.

Examples of an acid-decomposable dissolution-inhibiting compound (F) are illustrated below, but compounds usable in the invention should not be construed as being limited to these examples.

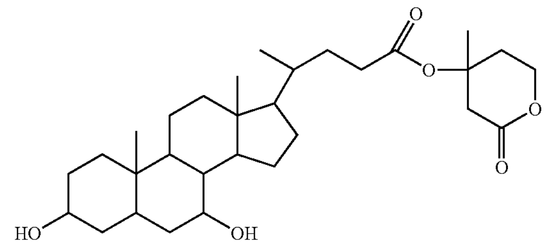

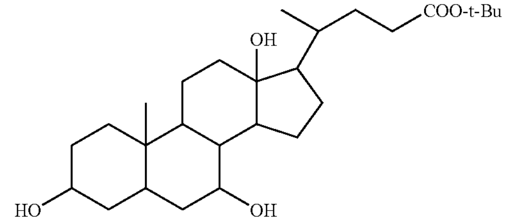

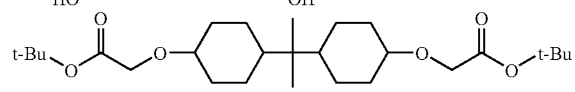

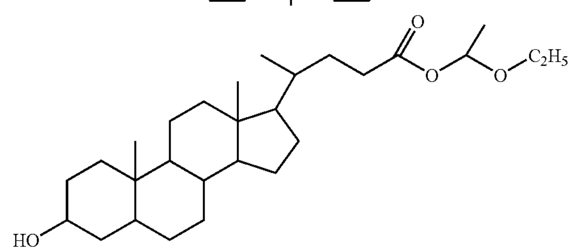

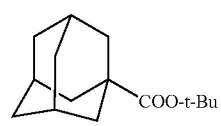

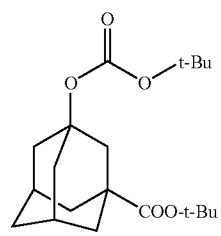

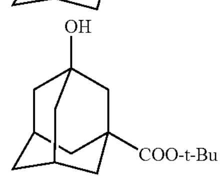

<<(G) Alkali-Soluble Resin>>

The present composition can further contain (G) a resin insoluble in water, soluble in alkali developers and free of acid-decomposable groups, and thereby the sensitivity can be increased.

In the invention, novolak resins having molecular weight of the order of 1,000 to 20,000 and poly(hydroxystyrene) derivatives having molecular weight of the order of 3,000 to 50,000 can be used as those resins. However, such resins show strong light absorption in the wavelength range of 250 nm or shorter. In using these resins, therefore, it is appropriate that they be subjected to partial hydrogenation or the proportion thereof be controlled to no higher than 30% by weight based on the total resins.

In addition, resins containing carboxyl groups as alkali-soluble groups can be used, too. It is preferable for the resins containing carboxyl groups to have mono-or polycyclic aliphatic hydrocarbon groups from the viewpoint of improving the dry etching resistance. Examples of such resins include a copolymer of (meth) acrylic acid and a methacrylic acid ester having an alicyclic hydrocarbon structure suffering no acidolysis and an alicyclic hydrocarbon (meth)acrylate resin having terminal carboxyl groups.

<<Other Additives>>

The present positive photosensitive composition can further contain dyes, plasticizers, surfactants other than Component (D) recited hereinbefore, photosensitizers, and compounds capable of promoting dissolution in developers, if needed.

The compounds usable as promoter of dissolution in developers in the invention are low molecular compounds having molecular weight of 1,000 or below and at least two per molecule of phenolic OH groups or at least one per molecule of carboxyl group. In the case of the compounds having carboxyl groups, alicyclic or aliphatic compounds are preferred for the same reason as mentioned above.

The suitable proportion of the dissolution-promoting compounds added is from 2 to 50% by weight, preferably from 5 to 30% weight, based on the resin (B) which can decompose by the action of acids and increase solubility in alkali developers. The addition of such compounds in a proportion greater than 50% by weight is undesirable because it exacerbates development residue and offers a new drawback of deforming patterns at the time of development.

Those phenolic compounds having molecular weight of 1,000 or below can be synthesized with ease by reference to the methods as described in JP-A-4-122938 and JP-A-2-28531, U.S. Pat. No. 4,916,210 and European Patent No. 219294.

Examples of carboxyl group-containing alicyclic or aliphatic compounds include carboxylic acid derivatives having steroid structures, such as cholic acid, deoxycholic acid and lithocholic acid, adamantancarboxylic acid derivatives, adamantandicarboxylic acid, cyclohexanecarboxylic acid and cyclohexanedicarboxylic acid, but compounds of such kinds should not to be construed as being limited to these examples.

In addition to the fluorine and/or silicon-containing surfactants as component (D), other surfactants also can be added, with examples including nonionic surfactants, such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl aryl ethers (e.g., polyoxyethylene octyl phenol ether, polyoxyethylene nonyl phenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylenesorbitan fatty acid esters (e.g., polyoxyethylenesorbitan monolaurate, polyoxyethylenesorbitan monopalmitate, polyoxyethylenesorbitan monostearate, polyoxyethylenesorbitan trioleate, polyoxyethylenesorbitan tristearate).

These surfactants maybe added alone, or as combinations of some among them.

<<Way of Using>>

The present positive photosensitive composition is prepared by dissolving the ingredients recited above in a proper organic solvent, preferably the mixed solvent as mentioned above, and coated on the desired substrate in the following manner.

More specifically, the solution of the positive photosensitive composition is coated on a substrate used for production of precision integrated-circuit elements (e.g., silicon/silicon dioxide coating) by means of an appropriate coating machine, such as a spinner or a coater.

The composition thus coated is exposed to light via the desired mask, baked, and then development-processed. In this manner, resist patterns of good quality can be obtained. Herein, the suitable exposure light is soft X-rays with wavelengths of 100 nm or shorter, preferably 50 nm or shorter, particularly preferably 20 nm or shorter. Specifically, EUV ray (13.5 nm) is most suitable.

In the development step, the following developers can be used. Examples of developers usable for the present positive photosensitive composition include aqueous alkaline solutions containing inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, and cyclic amines such as pyrrole and piperidine.

To the aqueous alkaline solutions, alcohol and surfactants may further be added in appropriate amounts.

EXAMPLES

The invention will now be illustrated in more detail by reference to the following examples, but these examples should not be construed as limiting the scope of the invention in any way.

For the conversion into acetal in a process of synthesizing the present resins, a method of using vinyl ether and an acetal exchange method using alcohol and alkyl vinyl ether are both applicable.

Synthesis Example I-1

Synthesis of Vinyl Ether

Ethyl vinyl ether was mixed into phenetyl alcohol, and thereto mercury acetate was added. This admixture was stirred for 12 hours at room temperature. Therefrom the reaction product was extracted with successive ethyl acetate and water, then washed with water, and further subjected to distillation under reduced pressure. Thus, the intended phenetyl vinyl ether (X-1) was obtained.

Synthesis Example I-2

Synthesis of Vinyl Ether

Ethyl vinyl ether was mixed into phenetyl alcohol, and further mixed with palladium-1,10-phenanthroline complex. This mixture was stirred for 20 hours at room temperature. Therefrom, the reaction product was extracted with successive ethyl acetate and water, then washed with water, and further subjected to distillation under reduced pressure. Thus, the intended phenetyl vinyl ether (X-1) was obtained.

Synthesis Example I-3

Synthesis of Vinyl Ether

To a THF solution of phenyl magnesium bromide or phenyllithium, 2-chloroethyl vinyl ether was added and heated under reflux for 16 hours. Therefrom, the reaction product was extracted with successive ethyl acetate and water, then washed with water, and further subjected to distillation under reduced pressure. Thus, the intended phenetyl vinyl ether (X-1) was obtained.

Synthesis Examples I-4 to I-8

Vinyl ethers X-2 to X-6 were each synthesized according to a method chosen appropriately from those adopted in Synthesis Examples I-1 to 1–3.

X-1

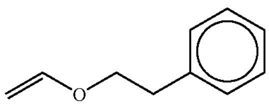

X-2

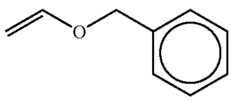

X-3

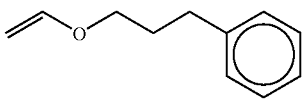

X-4

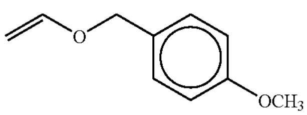

X-5

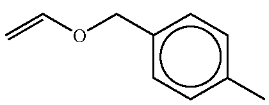

X-6

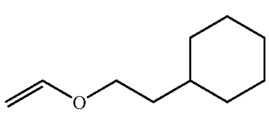

Synthesis Example II

Synthesis of Precursor (60') of Present Resin Example (60):

In 100 ml of butyl acetate were dissolved 9.4 g of 2-methyl-2-adamantyl methacrylate, 6.7 g of 5-exo-methacrylate of 6-endo-hydroxybicyclo[2.2.1]heptane-2-endo-carboxylic acid-Y-lactone and 6.5 g of p-acetoxystyrene. While stirring this solution at 80° C. in a stream of nitrogen, three 0.025 g portions of azobisisobutyronitrile were added thereto at intervals of 2.5 hours. Thereafter, the stirring was continued for additional 5 hours to effect polymerization reaction. The reaction solution was poured into 900 ml of hexane to precipitate a white resin. The resin obtained was dried, and then dissolved in 120 ml of methanol. This methanol solution was mixed with a solution containing 5.1 g (0.13 mole) of sodium hydroxide in 40 ml of water and heated under reflux for 3 hours, thereby effecting hydrolysis of the resin. Thereafter, the thus hydrolyzed solution was diluted with 150 ml of water, and then neutralized with hydrochloric acid to precipitate a white resin. This resin was filtered off, washed and then dried. The dried resin was dissolved into 150 ml of tetrahydrofuran, and dripped into 4L of ultrapure water with vigorous stirring to effect reprecipitation. This reprecipitation procedure was repeated three times. The thus reprecipitated was dried at 120° C. for 12 hours in a vacuum drier. Thus, the intended precursor (60') of Resin Example (60) was obtained. The weight average molecular weight Mw of the precursor (60') was found to be 11,000.

Synthesis Example III-1

In a flask, 10 g of the precursor (60') of the present Resin Example (60) as synthesized in Synthesis Example II was dissolved in 50 ml of propylene glycol monomethyl ether acetate (PGMEA), and distilled under reduced pressure to remove water therefrom as the PGMEA azeotrope.

After it was ascertained that the water content in the solution was reduced to a sufficient degree, 4.5 g of the vinyl ether X-6 obtained in Synthesis Example I-8 and 25 mg of p-toluenesulfonic acid were added to the dry solution, stirred for 1 hour at room temperature, and then admixed with triethylamine to conclude reaction.

The reaction solution was admixed with ethyl acetate, washed with water, and then subjected to distillation under reduced pressure to remove therefrom the ethyl acetate, the water and the PGMEA azeotrope. Thus, the present Resin Example (60) was obtained. The weight average molecular weight Mw of the resin thus obtained was found to be 12,000.

Synthesis Example III-2

In a flask, 10 g of the precursor (60') of the present Resin Example (60) as synthesized in Synthesis Example II was dissolved in 50 ml of propylene glycol monomethyl ether acetate (PGMEA), and distilled under reduced pressure to remove water therefrom as the PGMEA azeotrope.

After it was ascertained that the water content in the solution was reduced to a sufficient degree, 4.5 g of cyclohexylethyl alcohol, 4.1 g of t-butyl vinyl ether and 25 mg of p-toluenesulfonic acid were added to the dry solution, stirred for 1 hour at room temperature, and then admixed with triethylamine to conclude reaction.

The reaction solution was admixed with ethyl acetate, washed with water, and then subjected to distillation under reduced pressure to remove therefrom the ethyl acetate, the water and the PGMEA azeotrope. Thus, the present Resin Example (60) having the substituent groups according to the invention was obtained. The weight average molecular weight Mw of the resin obtained was found to be 12,000.

In manners similar to the above, the present resins as shown in Table 1 were synthesized respectively.

Synthesis Example (IV)

Synthesis of Acid Generator (I-1)

To a mixture of 16.4 g of $AgBF_4$ and 150 ml of acetonitrile, a solution containing 16.0 g of phenacyl bromide and 12.4 g of di-n-butylsulfide in 50 ml of acetonitrile was added dropwise over a period of 30 minutes. The resulting admixture was stirred for one night at room temperature, and then concentrated to yield a powder. The powder was washed with diisopropyl ether. Thus, 27 g of phenacyldi-n-butylsulfonium tetrafluoroborate was obtained.

The phenacyldi-n-butylsulfonium tetrafluoroborate in an amount of 10 g was dissolved in 200 ml of methanol, and thereto 10.1 g of potassium nonafluorobutanesulfonate was added and stirred for 1 hour at room temperature. The resulting reaction solution was admixed with 500 ml of chloroform, and washed with two 300 ml portions of distilled water. The organic layer obtained was concentrated to yield 9.8 g of Acid Generator (I-1).

The other acid generators were synthesized in a manner similar to the above, too.

<<Preparation and Evaluation of Radiation-Sensitive Compositions>>

Ratio between repeating units and molecular weight of each of resins used are set forth in Table 1.

TABLE 1

| Resin | Ratio between repeating units (by mole) | Mw |
|---|---|---|
| (1) | $m/n/q_1$ = 40/30/30 | 8,700 |
| (3) | $m/n/q_1$ = 43/21/36 | 9,600 |
| (8) | $m/n/q_1$ = 51/18/31 | 15,200 |
| (11) | $m/n/q_1$ = 48/40/12 | 10,700 |
| (14) | $m/n/q_1$ = 37/21/42 | 8,300 |
| (15) | $m/n/q_1$ = 46/35/19 | 14,500 |
| (20) | $m/n/p/q_1$ = 39/19/10/32 | 9,700 |
| (21) | $m/n/p/q_1$ = 41/22/17/30 | 17,900 |
| (22) | $m/n/p/q_1$ = 40/16/20/24 | 15,600 |
| (24) | $m/n/p/q_1$ = 32/20/15/33 | 11,300 |
| (31) | $m/n/q_1/q_2$ = 33/17/40/10 | 13,500 |
| (39) | $m/n/p/q_1/q_2$ = 35/23/5/30/7 | 8,900 |
| (41) | $m/n/p/q_1/q_2$ = 44/19/7/22/8 | 10,500 |
| (52) | $m/n/p/q_1/q_2$ = 35/23/12/25/5 | 13,400 |
| (60) | $m/n/q_1/q_3$ = 38/23/28/11 | 12,000 |
| (61) | $m/n/q_1/q_2/q_3$ = 36/20/21/15/8 | 13,800 |
| (62) | $m/n/q_1/q_3$ = 39/21/30/10 | 12,600 |
| (66) | $m/n/q_1/q_2/q_3$ = 33/22/23/13/9 | 19,000 |
| (67) | $m/n/q_1/q_2/q_3$ = 38/18/20/9/15 | 14,700 |
| (68) | $m/n/q_1/q_2/q_3$ = 31/32/16/14/7 | 16,400 |
| (69) | $m/n/p/q_1/q_2/q_3$ = 35/20/7/24/6/8 | 18,100 |

<Preparation of Resist>

Examples 1 to 21, and Comparative Examples 1 and 4

Solutions having a solids concentration of 72% by weight were prepared by dissolving combinations of ingredients set forth in Table 2, and they were each filtered through a 0.1 μm Teflon or polyethylene filter to prepare radiation-sensitive compositions. The compositions thus prepared were each evaluated by methods mentioned hereinafter. Results obtained are shown in Table 3.

TABLE 2

| Example | Resin (10 g) | Acid generator (g) | Basic compound (g) | Surfactant (0.03 g) | Solvent (weight ratio) |
|---|---|---|---|---|---|
| 1 | (1) | Z2 (0.3) | C-1 (0.02) | W-1 | A1 = 100 |
| 2 | (3) | Z5 (0.3) | C-3 (0.02) | W-4 | A2 = 100 |
| 3 | (8) | Z3 (0.3) | C-3 (0.02) | W-3 | A1/B1 = 60/40 |
| 4 | (11) | Z6 (0.3) | C-5 (0.02) | W-2 | A1/B1 = 80/20 |
| 5 | (14) | Z9 (0.3) | C-7 (0.01) | W-1 | A3/B2 = 80/20 |
| 6 | (15) | Z12 (0.3) | C-4 (0.01) | W-2 | A1/B1 = 90/10 |
| 7 | (20) | Z33 (0.3) | C-3 (0.02) | W-4 | A2/B1 = 80/20 |
| 8 | (21) | IV-1 (0.7) | C-2 (0.03) | W-4 | A4/B1 = 80/24 0 |
| 9 | (22) | IV-3 (0.4) | C-6 (0.01) | W-3 | A5/B2 = 90/10 |
| 10 | (24) | IV-10 (0.4) Z6 (0.1) | C-2 (0.03) | W-1 | A1 = 100 |
| 11 | (31) | IV-14 (0.4) Z5 (0.1) | C-1 (0.02) | W-3 | A1 = 100 |
| 12 | (39) | IV-18 (0.4) Z26 (0.1) | C-4 (0.01) | W-2 | A3/B1 = 90/10 |
| 13 | (41) | IV-22 (0.4) Z30 (0.1) | C-6 (0.01) | W-2 | A1/BP = 95/5 |
| 14 | (52) | IV-31 (0.4) Z33 (0.1) | C-1 (0.02) | W-1 | A2 = 100 |
| 15 | (60) | IV-6 (0.4) Z34 (0.1) | C-5 (0.02) | W-4 | A1/B1 = 70/30 |
| 16 | (61) | IV-72 (0.4) Z30 (0.1) | C-7 (0.01) | W-3 | A2/B1 = 90/10 |
| 17 | (62) | IV-7 (0.4) Z9 (0.1) | C-3 (0.02) | W-3 | A4/B1 = 90/l0 |
| 18 | (66) | IV-15 (0.4) Z3 (0.1) | C-2 (0.03) | W-2 | A1 = 100 |
| 19 | (67) | IV-16 (0.4) Z12 (0.1) | C-1 (0.02) | W-4 | A2 = 100 |
| 20 | (68) | IV-21 (0.4) Z14 (0.1) | C-6 (0.01) | W-2 | A1/B2 = 80/20 |
| 21 | (69) | IV-46 (0.4) Z26 (0.1) | C-2 (0.03) | W-1 | A1/B1 = 80/20 |
| **Comparative Example** | **Resin (10 g)** | **Acid generator (g)** | **Basic compound (g)** | **Surfactant (0.03 g)** | **Solvent (weight ratio)** |
| 1 | ESCAP −1 | Z2 (0.3) | C-1 (0.02) | W-1 | A1 = 100 |
| 2 | ESCAP −2 | Z5 (0.3) | C-3 (0.02) | W-3 | A1/B1 = 90/l0 |
| 3 | ESCAP −1 | Z13 (0.3) | C-2 (0.03) | W-4 | A2/B1 = 90/10 |
| 4 | ESCAP −2 | IV-3 (0.4) Z6 (0.1) | C-6 (0.01) | W-2 | A1 = 100 |

The abbreviations in Table 2 stand for the following compounds:

C-1: DBN; 1,5-Diazabicyclo[4.3.0]nona-5-ene

C-2: TPI; 2,4,5-Triphenylimidazole

C-3: TPSA; Triphenylsulfonium acetate

C-4: HEP; N-Hydroxyethylpiperidine

C-5: DIA; 2,6-Diisopropylaniline

C-6: DCMA; Dicyclohexylmethylamine

C-7: TPA; Tripentylamine

W-1: Megafac F176 (produced by Dainippon Ink & Chemicals, Inc.) (a surfactant containing fluorine atoms)

W-2: Megafac R08 (produced by Dainippon Ink & Chemicals, Inc.) (a surfactant containing fluorine and silicon atoms)

W-3: Organosiloxane polymer KP-341 (produced by Shin-Etsu Chemical Industry Co., Ltd.)

W-4: Troysol S-366 (produced by Troy Chemical Industries, Inc.)

The symbols for solvents mean the following ones. Additionally, when two kinds of solvents were used in combination, the ratio between them is expressed in weight in Table 2.

A1: Propylene glycol methyl ether acetate

A2: 2-Heptane

A3: Ethyl ethoxypropionate

A4: γ-Butyrolactone

A5: Cyclohexanone

B1: Propylene glycol methyl ether

B2: Ethyl lactate

The resins used in Comparative Examples are as follows:

ESCAP-1

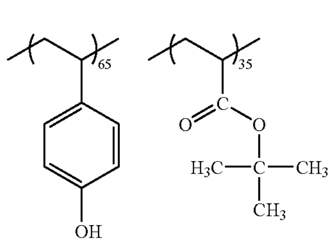

Mw = 13,000

ESCAP-2

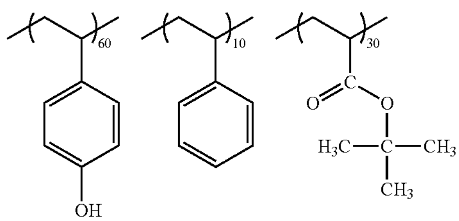

Mw = 10,000

<(1) Evaluations of Sensitivity, Limiting Resolution and Profile>

A uniform 600-angstrom coating of DUV42 for anti-reflection (produced by Brewer Science Inc.) was formed on a silicon wafer treated with hexamethyldisilazane by means of a spin coater, dried on a hot plate at 100° C. for 90 seconds, and further heated at 190° C. for 240 seconds.

On the thus treated silicon wafer, each of the RADIATION-SENSITIVE COMPOSITIONs was coated by means of a spin coater, and dried by heating at 120° C. for 90 seconds to form a 0.15 μm-thick resist film. Each of the thus formed resist films was exposed to an EUV ray (wavelength=13.5 nm, NA=0.1) via a reflective mask. Immediately after the exposure, the resist film was baked for 90 seconds on a 120° C. hot plate. The thus baked resist film was developed with a 2.38% aqueous solution of tetramethylammonium hydroxide at 23° C. for 60 seconds, rinsed with purified water for 30 seconds, and then dried to form line patterns.

The minimum exposure required for reproducing 70 nm 1/1 line-and-space patterns was defined as sensitivity, and the narrowest line width resolved with the minimum exposure was represented as limiting resolution.

Line profiles of 70 nm 1/1 line-and-space patterns were observed under a scanning electron microscope. When the line profiles had rectangular shapes, they were rated as excellent. When the line profiles had slightly tapered or flared shapes, they were rated as acceptable. And when the line profiles had utterly tapered or flared shapes, they were rated as unacceptable.

<(2) Evaluation of Line Edge Roughness (LER)>

Dimensions of 70 nm lines (line/space=1/1) (reading point: 30 points per line) at 50 different positions on the silicon wafer surface were measured with S-9200 made by Hitachi Ltd. And the dispersion in the values obtained by subtracting 70 nm from the measured values was determined, and therefrom 3σ (was calculated. The smaller the value thus calculated, the better the LER of the line patterns formed.

TABLE 3

| | Sensitivity ($mJ/cm^2$) | Limiting resolution (nm) | LER (nm) | Profile |
|---|---|---|---|---|
| Example | | | | |
| 1 | 21 | 60 | 4.1 | excellent |
| 2 | 17 | 65 | 4.0 | excellent |
| 3 | 18 | 60 | 4.0 | excellent |
| 4 | 24 | 62 | 4.7 | excellent |
| 5 | 19 | 60 | 4.3 | excellent |
| 6 | 20 | 60 | 5.0 | excellent |
| 7 | 23 | 64 | 5.1 | excellent |
| 8 | 25 | 62 | 4.9 | excellent |
| 9 | 14 | 58 | 3.5 | excellent |
| 10 | 12 | 57 | 3.8 | excellent |
| 11 | 10 | 60 | 3.3 | excellent |
| 12 | 17 | 55 | 3.4 | excellent |
| 13 | 11 | 60 | 3.3 | excellent |
| 14 | 20 | 5 | 3.1 | excellent |
| 15 | 18 | 60 | 3.5 | excellent |
| 16 | 15 | 58 | 3.7 | excellent |
| 17 | 12 | 58 | 3.8 | excellent |
| 18 | 16 | 55 | 4.0 | excellent |
| 19 | 13 | 60 | 3.5 | excellent |
| 20 | 16 | 58 | 3.3 | excellent |
| 21 | 18 | 57 | 3.7 | excellent |
| Comparative Example | | | | |
| 1 | 55 | 70 | 7.4 | unacceptable |
| 2 | 60 | 70 | 6.8 | unacceptable |
| 3 | 48 | 70 | 7.1 | unacceptable |
| 4 | 37 | 70 | 6.0 | acceptable |

As can be seen from the results shown above, all the compositions of Examples 1 to 21 had high sensitivity, and ensured high resolution and excellent LER characteristics in the resist patterns. In addition, these compositions proved to be satisfactory in terms of dry etching resistance. Moreover, the positive radiation-sensitive compositions of Examples 1 to 21 didn't cause the problem of forming toppled patterns. On the other hand, the positive radiation-sensitive compositions of Comparative Examples 1 to 4 caused reduction in resolution by toppling of patterns.

The present compositions sensitive to radiation, specifically to soft X-rays (e.g., EUV ray with a wavelength of 13.5 nm), have high sensitivity, high resolution and rectangular patterns and are excellent in LER and dry etching resistance characteristics.

What is claimed is:

1. A radiation-sensitive composition comprising:

(A) a compound capable of generating an acid upon irradiation with one of actinic rays and radiation, and (B) a resin containing a repeating unit having a group represented by at least any one of the following formulae (I-1) to (I-4) and a repeating unit having a group represented by the following formula (XA), which increases the solubility in an alkali developing solution by the action of an acid:

(I-1)

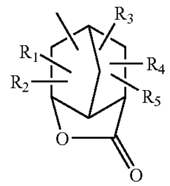

(I-2)

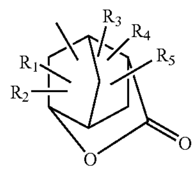

(I-3)

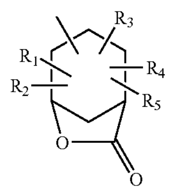

(I-4)

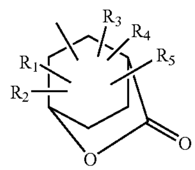

wherein $R_1$ to $R_5$ each independently represents a hydrogen atom, an unsubstituted or substituted alkyl group, an unsubstituted or substituted cycloalkyl group or an unsubstituted or substituted alkenyl group, two of $R_1$ to $R_5$ may be bonded each other to form a ring:

(XA)

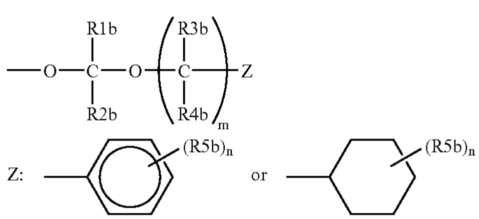

wherein $R_{1b}$ and $R_{2b}$, which may be the same or different, each represents a hydrogen atom or an alkyl group containing 1 to 4 carbon atoms, $R_{3b}$and $R_{4b}$, which may be the same or different, each represents a hydrogen atom, or an unsubstituted or substituted, straight-chain, branched or cyclic alkyl group, $R_{5b}$represents an unsubstituted or substituted, straight-chain, branched or cyclic alkyl group, an unsubstituted or substituted aryl group, or an unsubstituted or substituted aralkyl group, m represents an integer of 1 to 20, and n represents an integer of 0 to 5.

2. The composition according to claim 1, wherein the resin (B) further contains a repeating unit having an alkali-soluble group protected by at least one group which are selected from the alicyclic hydrocarbon structure-containing group represented by the following formulae (pI) to (pVI):

(pI)

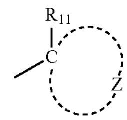

(pII)

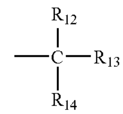

(pIII)

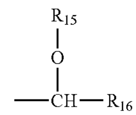

(pIV)

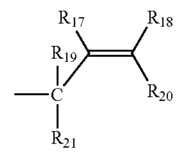

(pV)

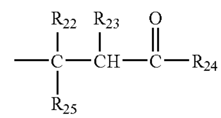

(pVI)

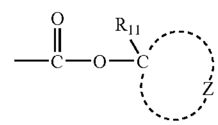

wherein $R_{11}$ represents a methyl group, an ethyl group, an n-propyl group, an isopropyl group, an n-butyl group, an isobutyl group or a sec-butyl group, Z represents an atom group forming an alicyclic hydrocarbon group together with the carbon atom, $R_{12}$ to $R_{16}$ independently represents a straight-chain or branched alkyl group containing 1 to 4 carbon atoms, or an alicyclic hydrocarbon group, provided that at least one of $R_{12}$ to $R_{14}$ or either $R_{15}$ or $R_{16}$ represents an alicyclic hydrocarbon group, $R_{17}$ to $R_{21}$ each independently represents a hydrogen atom, a straight-chain or branched alkyl group containing 1 to 4 carbon atoms, or an alicyclic hydrocarbon group, provided that at least one of $R_{17}$ to $R_{21}$ represents an alicyclic hydrocarbon group and either $R_{19}$ or $R_{21}$ represents a straight-chain or branched alkyl group containing 1 to 4 carbon atoms or an alicyclic hydrocarbon group, $R_{22}$ to $R_{25}$ each independently represents a straight-chain or branched alkyl group containing 1 to 4 carbon atoms, or an alicyclic hydrocarbon group, provided that at least one of $R_{22}$ to $R_{25}$ represents an alicyclic hydrocarbon group.

3. The composition according to claim 1, wherein the resin (B) further contains a repeating unit having an alkali-soluble group protected by an alicyclic hydrocarbon structure-containing group represented by the following formula (II):

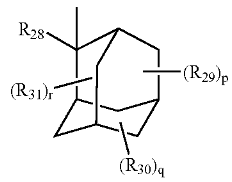

(II)

wherein $R_{28}$ represents an unsubstituted or substituted alkyl group, $R_{29}$ to $R_{31}$, which may be the same or different, each represents a hydroxyl group, a halogen atom, a carboxyl group, or an unsubstituted or substituted alkyl, an unsubstituted or substituted cycloalkyl group, an unsubstituted or substituted alkenyl group, an unsubstituted or substituted alkoxy group, an unsubstituted or substituted alkoxycarbonyl group or an unsubstituted or substituted acyl group, p, q and r independently represent an integer of 0 to 3.

4. The composition according to claim 1, wherein the resin (B) further contains a repeating unit represented by the following formula (a):

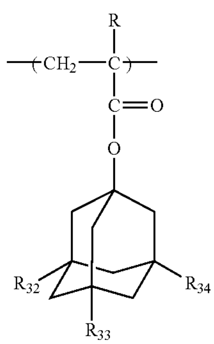

(a)

wherein R represents a hydrogen atom, a halogen atom, or a substituted or unsubstituted, straight-chain or branched alkyl group containing 1 to 4 carbon atoms, $R_{32}$ to $R_{34}$, which may be the same or different, each independently represents a hydrogen atom or a hydroxyl group, provided that at least one of $R_{32}$ to $R_{34}$ is a hydroxyl group.

5. The composition according to claim 1, wherein the repeating unit having a group represented by formula (XA) include repeating units of formulae (IA), (IIA) and (IIIA):

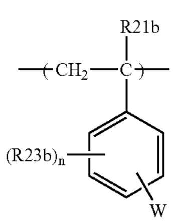

(IA)

-continued

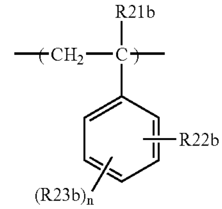

(IIA)

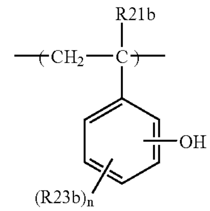

(IIIA)

wherein R21 b represents a hydrogen atom or a methyl group, R22b represents a group incapable of decomposing under the action of an acid, R23b represents a hydrogen atom, a halogen atom, an alkyl group, an aryl group, an alkoxy group, an acyl group or an acyloxy group, n is an integer of 1 to 3, and W is a group represented by formula (XA).

6. The composition according to claim 1, wherein the compound (A) is a compound represented by the following formula (IV):

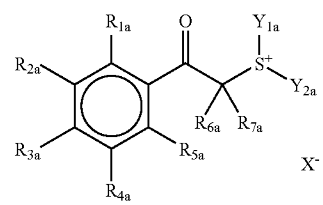

(IV)

wherein $R_{1a}$ to $R_{5a}$, which may be the same or different, each independently represents a hydrogen atom, a nitro group, a halogen atom, or an unsubstituted or substituted alkyl group, an unsubstituted or substituted alkoxy group, an unsubstituted or substituted alkyloxycarbonyl group, an unsubstituted or substituted aryl group or an unsubstituted or substituted acylamino group, two of $R_{1a}$ to $R_{5a}$ may be bonded to each other to form a ring structure, $R_{1a}$ and $R_{7a}$, which may be the same or different, each represents a hydrogen atom, a cyano group, or an unsubstituted or substituted alkyl or an unsubstituted or substituted aryl group, $Y_{6a}$ and $Y_{2a}$, which may be the same or different, each represents an alkyl group which may contain a substituent, an ether linkage or a sulfide linkage, or an unsubstituted or substituted alkenyl group, provided that, when both $Y_{1a}$ and $Y_{2a}$are alkyl groups, at least either $Y_{1a}$ or $Y_{2a}$ is an alkyl group containing a hydroxyl group, an ether linkage or a sulfide linkage or both $Y_{1a}$ and $Y_{2a}$ are alkyl groups which each contains at least 2 carbon atoms, wherein at least one of $R_{1a}$ to $R_{5a}$ combines with at least either $Y_{1a}$ or $Y_{2a}$ to form a ring, at least one of $R_{1a}$ to $R_{5a}$ combines with at least either $R_{6a}$ or $R_{7a}$ to form a ring, $R_{1a}$ to $R_{7a}$, $Y_{1a}$ or $Y_{2a}$ is bonded at any one position through a linking group, so that the component (A) may have 2 or more of the structures of formula (IV), $X^-$ represents a non-nucleophilic anion.

7. The composition according to claim 1, which further comprises (C) a basic compound and (D) a fluorine-containing surfactant, a silicon-containing surfactant or a mixture thereof.

8. The composition according to claim 7, wherein the basic compound includes at least one compound having a structure selected from the group consisting of an imidazole structure, adiazabicyclo structure, an onium hydroxide structure, an onium carboxylate structure, a trialkylamine structure and an aniline structure.

9. The composition according to claim 1, which further comprises (F) a compound having a molecular weight of not more than 3000 which is capable of decomposing by the action of acid to increase solubility in an alkali developing solution.

10. The composition according to claim 1, which is used for exposure to soft X-rays with wavelengths of 50 nm or shorter.

11. The composition according to claim 1, which is used for exposure to EUV-ray with wavelength of 13.5 nm.

* * * * *